(12) United States Patent
Przybylski et al.

(10) Patent No.: US 11,888,676 B2
(45) Date of Patent: *Jan. 30, 2024

(54) BUILDING MANAGEMENT SYSTEM WITH CONTROL FRAMEWORK

(71) Applicant: Johnson Controls Tyco IP Holdings LLP, Milwaukee, WI (US)

(72) Inventors: Andrew J. Przybylski, Franksville, WI (US); John H. Burroughs, Wauwatosa, WI (US); Michael J. Wenzel, Oak Creek, WI (US)

(73) Assignee: Johnson Controls Tyco IP Holdings LLP, Milwaukee, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/689,569

(22) Filed: Mar. 8, 2022

(65) Prior Publication Data
US 2022/0191084 A1 Jun. 16, 2022

Related U.S. Application Data

(63) Continuation of application No. 17/013,194, filed on Sep. 4, 2020, now Pat. No. 11,283,669.

(51) Int. Cl.
*G06F 30/18* (2020.01)
*H04L 41/00* (2022.01)
(Continued)

(52) U.S. Cl.
CPC ............ *H04L 41/00* (2013.01); *G06F 30/18* (2020.01); *G16Y 10/80* (2020.01); *G16Y 20/10* (2020.01);
(Continued)

(58) Field of Classification Search
CPC ........ G16Y 10/80; G16Y 20/20; G16Y 20/30; G16Y 40/35; Y02B 30/00; G06Q 50/06; G06F 30/18
See application file for complete search history.

(56) References Cited

U.S. PATENT DOCUMENTS 7,996,204 B2 * 8/2011 Oslake ................ G06F 11/3447
703/22
9,235,657 B1 1/2016 Wenzel et al.
(Continued)

OTHER PUBLICATIONS

J. Ma, S. J. Qin and T. Salsbury, "Model predictive control of building energy systems with balanced model reduction," 2012 American Control Conference (ACC), Montreal, QC, Canada, 2012, pp. 3681-3686, doi: 10.1109/ACC.2012.6315516. (Year: 2012).*

*Primary Examiner* — Jason D Recek
(74) *Attorney, Agent, or Firm* — Foley & Lardner LLP

(57) ABSTRACT

Systems and methods for automatically commissioning and operating a heating, ventilation, or air conditioning (HVAC) system for a building site are provided. An exemplary method includes constructing a model using physical equipment of the HVAC system and relationships between the physical equipment. The model indicates connections between the physical equipment and one or more resources produced or consumed by the physical equipment. The method includes generating a mapping between points of the physical equipment at the building site and corresponding variables of the model, using the model to generate values of one or more control variables of the model, and operating the physical equipment by providing the values of the control variables to corresponding points of the physical equipment based on the mapping.

13 Claims, 25 Drawing Sheets

(51) Int. Cl.
  *G16Y 40/35* (2020.01)
  *G16Y 10/80* (2020.01)
  *G16Y 20/30* (2020.01)
  *G16Y 20/10* (2020.01)
  *G06Q 50/06* (2012.01)

(52) U.S. Cl.
  CPC .............. *G16Y 20/30* (2020.01); *G16Y 40/35* (2020.01); *G05B 2219/2614* (2013.01); *G06Q 50/06* (2013.01); *Y02B 30/00* (2013.01)

(56) References Cited

U.S. PATENT DOCUMENTS

| | | | |
|---|---|---|---|
| 10,088,814 B2 | 10/2018 | Wenzel et al. | |
| 10,684,598 B1 | 6/2020 | Alanqar et al. | |
| 2013/0169681 A1* | 7/2013 | Rasane | G06T 19/003 345/633 |
| 2017/0242413 A1 | 8/2017 | Piaskowski et al. | |
| 2017/0284691 A1* | 10/2017 | Sinha | F24F 11/77 |
| 2017/0308045 A1 | 10/2017 | Dibowski et al. | |
| 2018/0077244 A1 | 3/2018 | Thakkar | |
| 2018/0197253 A1 | 7/2018 | Elbsat et al. | |
| 2018/0202675 A1 | 7/2018 | Park et al. | |
| 2018/0285800 A1 | 10/2018 | Wenzel et al. | |
| 2018/0299159 A1 | 10/2018 | Ajax et al. | |
| 2019/0025774 A1 | 1/2019 | Wenzel et al. | |
| 2019/0257544 A1 | 8/2019 | Alanqar et al. | |
| 2019/0316802 A1 | 10/2019 | Alanqar et al. | |
| 2019/0339661 A1 | 11/2019 | Pancholi et al. | |
| 2019/0370208 A1 | 12/2019 | Cayemberg et al. | |
| 2019/0379555 A1* | 12/2019 | Smith | H04L 41/22 |
| 2020/0026249 A1 | 1/2020 | Przybylski et al. | |
| 2020/0042918 A1 | 2/2020 | Wenzel et al. | |
| 2020/0218991 A1 | 7/2020 | Alanqar et al. | |
| 2020/0387041 A1* | 12/2020 | Shrivastava | G02F 1/161 |
| 2021/0018205 A1 | 1/2021 | Ellis et al. | |
| 2021/0025608 A1 | 1/2021 | Salsbury et al. | |
| 2022/0066434 A1* | 3/2022 | Harvey | H04W 84/00 |

* cited by examiner

```
:00000000-0000-0000-0000-000000000001 jc:contains    :00000000-0000-0000-0000-000000000002;
                                      jc:hasPoint    :11111111-0000-0000-0000-000000000101,
                                                     :11111111-0000-0000-0000-000000000102;
                                             1070
                                      a vrf:Zone_Group;
                                      rdfs:label "Zone_Group_1".
:00000000-0000-0000-0000-000000000002 jc:spaceIsFedBy :00000000-0000-0000-0000-000000000003;
                                      a jc:space;
                                      rdfs:label "Main Area".
:00000000-0000-0000-0000-000000000003 jc:equipmentIsFedBy :00000000-0000-0000-0000-000000000004;
                                      jc:feedsSpace  :00000000-0000-0000-0000-000000000002;
                                      jc:hasPoint    :11111111-0000-0000-0000-000000000103,
                                                     :11111111-0000-0000-0000-000000000104;
                                      a vrf:VRF_Indoor_Unit;
                                      rdfs:label "IDU-001-001".
:00000000-0000-0000-0000-000000000004 jc:contains    :00000000-0000-0000-0000-000000000005;
                                      a vrf:VRF_ODU_SYSTEM;
                                      rdfs:label "1".
:00000000-0000-0000-0000-000000000005 jc:hasPoint    :11111111-0000-0000-0000-000000000105;
                                      a jcb:Object,
                                        vrf:VRF_Outdoor_Unit;
                                      rdfs:label "ODU-001-000".
:11111111-0000-0000-0000-000000000101 a vrf:Max_Temp_SP;
                                      rdfs:label "Max_Temp_SP".
:11111111-0000-0000-0000-000000000102 a vrf:Zn_Sp;
                                      rdfs:label "ZN-SP".
:11111111-0000-0000-0000-000000000103 a vrf:Zn_T;
                                      rdfs:label "ZN-T".
:11111111-0000-0000-0000-000000000104 a vrf:Zn_Sp;
                                      rdfs:label "ZN-SP".
:11111111-0000-0000-0000-000000000105 a vrf:Comp_2_Top_T;
                                      rdfs:label "COMP2TOP-T".
:11111111-0000-0000-0000-000000000202 vrf_schema:predicts :11111111-0000-0000-0000-000000000102;
                                      a vrf:Zn_Sp.
:11111111-0000-0000-0000-000000000204 vrf_schema:predicts :11111111-0000-0000-0000-000000000104;
                                      a vrf:Zn_Sp.
```

FIG. 10C

BUILDING MANAGEMENT SYSTEM WITH CONTROL FRAMEWORK

CROSS-REFERENCE TO RELATED PATENT APPLICATION

This application is a continuation of U.S. patent application Ser. No. 17/013,194 filed Sep. 4, 2020, the entire disclosure of which is incorporated by reference herein.

BACKGROUND

The present disclosure relates generally to heating, ventilation, or air conditioning (HVAC) systems configured to serve the energy loads of a building or campus. The present disclosure relates more particularly to a cloud computing system for automatic configuration of HVAC systems for a building or campus.

HVAC systems take many forms and may widely vary across different sites. Some building sites (i.e., a building or campus) are served by a central plant. A central plant typically includes multiple subplants configured to serve different types of energy loads. For example, a central plant may include a chiller subplant configured to serve cooling loads, a heater subplant configured to serve heating loads, and/or an electricity subplant configured to serve electric loads. A central plant purchases resources from utilities to run the subplants to meet the loads. Some building sites include separate airside systems (e.g., air handling units, rooftop units, variable air volume units, air ducts, dampers, etc.) that work in combination with a central plant or other HVAC equipment installed in the building to deliver heated or chilled air to the building. Other building sites are served by variable refrigerant flow (VRF) systems (e.g., heat pumping systems, heat recovery systems, etc.) that operate to satisfy the heating or cooling loads of the building site. There exists a need to provide updates to these systems without manually updating each device or unit within the system.

SUMMARY

One implementation of the present disclosure is a method for automatically commissioning and operating a heating, ventilation, or air conditioning (HVAC) system using a cloud computing system to serve energy loads of a building site. The method includes querying site information describing the building site to identify physical equipment of the HVAC system and relationships between the physical equipment. The method further includes constructing an asset allocator model at the cloud computing system using the physical equipment of the HVAC system and the relationships between the physical equipment, the asset allocator model indicating connections between the physical equipment and one or more resources produced or consumed by the physical equipment. The method further includes generating a mapping between points of the physical equipment at the building site and corresponding variables of the asset allocator model. The method further includes using the asset allocator model to generate values of one or more control variables of the asset allocator model. The method further includes adjusting an operation of the physical equipment by providing updated values of the control variables to corresponding points of the physical equipment based on the mapping.

In some embodiments, querying site information includes identifying a type of site based the queried site information, receiving instructions to commission the physical equipment in the HVAC system, performing a set of commissioning steps specific to the type of site identified, the set of commissioning steps comprising the constructing, generating, using, and adjusting steps.

In some embodiments, performing a set of commissioning steps specific to the type of site identified includes constructing the asset allocator model at the cloud computing system such that the operation of the physical equipment is adjusted to optimize operation of the physical site that has been identified.

In some embodiments, querying site information includes determining whether the physical equipment of the HVAC system comprise one or more indoor units (IDUs) and outdoor units (ODUs) of a variable refrigerant flow (VRF) system, determining whether the one or more IDUs and ODUs serve a same building zone, and in response to determining that the one or more IDUs and ODUs serve the same building zone, generating a connection between the one or more IDUs and ODUs in the asset allocator model.

In some embodiments, querying the site information includes querying resource description framework (RDF) specifications of the physical equipment, the RDF specifications defining the relationships between the building equipment using a subject, a predicate, and an object.

In some embodiments, constructing the asset allocator includes generating one or more software elements to automatically collect data from the building site, populate the corresponding variables of the asset allocator model, and push data to the building site from the corresponding variables of the asset allocator model based on the generated mapping.

In some embodiments, constructing the asset allocator includes implementing constraints in the asset allocator model, the constraints comprising at least one of a capacity constraint defining a capacity limit of the physical equipment or a resource balance constraint based on the connections between the physical equipment.

In some embodiments, generating the mapping between points of the physical equipment at the building site and the corresponding variables of the asset allocator model includes generating the mapping prior to using the asset allocator model to generate values of the one or more control variables of the asset allocator model such that the mapping is predetermined.

Another implementation of the present disclosure is a system for automatically commissioning and operating a heating, ventilation, or air conditioning (HVAC) system using a cloud computing system to serve energy loads of a building site. The system includes one or more computer-readable storage media having instructions stored thereon that, when executed by one or more processors, cause the processors to perform operations. The operations include querying site information describing the building site to identify physical equipment of the HVAC system and relationships between the physical equipment. The operations further include constructing an asset allocator model at the cloud computing system using the physical equipment of the HVAC system and the relationships between the physical equipment, the asset allocator model indicating connections between the physical equipment and one or more resources produced or consumed by the physical equipment. The operations further include generating a mapping between points of the physical equipment at the building site and corresponding variables of the asset allocator model. The operations further include using the asset allocator model to generate values of one or more control variables of the asset allocator model. The operations further include adjusting an operation of the physical equipment by triggering one or more software elements to automatically push updated values of the control variables to corresponding points of the physical equipment based on the mapping.

In some embodiments, querying site information includes identifying a type of site based the queried site information, receiving instructions to commission the physical equipment in the HVAC system, performing a set of commissioning steps specific to the type of site identified, the set of commissioning steps comprising the constructing, generating, using, and adjusting steps.

In some embodiments, performing a set of commissioning steps specific to the type of site identified includes constructing the asset allocator model at the cloud computing system such that the operation of the physical equipment is adjusted to optimize operation of the physical site that has been identified.

In some embodiments, querying site information includes determining whether the physical equipment of the HVAC system comprise one or more indoor units (IDUs) or outdoor units (ODUs) of a variable refrigerant flow (VRF) system, determining whether the one or more IDUs and ODUs serve a plurality of zone groups, and in response to determining that the one or more IDUs and ODUs serve a plurality of zone groups, determining the relationships between the physical equipment based on the determination that the one or more IDUs and ODUs serve the plurality of zone groups.

In some embodiments, querying site information includes querying operating data of the physical equipment, the operating data comprising a subject, a predicate, and an object of the physical equipment. In some embodiments, the subject predicate, and object of the physical equipment are defined under resource description framework (RDF) specifications that defines the relationships between the building equipment using the subject, the predicate, and the object.

In some embodiments, constructing an asset allocator comprises implementing constraints in the asset allocator model such that the asset allocator model models the physical equipment operating within its capacity limit; and automatically generating the connections between the physical equipment and the one or more resources.

In some embodiments, constructing an asset allocator includes generating one or more software elements to automatically collect data from the building site, populate the corresponding variables of the asset allocator model, and push data to building site from the corresponding variables of the asset allocator model based on the generated mapping.

Another implementation of the present disclosure is a method for updating a model for serving energy loads of a building or campus. The method includes obtaining an asset allocator model indicating connections between physical equipment of the building or campus and one or more resources produced or consumed by the physical equipment. The method further includes providing a user interface comprising a plurality of selectable items representing components of the asset allocator model. In some embodiments, the user interface is configured to generate a new component of the asset allocator mode and insert the new component into the asset allocator model such that the new component is used in combination with other components of the model when the model is used to simulate an operation of the physical equipment.

In some embodiments, generating the new component of the asset allocator model includes defining operating parameters of the physical equipment corresponding to the new component and specifying one or more input resources or one or more output resources of the physical equipment corresponding to the new component.

In some embodiments, the selectable items representing components of the asset allocator model comprise resource suppliers, subplants, energy loads, and storage devices associated with the building or campus.

In some embodiments, the resource suppliers comprise at least one of an electricity supplier, a water supplier, a natural gas supplier, or a steam supplier. In some embodiments, the subplants comprise at least one of a chiller plant, a boiler plant, a tower plant, or a heat recovery chiller plant. In some embodiments, the energy loads comprise at least one of a chilled water load, a hot water load, or an electric load. In some embodiments, the resource storage device comprises at least one of a thermal storage tank or a battery.

In some embodiments, the method further includes performing a simulated operation of a heating, ventilation, or air conditioning (HVAC) system of the building or campus in accordance with the model to provide the user with optimization information.

In some embodiments, performing the simulated operation of the HVAC system comprises solving an optimization problem to determine an allocation of the energy loads across equipment within the building or campus.

BRIEF DESCRIPTION OF THE DRAWINGS

FIG. 10C is a diagram of computer code based on RDF formatting standards, which can be generated by the control system of FIG. 9, according to some embodiments.

DETAILED DESCRIPTION

Overview

Referring generally to the FIGURES, systems and methods for commissioning a physical site to be compatible with a cloud computing system are shown, according to some embodiments. The physical site can include a variable refrigerant flow (VRF) system configured to serve the thermal energy loads of a building or campus. The cloud computing system may be instructed (e.g., via a user, via a client device, etc.) to commission the VRF system such that the physical equipment within the VRF system is modeled in accordance with the modeling configurations of the cloud computing systems. Advantageously, this can allow the cloud computing system to automatically integrate external systems in building and/or campus simulations of thermal energy load requirements.

The FIGURES additionally disclose systems and methods for allowing front-end applications for generating new model components for the cloud computing system to be compatible with a currently-existing cloud computing model. In particular, a user can develop a new selectable component (e.g., resource pool, resource converter, chiller, boiler, etc.) in an application that models the HVAC system within a building or campus. The previously established components may already be configured to provide a simulated operation of the building HVAC system, once selected, connected, and modeled by the user via the application. However, systems and methods disclosed herein allow the user to generate a new selectable component via the interface which is automatically configurable to be selected (e.g., similar to the other selectable components) and act as a modeling component for the cloud computing system and/or building HVAC system.

Building HVAC Systems

Figure 1:
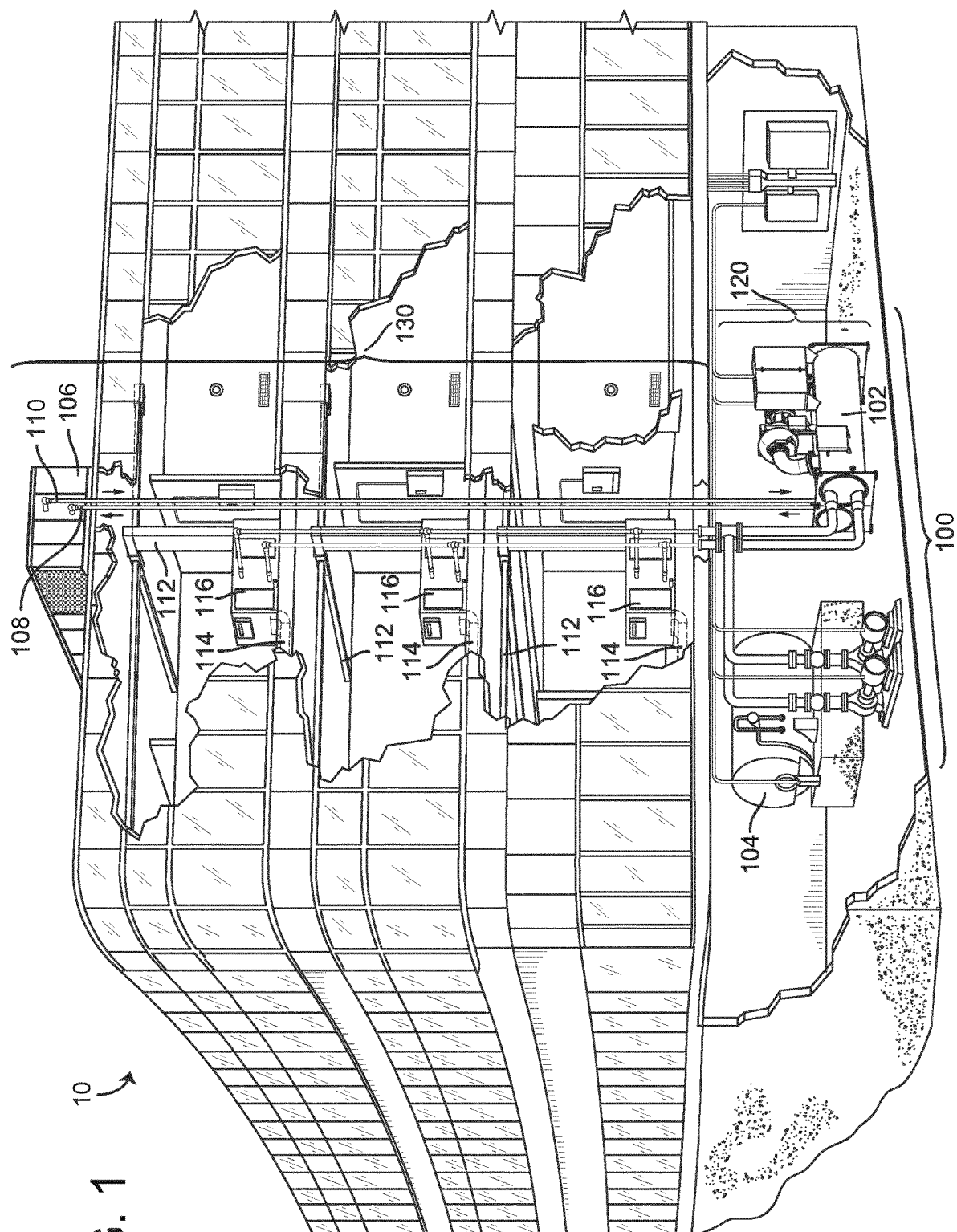
FIG. 1 is a drawing of a building equipped with a HVAC system, according to an exemplary embodiment.
Figure 2:
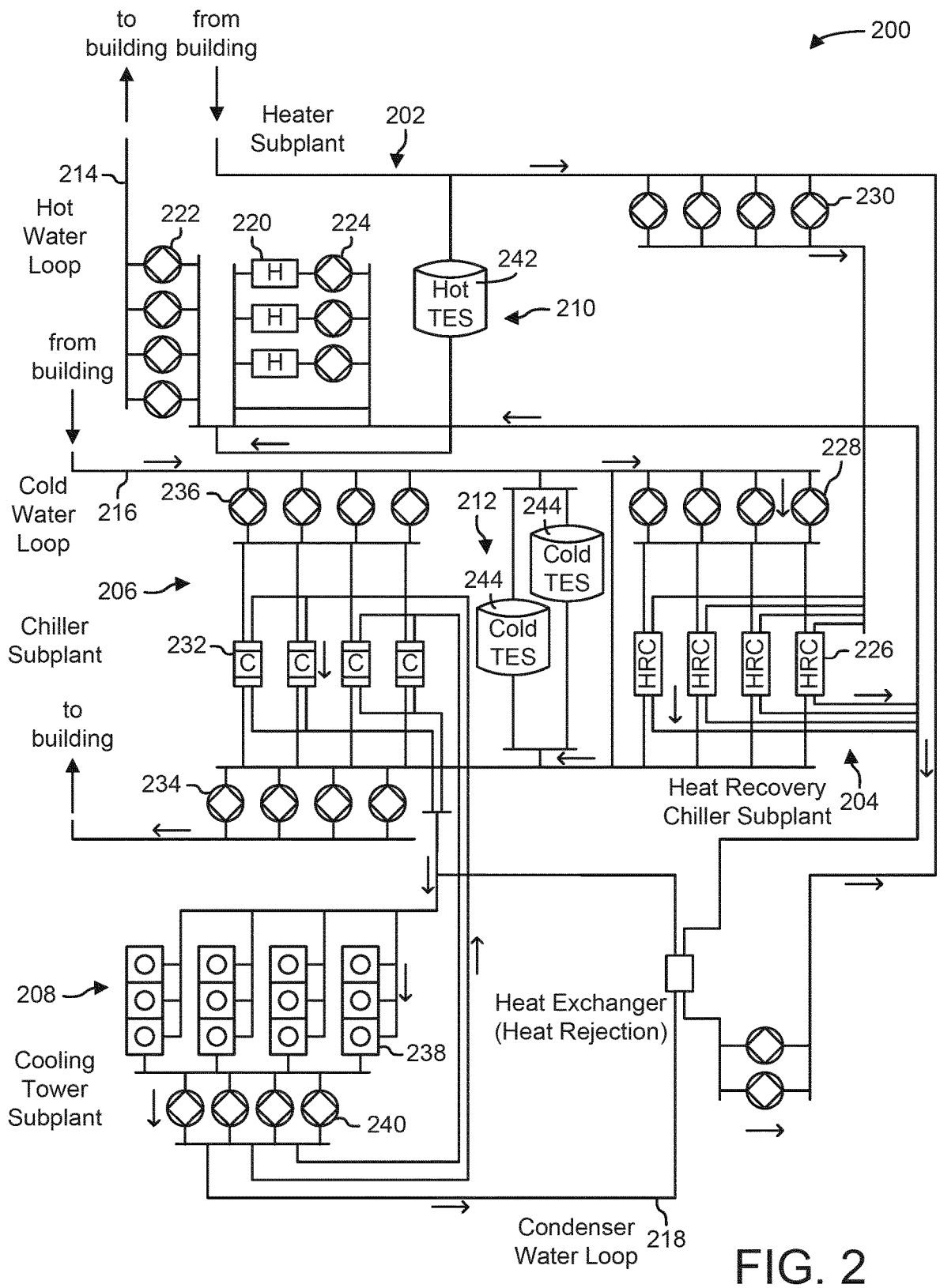
FIG. 2 is a block diagram of a waterside system which can be used to serve the building of FIG. 1, according to an exemplary embodiment.
Figure 3:
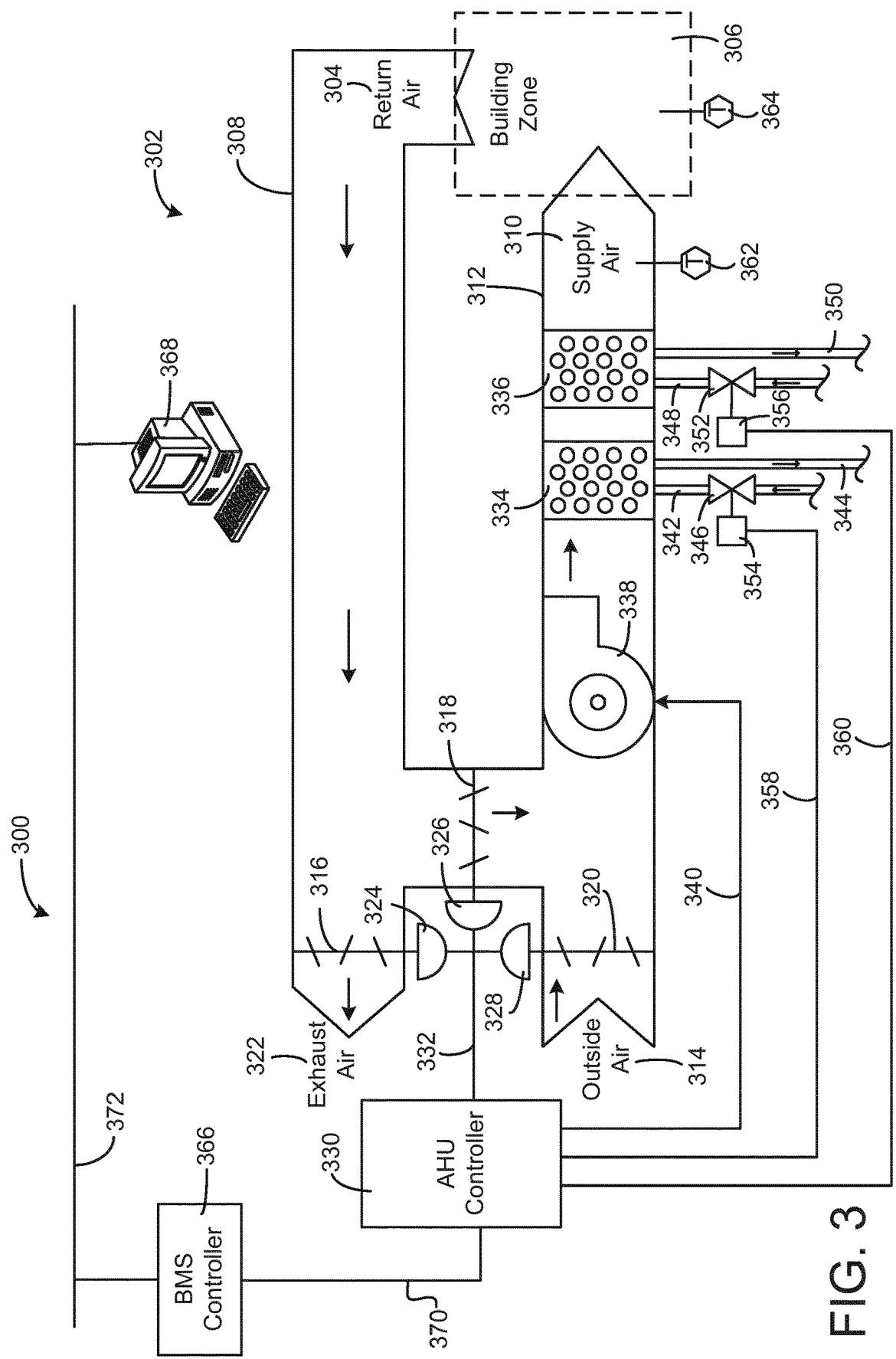
FIG. 3 is a block diagram of an airside system which can be used to serve the building of FIG. 1, according to an exemplary embodiment.
Figure 4:
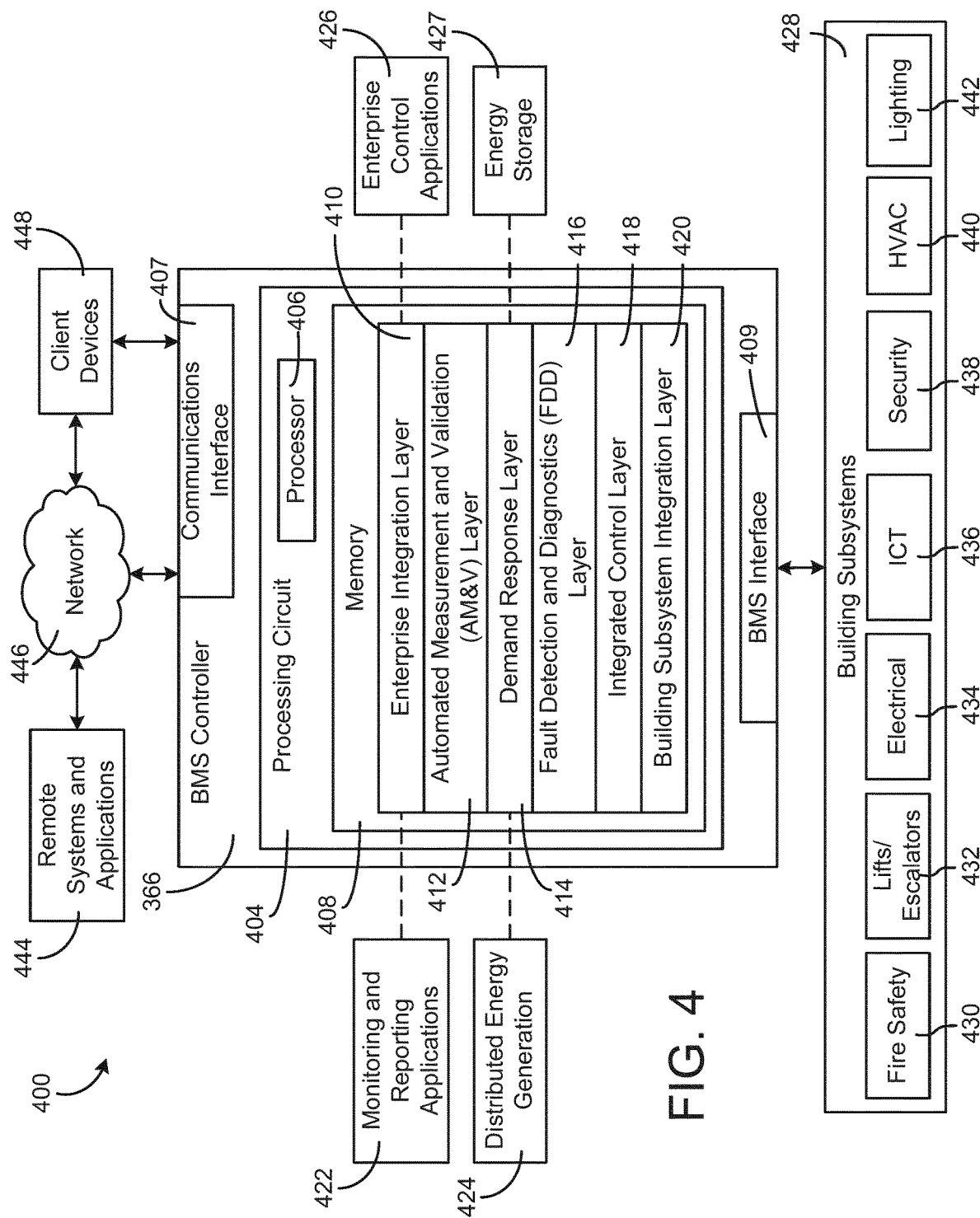
FIG. 4 is a block diagram of a building management system (BMS) which can be used to monitor and control the building of FIG. 1, according to an exemplary embodiment.
Figure 5:
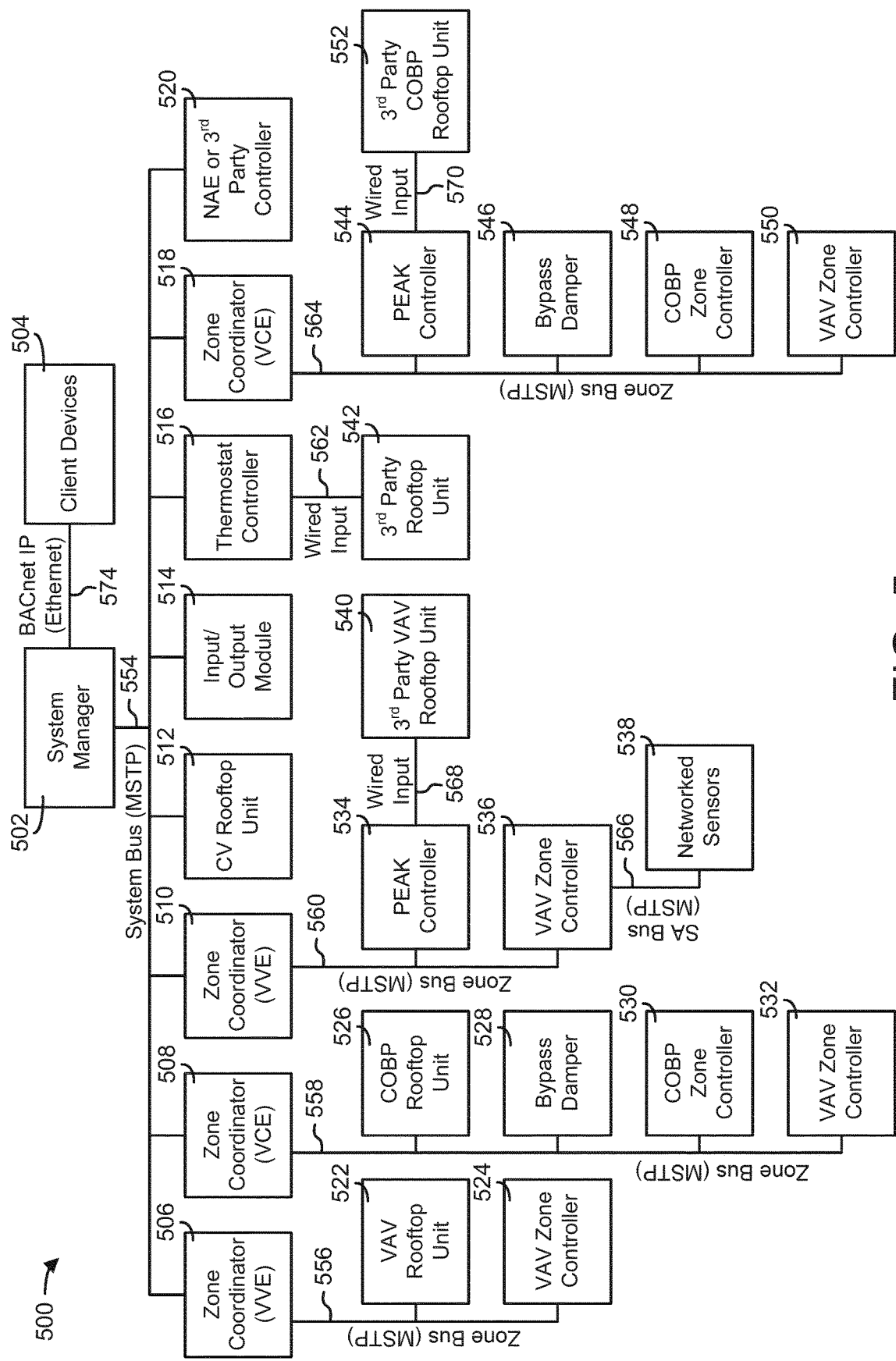
FIG. 5 is a block diagram of another BMS which can be used to monitor and control the building of FIG. 1, according to an exemplary embodiment.

Referring now to FIGS. 1-5, several building management systems (BMS) and HVAC systems in which the systems and methods of the present disclosure can be implemented are shown, according to some embodiments. In brief overview, FIG. 1 shows a building 10 equipped with an HVAC system 100. FIG. 2 is a block diagram of a waterside system 200 which can be used to serve building 10. FIG. 3 is a block diagram of an airside system 300 which can be used to serve building 10. FIG. 4 is a block diagram of a BMS which can be used to monitor and control building 10. FIG. 5 is a block diagram of another BMS which can be used to monitor and control building 10.

HVAC System

Referring particularly to FIG. 1, a perspective view of a building 10 is shown. Building 10 is served by a BMS. A BMS is, in general, a system of devices configured to control, monitor, and manage equipment in or around a building or building area. A BMS can include, for example, an HVAC system, a security system, a lighting system, a fire alerting system, any other system that is capable of managing building functions or devices, or any combination thereof.

The BMS that serves building 10 includes an HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. An exemplary waterside system and airside system which can be used in HVAC system 100 are described in greater detail with reference to FIGS. 2-3.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 may place the working fluid in a heat exchange relationship with an airflow passing through AHU 106 (e.g., via one or more stages of cooling coils and/or heating coils).

The airflow can be, for example, outside air, return air from within building 10, or a combination of both. AHU 106 may transfer heat between the airflow and the working fluid to provide heating or cooling for the airflow. For example, AHU 106 can include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Waterside System

Referring now to FIG. 2, a block diagram of a waterside system 200 is shown, according to some embodiments. In various embodiments, waterside system 200 may supplement or replace waterside system 120 in HVAC system 100 or can be implemented separate from HVAC system 100. When implemented in HVAC system 100, waterside system 200 can include a subset of the HVAC devices in HVAC system 100 (e.g., boiler 104, chiller 102, pumps, valves, etc.) and may operate to supply a heated or chilled fluid to AHU 106. The HVAC devices of waterside system 200 can be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 building 10. Heat recovery chiller subplant 204 can be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. Hot TES subplant 210 and cold TES subplant 212 may store hot and cold thermal energy, respectively, for subsequent use.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, $CO_2$, etc.) can be used in place of or in addition to water to serve thermal energy loads. In other embodiments, subplants 202-212 may provide heating and/or cooling directly to the building or campus without requiring an intermediate heat transfer fluid. These and other variations to waterside system 200 are within the teachings of the present disclosure.

Each of subplants 202-212 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 may also include one or more pumps or valves configured to control the flow rate of the hot water into or out of hot TES tank 242. Cold TES subplant 212 is shown to include cold TES tanks 244 configured to store the cold water for later use. Cold TES subplant 212 may also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves can be integrated with the pumps or positioned upstream or downstream of the pumps to control the fluid flows in waterside system 200. In various embodiments, waterside system 200 can include more, fewer, or different types of devices and/or subplants based on the particular configuration of waterside system 200 and the types of loads served by waterside system 200.

Airside System

Referring now to FIG. 3, a block diagram of an airside system 300 is shown, according to some embodiments. In various embodiments, airside system 300 may supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, ducts 112, 114, fans, dampers, etc.) and can be located in or around building 10. Airside system 300 may operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 may receive return air 304 from building zone 306 via return air duct 308 and may deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 may communicate with an AHU controller 330 via a communications link 332. Actuators 324-328 may receive control signals from AHU controller 330 and may provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 may communicate with fan 338 via communications link 340 to control a flow rate of supply air 310. In some embodiments, AHU controller 330 controls an amount of heating or cooling applied to supply air 310 by modulating a speed of fan 338.

Cooling coil 334 may receive a chilled fluid from waterside system 200 (e.g., from cold water loop 216) via piping 342 and may return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 may receive a heated fluid from waterside system 200 (e.g., from hot water loop 214) via piping 348 and may return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354, 356 may communicate with AHU controller 330 via communications links 358, 360. Actuators 354, 356 may receive control signals from AHU controller 330 and may provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 may also receive a measurement of the temperature of building zone 306 from a temperature sensor 364 located in building zone 306.

In some embodiments, AHU controller 330 operates valves 346 and 352 via actuators 354, 356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU 330 may control the temperature of supply air 310 and/or building zone 306 by activating or deactivating coils 334, 336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 may communicate with multiple downstream building systems or subsystems (e.g., HVAC system 100, a security system, a lighting system, waterside system 200, etc.) via a communications link 372 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 may provide BMS controller 366 with temperature measurements from temperature sensors 362, 364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 may communicate with BMS controller 366 and/or AHU controller 330 via communications link 372.

Building Management System

Referring now to FIG. 4, a block diagram of a building management system (BMS) 400 is shown, according to some embodiments. BMS 400 can be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, an HVAC subsystem 440, a lighting subsystem 442, a lift/escalators subsystem 432, and a fire safety subsystem 430. In various embodiments, building subsystems 428 can include fewer, additional, or alternative subsystems. For example, building subsystems 428 may also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2-3.

Each of building subsystems 428 can include any number of devices, controllers, and connections for completing its individual functions and control activities. HVAC subsystem 440 can include many of the same components as HVAC system 100, as described with reference to FIGS. 1-3. For example, HVAC subsystem 440 can include a chiller, a boiler, any number of air handling units, economizers, field controllers, supervisory controllers, actuators, temperature sensors, and other devices for controlling the temperature, humidity, airflow, or other variable conditions within building 10. Lighting subsystem 442 can include any number of light fixtures, ballasts, lighting sensors, dimmers, or other devices configured to controllably adjust the amount of light provided to a building space. Security subsystem 438 can include occupancy sensors, video surveillance cameras, digital video recorders, video processing servers, intrusion detection devices, access control devices and servers, or other security-related devices.

Still referring to FIG. 4, BMS controller 366 is shown to include a communications interface 407 and a BMS interface 409. Communications interface 407 may facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or building subsystems 428. Communications interface 407 may also facilitate communications between BMS controller 366 and client devices 448. BMS interface 409 may facilitate communications between BMS controller 366 and building subsystems 428 (e.g., HVAC, lighting security, lifts, power distribution, business, etc.).

Interfaces 407, 409 can be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 can be direct (e.g., local wired or wireless communications) or via a communications network 446 (e.g., a WAN, the Internet, a cellular network, etc.). For example, interfaces 407, 409 can include an Ethernet card and port for sending and receiving data via an Ethernet-based communications link or network. In another example, interfaces 407, 409 can include a Wi-Fi transceiver for communicating via a wireless communications network. In another example, one or both of interfaces 407, 409 can include cellular or mobile phone communications transceivers. In one embodiment, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 can be communicably connected to BMS interface 409 and/or communications interface 407 such that processing circuit 404 and the various components thereof can send and receive data via interfaces 407, 409. Processor 406 can be implemented as a general purpose processor, an application-specific integrated circuit (ASIC), one or more field-programmable gate arrays (FPGAs), a group of processing components, or other suitable electronic processing components.

Memory 408 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 408 can be or include volatile memory or non-volatile memory. Memory 408 can include database components, object code components, script components, or any other type of information structure for supporting the various activities and information structures described in the present application. According to some embodiments, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 can be distributed across multiple servers or computers (e.g., that can exist in distributed locations). Further, while FIG. 4 shows applications 422 and 426 as existing outside of BMS controller 366, in some embodiments, applications 422 and 426 can be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration later 420. Layers 410-420 can be configured to receive inputs from building subsystems 428 and other data sources, determine optimal control actions for building subsystems 428 based on the inputs, generate control signals based on the optimal control actions, and provide the generated control signals to building subsystems 428. The following paragraphs describe some of the general functions performed by each of layers 410-420 in BMS 400.

Enterprise integration layer 410 can be configured to serve clients or local applications with information and services to support a variety of enterprise-level applications. For example, enterprise control applications 426 can be configured to provide subsystem-spanning control to a graphical user interface (GUI) or to any number of enterprise-level business applications (e.g., accounting systems, user identification systems, etc.). Enterprise control applications 426 may also or alternatively be configured to provide configuration GUIs for configuring BMS controller 366. In yet other embodiments, enterprise control applications 426 can work with layers 410-420 to optimize building performance (e.g., efficiency, energy use, comfort, or safety) based on inputs received at communications interface 407 and/or BMS interface 409.

Building subsystem integration layer 420 can be configured to manage communications between BMS controller 366 and building subsystems 428. For example, building subsystem integration layer 420 may receive sensor data and input signals from building subsystems 428 and provide output data and control signals to building subsystems 428. Building subsystem integration layer 420 may also be configured to manage communications between building subsystems 428. Building subsystem integration layer 420 translates communications (e.g., sensor data, input signals, output signals, etc.) across a plurality of multi-vendor/multi-protocol systems.

Demand response layer 414 can be configured to optimize resource usage (e.g., electricity use, natural gas use, water use, etc.) and/or the monetary cost of such resource usage in response to satisfy the demand of building 10. The optimization can be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 may receive inputs from other layers of BMS controller 366 (e.g., building subsystem integration layer 420, integrated control layer 418, etc.). The inputs received from other layers can include environmental or sensor inputs such as temperature, carbon dioxide levels, relative humidity levels, air quality sensor outputs, occupancy sensor outputs, room schedules, and the like. The inputs may also include inputs such as electrical use (e.g., expressed in kWh), thermal load measurements, pricing information, projected pricing, smoothed pricing, curtailment signals from utilities, and the like.

According to some embodiments, demand response layer 414 includes control logic for responding to the data and signals it receives. These responses can include communicating with the control algorithms in integrated control layer 418, changing control strategies, changing setpoints, or activating/deactivating building equipment or subsystems in a controlled manner. Demand response layer 414 may also include control logic configured to determine when to utilize stored energy. For example, demand response layer 414 may determine to begin using energy from energy storage 427 just prior to the beginning of a peak use hour.

In some embodiments, demand response layer 414 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models can include, for example, thermodynamic models describing the inputs, outputs, and/or functions performed by various sets of building equipment. Equipment models may represent collections of building equipment (e.g., subplants, chiller arrays, etc.) or individual devices (e.g., individual chillers, heaters, pumps, etc.).

Demand response layer 414 may further include or draw upon one or more demand response policy definitions (e.g., databases, XML, files, etc.). The policy definitions can be edited or adjusted by a user (e.g., via a graphical user interface) so that the control actions initiated in response to demand inputs can be tailored for the user's application, desired comfort level, particular building equipment, or based on other concerns. For example, the demand response policy definitions can specify which equipment can be turned on or off in response to particular demand inputs, how long a system or piece of equipment should be turned off, what setpoints can be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 can be configured to use the data input or output of building subsystem integration layer 420 and/or demand response layer 414 to make control decisions. Due to the subsystem integration provided by building subsystem integration layer 420, integrated control layer 418 can integrate control activities of the building subsystems 428 such that the building subsystems 428 behave as a single integrated supersystem. In some embodiments, integrated control layer 418 includes control logic that uses inputs and outputs from a plurality of building subsystems to provide greater comfort and energy savings relative to the comfort and energy savings that separate subsystems could provide alone. For example, integrated control layer 418 can be configured to use an input from a first subsystem to make an energy-saving control decision for a second subsystem. Results of these decisions can be communicated back to building subsystem integration layer 420.

Integrated control layer 418 is shown to be logically below demand response layer 414. Integrated control layer 418 can be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 can be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 can be configured to provide feedback to demand response layer 414 so that demand response layer 414 checks that constraints (e.g., temperature, lighting levels, etc.) are properly maintained even while demanded load shedding is in progress. The constraints may also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 can be configured to provide calculated inputs (e.g., aggregations) to these higher levels based on outputs from more than one building subsystem.

Automated measurement and validation (AM&V) layer 412 can be configured to verify that control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 can be based on building system energy models and/or equipment models for individual BMS devices or subsystems. For example, AM&V layer 412 may compare a model-predicted output with an actual output from building subsystems 428 to determine an accuracy of the model.

Fault detection and diagnostics (FDD) layer 416 can be configured to provide on-going fault detection for building subsystems 428, building subsystem devices (i.e., building equipment), and control algorithms used by demand response layer 414 and integrated control layer 418. FDD layer 416 may receive data inputs from integrated control layer 418, directly from one or more building subsystems or devices, or from another data source. FDD layer 416 may automatically diagnose and respond to detected faults. The responses to detected or diagnosed faults can include providing an alert message to a user, a maintenance scheduling system, or a control algorithm configured to attempt to repair the fault or to work-around the fault.

FDD layer 416 can be configured to output a specific identification of the faulty component or cause of the fault (e.g., loose damper linkage) using detailed subsystem inputs available at building subsystem integration layer 420. In other exemplary embodiments, FDD layer 416 is configured to provide "fault" events to integrated control layer 418 which executes control strategies and policies in response to the received fault events. According to some embodiments, FDD layer 416 (or a policy executed by an integrated control engine or business rules engine) may shut down systems or direct control activities around faulty devices or systems to reduce energy waste, extend equipment life, or assure proper control response.

FDD layer 416 can be configured to store or access a variety of different system data stores (or data points for live data). FDD layer 416 may use some content of the data stores to identify faults at the equipment level (e.g., specific chiller, specific AHU, specific terminal unit, etc.) and other content to identify faults at component or subsystem levels. For example, building subsystems 428 may generate temporal (i.e., time-series) data indicating the performance of BMS 400 and the various components thereof. The data generated by building subsystems 428 can include measured or calculated values that exhibit statistical characteristics and provide information about how the corresponding system or process (e.g., a temperature control process, a flow control process, etc.) is performing in terms of error from its setpoint. These processes can be examined by FDD layer 416 to expose when the system begins to degrade in performance and alert a user to repair the fault before it becomes more severe.

Referring now to FIG. 5, a block diagram of another building management system (BMS) 500 is shown, according to some embodiments. BMS 500 can be used to monitor and control the devices of HVAC system 100, waterside system 200, airside system 300, building subsystems 428, as well as other types of BMS devices (e.g., lighting equipment, security equipment, etc.) and/or HVAC equipment.

BMS 500 provides a system architecture that facilitates automatic equipment discovery and equipment model distribution. Equipment discovery can occur on multiple levels of BMS 500 across multiple different communications busses (e.g., a system bus 554, zone buses 556-560 and 564, sensor/actuator bus 566, etc.) and across multiple different communications protocols. In some embodiments, equipment discovery is accomplished using active node tables, which provide status information for devices connected to each communications bus. For example, each communications bus can be monitored for new devices by monitoring the corresponding active node table for new nodes. When a new device is detected, BMS 500 can begin interacting with the new device (e.g., sending control signals, using data from the device) without user interaction.

Some devices in BMS 500 present themselves to the network using equipment models. An equipment model defines equipment object attributes, view definitions, schedules, trends, and the associated BACnet value objects (e.g., analog value, binary value, multistate value, etc.) that are used for integration with other systems. Some devices in BMS 500 store their own equipment models. Other devices in BMS 500 have equipment models stored externally (e.g., within other devices). For example, a zone coordinator 508 can store the equipment model for a bypass damper 528. In some embodiments, zone coordinator 508 automatically creates the equipment model for bypass damper 528 or other devices on zone bus 558. Other zone coordinators can also create equipment models for devices connected to their zone busses. The equipment model for a device can be created automatically based on the types of data points exposed by the device on the zone bus, device type, and/or other device attributes. Several examples of automatic equipment discovery and equipment model distribution are discussed in greater detail below.

Still referring to FIG. 5, BMS 500 is shown to include a system manager 502; several zone coordinators 506, 508, 510 and 518; and several zone controllers 524, 530, 532, 536, 548, and 550. System manager 502 can monitor data points in BMS 500 and report monitored variables to various monitoring and/or control applications. System manager 502 can communicate with client devices 504 (e.g., user devices, desktop computers, laptop computers, mobile devices, etc.) via a data communications link 574 (e.g., BACnet IP, Ethernet, wired or wireless communications, etc.). System manager 502 can provide a user interface to client devices 504 via data communications link 574. The user interface may allow users to monitor and/or control BMS 500 via client devices 504.

In some embodiments, system manager 502 is connected with zone coordinators 506-510 and 518 via a system bus 554. System manager 502 can be configured to communicate with zone coordinators 506-510 and 518 via system bus 554 using a master-slave token passing (MSTP) protocol or any other communications protocol. System bus 554 can also connect system manager 502 with other devices such as a constant volume (CV) rooftop unit (RTU) 512, an input/output module (IOM) 514, a thermostat controller 516 (e.g., a TEC5000 series thermostat controller), and a network automation engine (NAE) or third-party controller 520. RTU 512 can be configured to communicate directly with system manager 502 and can be connected directly to system bus 554. Other RTUs can communicate with system manager 502 via an intermediate device. For example, a wired input 562 can connect a third-party RTU 542 to thermostat controller 516, which connects to system bus 554.

System manager 502 can provide a user interface for any device containing an equipment model. Devices such as zone coordinators 506-510 and 518 and thermostat controller 516 can provide their equipment models to system manager 502 via system bus 554. In some embodiments, system manager 502 automatically creates equipment models for connected devices that do not contain an equipment model (e.g., IOM 514, third-party controller 520, etc.). For example, system manager 502 can create an equipment model for any device that responds to a device tree request. The equipment models created by system manager 502 can be stored within system manager 502. System manager 502 can then provide a user interface for devices that do not contain their own equipment models using the equipment models created by system manager 502. In some embodiments, system manager 502 stores a view definition for each type of equipment connected via system bus 554 and uses the stored view definition to generate a user interface for the equipment.

Each zone coordinator 506-510 and 518 can be connected with one or more of zone controllers 524, 530-532, 536, and 548-550 via zone buses 556, 558, 560, and 564. Zone coordinators 506-510 and 518 can communicate with zone controllers 524, 530-532, 536, and 548-550 via zone busses 556-560 and 564 using a MSTP protocol or any other communications protocol. Zone busses 556-560 and 564 can also connect zone coordinators 506-510 and 518 with other types of devices such as variable air volume (VAV) RTUs 522 and 540, changeover bypass (COBP) RTUs 526 and 552, bypass dampers 528 and 546, and PEAK controllers 534 and 544.

Zone coordinators 506-510 and 518 can be configured to monitor and command various zoning systems. In some embodiments, each zone coordinator 506-510 and 518 monitors and commands a separate zoning system and is connected to the zoning system via a separate zone bus. For example, zone coordinator 506 can be connected to VAV RTU 522 and zone controller 524 via zone bus 556. Zone coordinator 508 can be connected to COBP RTU 526, bypass damper 528, COBP zone controller 530, and VAV zone controller 532 via zone bus 558. Zone coordinator 510 can be connected to PEAK controller 534 and VAV zone controller 536 via zone bus 560. Zone coordinator 518 can be connected to PEAK controller 544, bypass damper 546, COBP zone controller 548, and VAV zone controller 550 via zone bus 564.

A single model of zone coordinator 506-510 and 518 can be configured to handle multiple different types of zoning systems (e.g., a VAV zoning system, a COBP zoning system, etc.). Each zoning system can include a RTU, one or more zone controllers, and/or a bypass damper. For example, zone coordinators 506 and 510 are shown as Verasys VAV engines (VVEs) connected to VAV RTUs 522 and 540, respectively. Zone coordinator 506 is connected directly to VAV RTU 522 via zone bus 556, whereas zone coordinator 510 is connected to a third-party VAV RTU 540 via a wired input 568 provided to PEAK controller 534. Zone coordinators 508 and 518 are shown as Verasys COBP engines (VCEs) connected to COBP RTUs 526 and 552, respectively. Zone coordinator 508 is connected directly to COBP RTU 526 via zone bus 558, whereas zone coordinator 518 is connected to a third-party COBP RTU 552 via a wired input 570 provided to PEAK controller 544.

Zone controllers 524, 530-532, 536, and 548-550 can communicate with individual BMS devices (e.g., sensors, actuators, etc.) via sensor/actuator (SA) busses. For example, VAV zone controller 536 is shown connected to networked sensors 538 via SA bus 566. Zone controller 536 can communicate with networked sensors 538 using a MSTP protocol or any other communications protocol. Although only one SA bus 566 is shown in FIG. 5, it should be understood that each zone controller 524, 530-532, 536, and 548-550 can be connected to a different SA bus. Each SA bus can connect a zone controller with various sensors (e.g., temperature sensors, humidity sensors, pressure sensors, light sensors, occupancy sensors, etc.), actuators (e.g., damper actuators, valve actuators, etc.) and/or other types of controllable equipment (e.g., chillers, heaters, fans, pumps, etc.).

Each zone controller 524, 530-532, 536, and 548-550 can be configured to monitor and control a different building zone. Zone controllers 524, 530-532, 536, and 548-550 can use the inputs and outputs provided via their SA busses to monitor and control various building zones. For example, VAV zone controller 536 can use a temperature input received from networked sensors 538 via SA bus 566 (e.g., a measured temperature of a building zone) as feedback in a temperature control algorithm. Zone controllers 524, 530-532, 536, and 548-550 can use various types of control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control a variable state or condition (e.g., temperature, humidity, airflow, lighting, etc.) in or around building 10.

Variable Refrigerant Flow Systems

Figure 6:
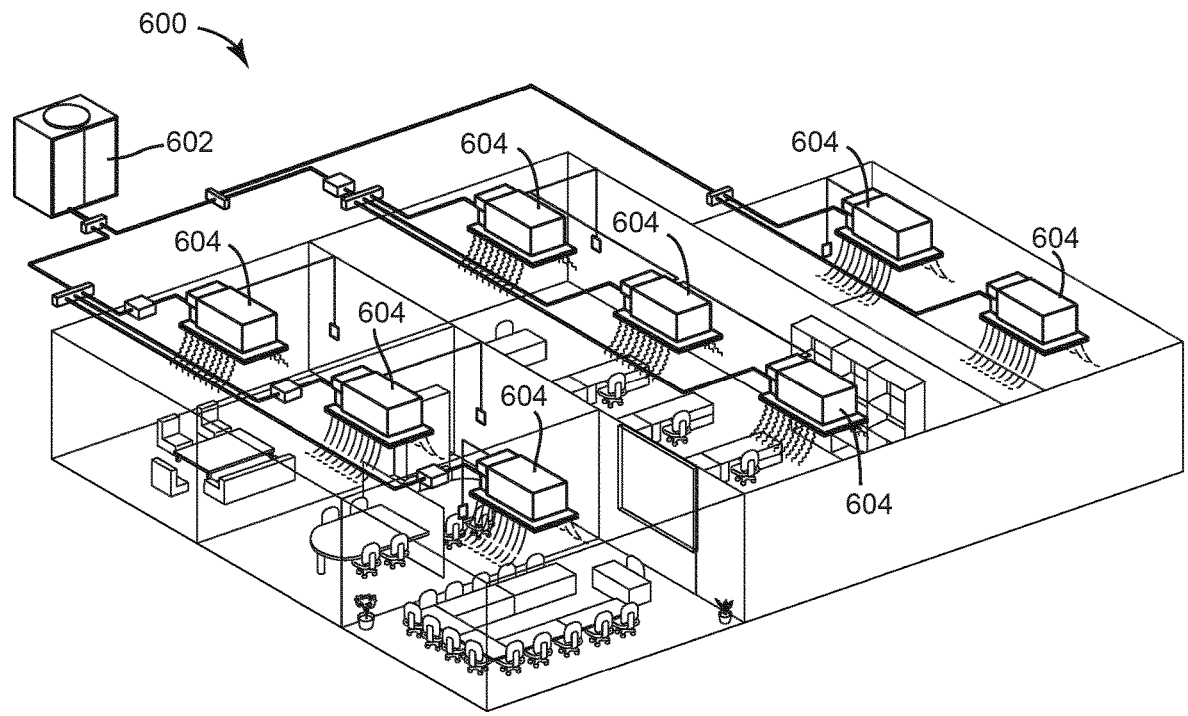
FIG. 6 is a diagram of a building served by a variable refrigerant flow system (VRF), according to an exemplary embodiment.
Figure 7:
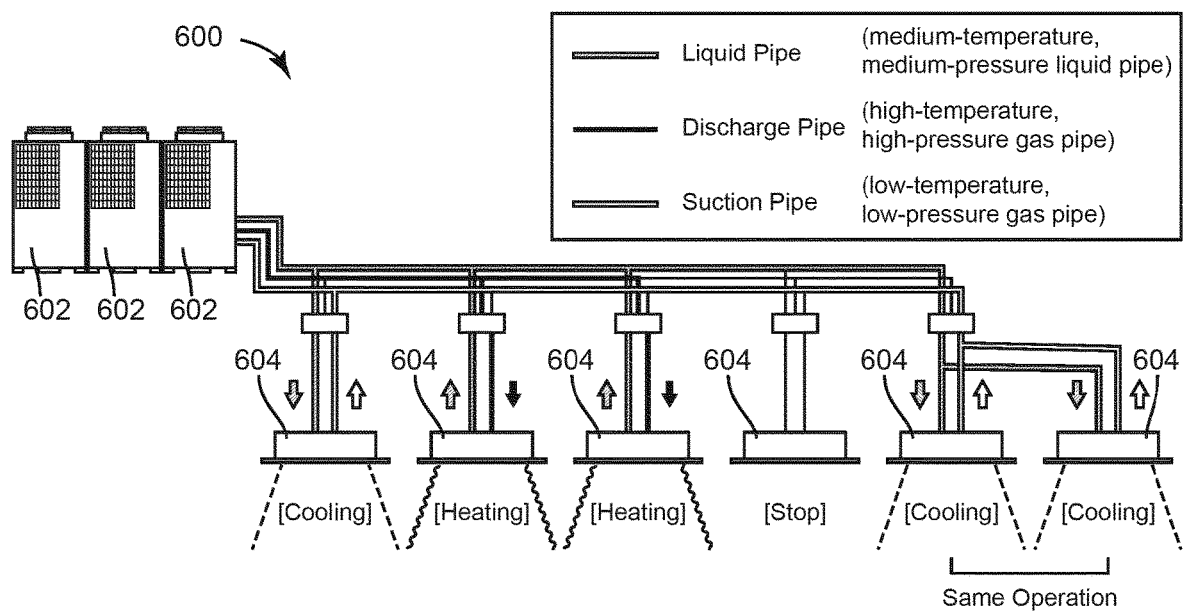
FIG. 7 is a diagram of the variable refrigerant flow system of FIG. 6, according to an exemplary embodiment.

Referring now to FIGS. 6-7, a variable refrigerant flow (VRF) system 600 is shown, according to some embodiments. VRF system 600 is shown to include one or more outdoor VRF units 602 and a plurality of indoor VRF units 604. Outdoor VRF units 602 can be located outside a building and can operate to heat or cool a refrigerant. Outdoor VRF units 602 can consume electricity to convert refrigerant between liquid, gas, and/or super-heated gas phases. Indoor VRF units 604 can be distributed throughout various building zones within a building and can receive the heated or cooled refrigerant from outdoor VRF units 602. Each indoor VRF unit 604 can provide temperature control for the particular building zone in which the indoor VRF unit 604 is located. Although the term "indoor" is used to denote that the indoor VRF units 604 are typically located inside of buildings, in some cases one or more indoor VRF units are located "outdoors" (i.e., outside of a building) for example to heat/cool a patio, entryway, walkway, etc.

One advantage of VRF system 600 is that some indoor VRF units 604 can operate in a cooling mode while other indoor VRF units 604 operate in a heating mode. For example, each of outdoor VRF units 602 and indoor VRF units 604 can operate in a heating mode, a cooling mode, or an off mode. Each building zone can be controlled independently and can have different temperature setpoints. In some embodiments, each building has up to three outdoor VRF units 602 located outside the building (e.g., on a rooftop) and up to 128 indoor VRF units 604 distributed throughout the building (e.g., in various building zones). Building zones may include, among other possibilities, apartment units, offices, retail spaces, and common areas. In some cases, various building zones are owned, leased, or otherwise occupied by a variety of tenants, all served by the VRF system 600.

Many different configurations exist for VRF system 600. In some embodiments, VRF system 600 is a two-pipe system in which each outdoor VRF unit 602 connects to a single refrigerant return line and a single refrigerant outlet line. In a two-pipe system, all of outdoor VRF units 602 may operate in the same mode since only one of a heated or chilled refrigerant can be provided via the single refrigerant outlet line. In other embodiments, VRF system 600 is a three-pipe system in which each outdoor VRF unit 602 connects to a refrigerant return line, a hot refrigerant outlet line, and a cold refrigerant outlet line. In a three-pipe system, both heating and cooling can be provided simultaneously via the dual refrigerant outlet lines. An example of a three-pipe VRF system is described in detail with reference to FIG. 8.

Figure 8:
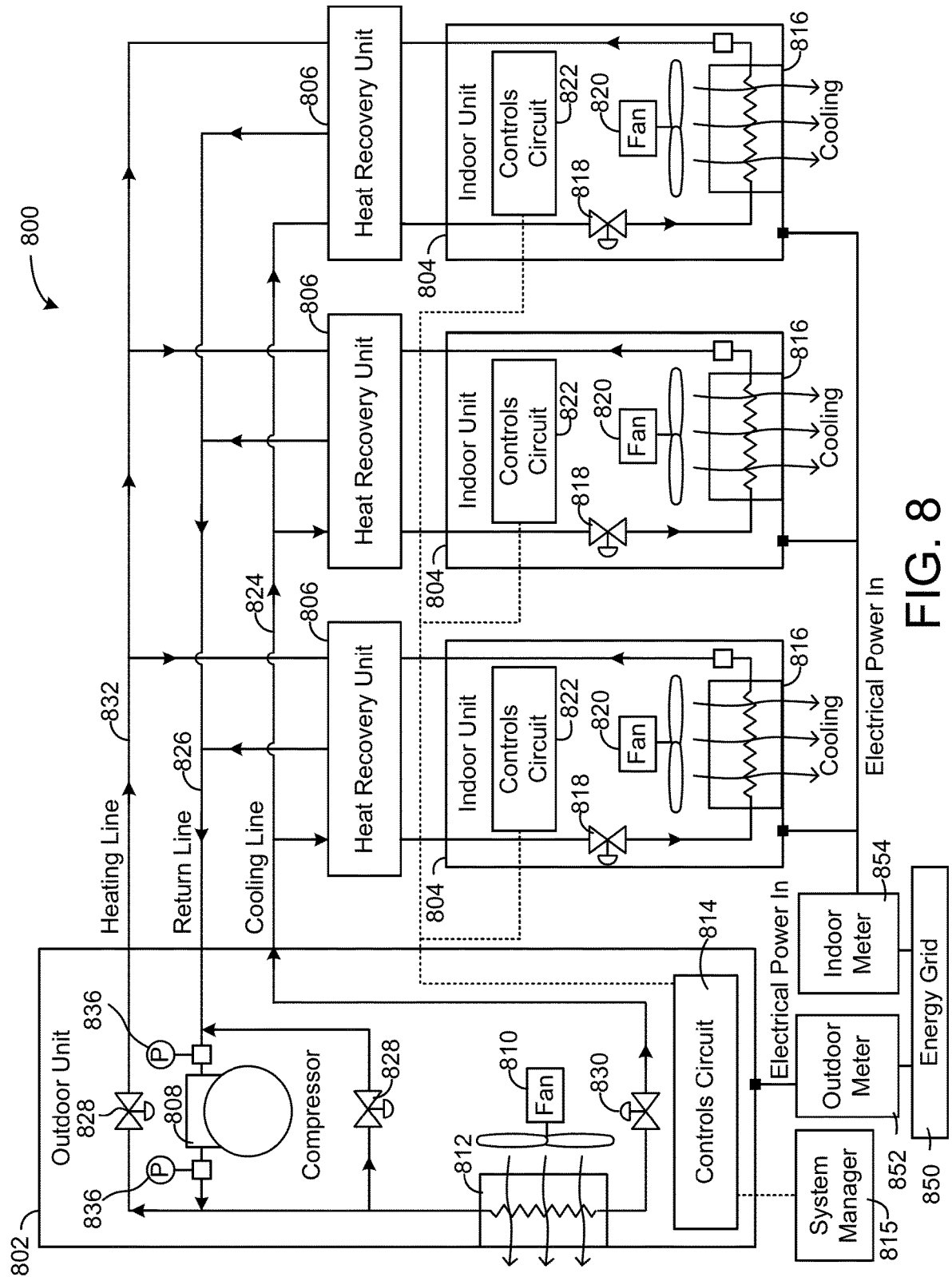
FIG. 8 is a detailed diagram of a variable refrigerant flow system, according to an exemplary embodiment.

Referring now to FIG. 8, a block diagram illustrating a VRF system 800 is shown, according to some embodiments. VRF system 800 is shown to include outdoor VRF unit 802, several heat recovery units 806, and several indoor VRF units 804. Outdoor VRF unit 802 may include a compressor 808, a fan 810, or other power-consuming refrigeration components configured to convert a refrigerant between liquid, gas, and/or super-heated gas phases. Indoor VRF units 804 can be distributed throughout various building zones within a building and can receive the heated or cooled refrigerant from outdoor VRF unit 802. Each indoor VRF unit 804 can provide temperature control for the particular building zone in which the indoor VRF unit 804 is located. Heat recovery units 806 can control the flow of a refrigerant between outdoor VRF unit 802 and indoor VRF units 804 (e.g., by opening or closing valves) and can minimize the heating or cooling load to be served by outdoor VRF unit 802.

Outdoor VRF unit 802 is shown to include a compressor 808 and a heat exchanger 812. Compressor 808 circulates a refrigerant between heat exchanger 812 and indoor VRF units 804. The compressor 808 operates at a variable frequency as controlled by outdoor unit controls circuit 814. At higher frequencies, the compressor 808 provides the indoor VRF units 804 with greater heat transfer capacity. Electrical power consumption of compressor 808 increases proportionally with compressor frequency.

Heat exchanger 812 can function as a condenser (allowing the refrigerant to reject heat to the outside air) when VRF system 800 operates in a cooling mode or as an evaporator (allowing the refrigerant to absorb heat from the outside air) when VRF system 800 operates in a heating mode. Fan 810 provides airflow through heat exchanger 812. The speed of fan 810 can be adjusted (e.g., by outdoor unit controls circuit 814) to modulate the rate of heat transfer into or out of the refrigerant in heat exchanger 812.

Each indoor VRF unit 804 is shown to include a heat exchanger 816 and an expansion valve 818. Each of heat exchangers 816 can function as a condenser (allowing the refrigerant to reject heat to the air within the room or zone) when the indoor VRF unit 804 operates in a heating mode or as an evaporator (allowing the refrigerant to absorb heat from the air within the room or zone) when the indoor VRF unit 804 operates in a cooling mode. Fans 820 provide airflow through heat exchangers 816. The speeds of fans 820 can be adjusted (e.g., by indoor unit controls circuits 822) to modulate the rate of heat transfer into or out of the refrigerant in heat exchangers 816.

In FIG. 8, indoor VRF units 804 are shown operating in the cooling mode. In the cooling mode, the refrigerant is provided to indoor VRF units 804 via cooling line 824. The refrigerant is expanded by expansion valves 818 to a cold, low pressure state and flows through heat exchangers 816 (functioning as evaporators) to absorb heat from the room or zone within the building. The heated refrigerant then flows back to outdoor VRF unit 802 via return line 826 and is compressed by compressor 808 to a hot, high pressure state. The compressed refrigerant flows through heat exchanger 812 (functioning as a condenser) and rejects heat to the outside air. The cooled refrigerant can then be provided back to indoor VRF units 804 via cooling line 824. In the cooling mode, flow control valves 828 can be closed and expansion valve 830 can be completely open.

In the heating mode, the refrigerant is provided to indoor VRF units 804 in a hot state. The hot refrigerant flows through heat exchangers 816 (functioning as condensers) and rejects heat to the air within the room or zone of the building. The refrigerant then flows back to outdoor VRF unit via cooling line 824 (opposite the flow direction shown in FIG. 8). The refrigerant can be expanded by expansion valve 830 to a colder, lower pressure state. The expanded refrigerant flows through heat exchanger 812 (functioning as an evaporator) and absorbs heat from the outside air. The heated refrigerant can be compressed by compressor 808 and provided back to indoor VRF units 804 in a hot, compressed state. In the heating mode, flow control valves 828 can be completely open to allow the refrigerant from compressor 808 to flow into a heating line.

As shown in FIG. 8, each indoor VRF unit 804 includes an indoor unit controls circuit 822. Indoor unit controls circuit 822 controls the operation of components of the indoor VRF unit 804, including the fan 820 and the expansion valve 818, in response to a building zone temperature setpoint or other request to provide heating/cooling to the building zone. For example, the indoor unit controls circuit 822 can generate a signal to turn the fan 820 on and off. Indoor unit controls circuit 822 also determines a heat transfer capacity required by the indoor VRF unit 804 and a frequency of compressor 808 that corresponds to that capacity. When the indoor unit controls circuit 822 determines that the indoor VRF unit 804 must provide heating or cooling of a certain capacity, the indoor unit controls circuit 822 then generates and transmits a compressor frequency request to the outdoor unit controls circuit 814 including the compressor frequency corresponding to the required capacity.

Outdoor unit controls circuit 814 receives compressor frequency requests from one or more indoor unit controls circuits 822 and aggregates the requests, for example, by summing the compressor frequency requests into a compressor total frequency. In some embodiments, the compressor frequency has an upper limit, such that the compressor total frequency cannot exceed the upper limit. The outdoor unit controls circuit 814 supplies the compressor total frequency to the compressor, for example, as an input frequency given to a DC inverter compressor motor of the compressor. The indoor unit controls circuits 822 and the outdoor unit controls circuit 814 thereby combine to modulate the compressor frequency to match heating/cooling demand. The outdoor unit controls circuit 214 may also generate signals to control valve positions of the flow control valves 828 and expansion valve 830, a compressor power setpoint, a refrigerant flow setpoint, a refrigerant pressure, on/off commands, staging commands, or other signals that affect the operation of compressor 808, as well as control signals provided to fan 810 including a fan speed setpoint, a fan power setpoint, an airflow setpoint, on/off commands, or other signals that affect the operation of fan 810.

Indoor unit controls circuits 822 and outdoor unit controls circuit 814 may store and/or provide a data history of one or more control signals generated by or provided to the controls circuits 814, 822. For example, indoor unit controls circuits 822 may store and/or provide a log of generated compressor request frequencies, fan on/off times, and indoor VRF unit 804 on/off times. Outdoor unit controls circuit 814 may store and/or provide a log of compressor request frequencies and/or compressor total frequencies and compressor runtimes.

The VRF system 800 is shown as running on electrical power provided by an energy grid 850 via an outdoor meter 852 and an indoor meter 854. According to various embodiments, the energy grid 850 is any supply of electricity (e.g., an electrical grid maintained by a utility company and supplied with power by one or more power plants, etc.). The outdoor meter 852 measures the electrical power consumption over time of the outdoor VRF unit 802, for example, in kilowatt-hours (kWh). The indoor meter 854 measures the electrical power consumption over time of the indoor VRF units 804, for example, in kWh. The VRF system 800 incurs energy consumption costs based on the metered electrical power consumption of the outdoor meter 852 and/or the indoor meter 854, as billed by the utility company that provides the electrical power. The price of electrical power (e.g., dollars per kWh) may vary over time. The VRF system 800 also includes a system manager 815. In some embodiments, system manager 815 is configured to minimize energy consumption costs for the VRF system 800 while also maintaining occupant comfort.

While systems and methods disclosed herein are generally related to VRF systems, other systems may implement the commissioning methods disclosed herein. For example, auto-commissioner 924 may query data from VRF system 1102, smart thermostat 1202, virtual systems (e.g., building information models (BIMs), etc.), and various other systems.

Auto-Commission w/Cloud Computing System

Figure 9:
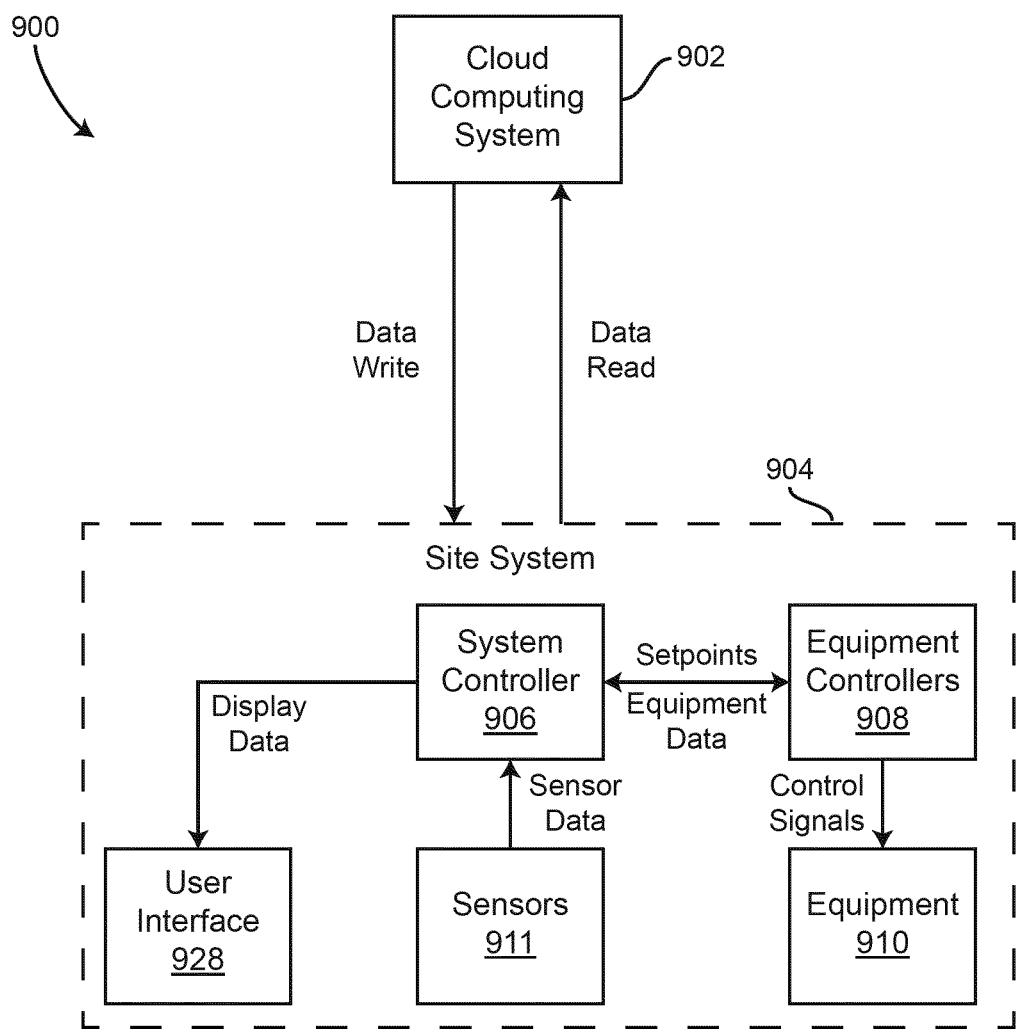
FIG. 9 is a block diagram of a unified control system for a building, including a cloud computing system, according to some embodiments.

Referring now to FIG. 9, a system 900 for controlling a building HVAC system is shown, according to some embodiments. System 900 is shown to include cloud computing system 902 and site system 904. Site system 904 is shown to include system controller 906, equipment controllers 908, equipment 910, sensors 911, and user interface 928. In some embodiments, site system 904 is or includes waterside system 200. In some embodiments, site system 904 is or includes airside system 300. In some embodiments, site system 904 is or includes VRF system 600 and/or VRF system 800.

Cloud computing system 902 may be configured to communicate with a system controller 906 of site system 904. In some embodiments, system controller 906 is a controller that is configured to operate site system 904 to serve building 10 and is positioned locally (e.g., on-site) at building 10. In some embodiments, system controller 906 is a thermostat, a building manager, a system manager, etc. For example, system controller 906 can be or include any of the functionality of BMS controller 366 and may be configured to operate any equipment (e.g., fire equipment, lifts/escalators, security devices, HVAC equipment, lighting, etc.) of building 10. In some embodiments, system controller 906 is a controller for a particular subsystem of building 10. For example, system controller 906 can be a controller that operates VRF system 600.

In some embodiments, cloud computing system 902 and system controller 906 can communicate wirelessly. Cloud computing system 902 may read data from system controller 906 at scheduled intervals. Cloud computing system 902 can receive the data from system controller 906, use the data to determine control decisions for site system 904 and write data (e.g., setpoints, operational decisions, control decisions, commands, etc.) to system controller 906. In some embodiments, system controller 906 receives the data from cloud computing system 902 and provides setpoints to corresponding equipment controllers 908. In some embodiments, equipment controllers 908 are configured to receive the setpoints from system controller 906 as determined by cloud computing system 902 and provide control signals to equipment 910 to operate equipment 910 according to the setpoints. In some embodiments, system controller 906 is configured to receive sensor data from sensors 911. Sensors 911 can be any temperature sensors, pressure sensors, optical sensors, etc., configured to measure environmental data, equipment operational data, zone temperatures, zone humidity, equipment power consumption, etc. In some embodiments, system controller 906 is configured to receive equipment data from equipment controllers 908. The equipment data received by system controller 906 from equipment controllers 908 can include operational data (e.g., current operating parameters of equipment 910, power consumption of equipment 910, configuration of equipment 910, inter-relationships between various equipment 910, etc.) of equipment 910. In some embodiments, cloud computing system 902 is configured to receive any of the sensor data and/or the equipment data from system controller 906. In some embodiments, cloud computing system 902 can be located within one or more servers external to the building site (e.g., in the cloud) or implemented locally at the building site (e.g., a local cloud). In some embodiments, a building site, as described herein, can include a building, campus, or any combination thereof.

Figure 10A:
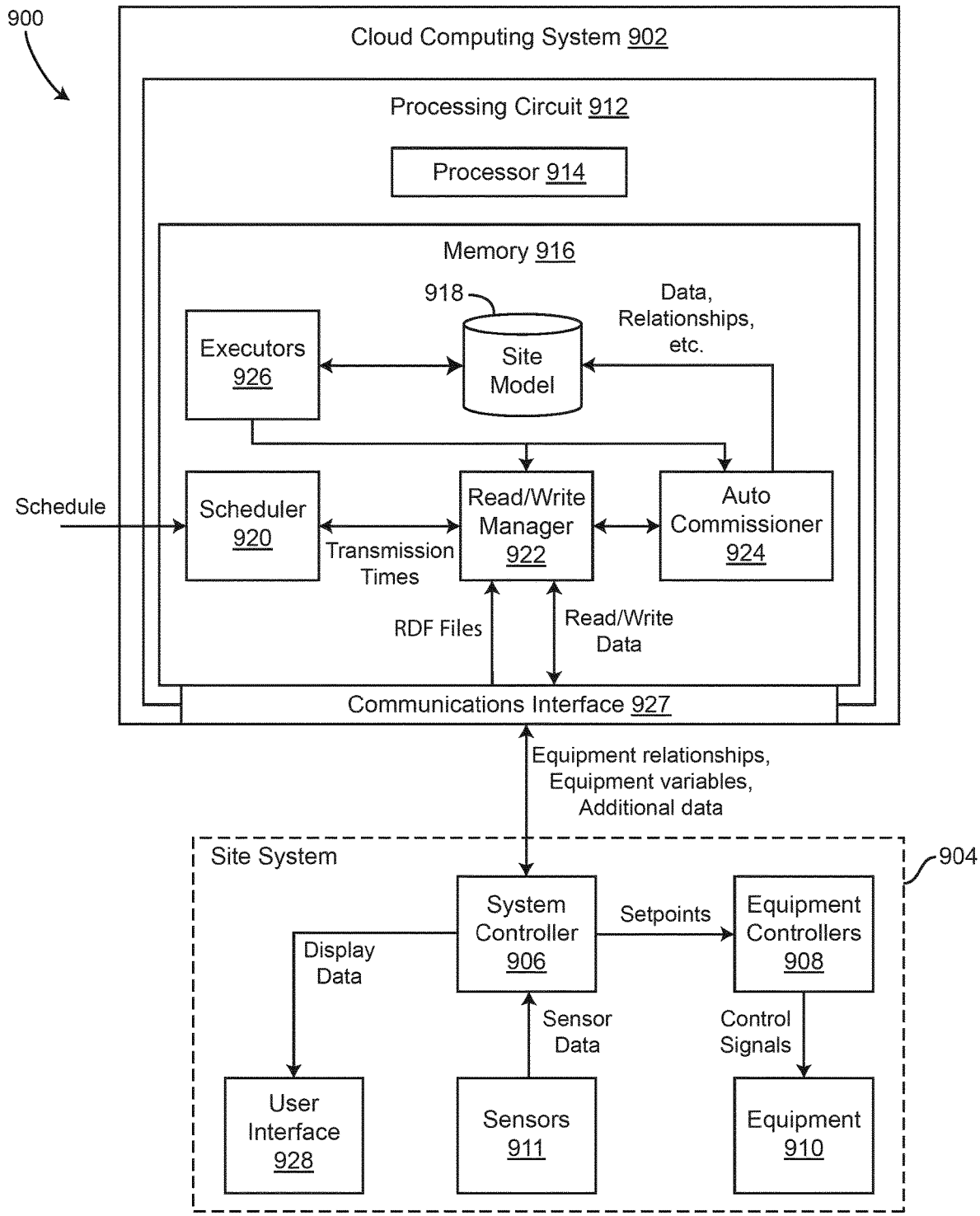
FIG. 10A is a block diagram of the unified control system of FIG. 9 showing the cloud computing system in greater detail, according to some embodiments.

Referring now to FIG. 10A, system 900 is shown in greater detail, according to some embodiments. Particularly, cloud computing system 902 is shown in greater detail, according to some embodiments. In some embodiments, cloud computing system 902 is a remote computing device that is configured to communicate with site system 904 (e.g., with system controller 906) to make control decisions and/or control recommendations for building 10 (e.g., for equipment 910 of site system 904). In some embodiments, cloud computing system 902 is a single remote computing device, while in other embodiments, the functionality of cloud computing system 902 is distributed across multiple devices. It should be understood that while the functionality of cloud computing system 902 is described as being performed by a single computing device, the functionality of cloud computing system 902 can also be distributed across multiple computing devices, and such implementations should be understood to be within the scope of the present disclosure.

Cloud computing system 902 can include a communications interface 927. Communications interface 927 may facilitate communications between cloud computing system 902 and external systems, devices, sensors, etc. (e.g., system controller 906) for allowing user control, monitoring, and adjustment to any of the communicably connected devices, sensors, systems, etc. Communications interface 927 may also facilitate communications between cloud computing system 902 and a user interface (e.g., a graphical user interface). Communications interface 927 may facilitate communications between cloud computing system 902 and site system 904 (e.g., system controller 906, equipment controllers 908, equipment 910, sensors 911, etc.).

Communications interface 927 can be or include wired or wireless communications interfaces (e.g., jacks, antennas, transmitters, receivers, transceivers, wire terminals, etc.) for conducting data communications with sensors, devices, systems, etc., of system 900 or other external systems or devices (e.g., a user interface, site system 904, system controller 906, etc.). In various embodiments, communications via communications interface 927 can be direct (e.g., local wired or wireless communications) or via a communications network (e.g., a WAN, the Internet, a cellular network, etc.). For example, communications interface 927 can include an Ethernet card and port for sending and receiving data via an Ethernet-based communications link or network. In another example, communications interface 927 can include a Wi-Fi transceiver for communicating via a wireless communications network. In some embodiments, communications interface 927 is or includes a power line communications interface. In other embodiments, communications interface 927 is or includes an Ethernet interface, a USB interface, a serial communications interface, a parallel communications interface, etc.

Cloud computing system 902 includes a processing circuit 912, processor 914, and memory 916, according to some embodiments. Processing circuit 912 can be communicably connected to communications interface 927 such that processing circuit 912 and the various components thereof can send and receive data via the communications interface 927. Processor 914 can be implemented as a general purpose processor, an application-specific integrated circuit (ASIC), one or more field-programmable gate arrays (FPGAs), a group of processing components, or other suitable electronic processing components.

Memory 916 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 916 can be or include volatile memory or non-volatile memory. Memory 916 can include database components, object code components, script components, or any other type of information structure for supporting the various activities and information structures described in the present application. According to some embodiments, memory 916 is communicably connected to processor 914 via processing circuit 912 and includes computer code for executing (e.g., by processing circuit 912 and/or processor 914) one or more processes described herein.

Still referring to FIG. 10A, memory 916 includes a read/write manager 922, an automatic commissioner 924, a scheduler 920, a site model 918, and executors 926, according to some embodiments. In some embodiments, read/write manager 922 is configured to facilitate communication between cloud computing system 902 and system controller 906. In some embodiments, read/write manager 922 is configured to transmit and/or retrieve data to/from system controller 906 at one or more transmission times. Read/write manager 922 can receive the transmission times from scheduler 920 and may send a request to system controller 906 to retrieve the data from system controller 906 at the transmission times. In some embodiments, scheduler 920 is configured to generate the transmission times according to a schedule and provide read/write manager 922 with the transmission times. For example, scheduler 920 can use a schedule to generate daily transmission times (e.g., such that data is retrieved/written daily), hourly transmission times (e.g., such that data is retrieved/written hourly), weekly, monthly, etc. In some embodiments, the transmission times are at regular intervals. In some embodiments, the transmission times are irregular intervals (e.g., according to a schedule).

The schedule used by scheduler 920 to determine the transmission times for read/write manager 922 can be provided by a user (e.g., through a user interface) or can be predetermined. For example, the transmission times may be adjusted by a cloud computing system manager, a building manager, a technician, etc. In some embodiments, the transmission times and/or the schedule that scheduler 920 uses to determine the transmission times is pre-programmed based on a frequency of how often site system 904 requires control decisions. For example, the transmission times may be daily, hourly, weekly, bi-daily, etc., depending on how often site system 904 should receive control decisions. In some embodiments, the transmission times and/or the schedule are adjustable. For example, scheduler 920 can adjust the transmission times based on operation of site system 904, based on weather forecasts, etc. In a further example, if cloud computing system 902 receives data from site system 904 indicating that equipment 910 is consuming an excessive amount of power (e.g., power consumption greater than some threshold level), scheduler 920 can adjust the transmission times such that the transmission times occur more frequently.

In some embodiments, read/write manager 922 is configured to provide any of the data received from system controller 906 to automatic commissioner 924. Automatic commissioner 924 is configured to generate and/or update site model 918. In some embodiments, read/write manager 922 is configured to receive one or more resource description framework (RDF) files from system controller 906.

Figure 10B:
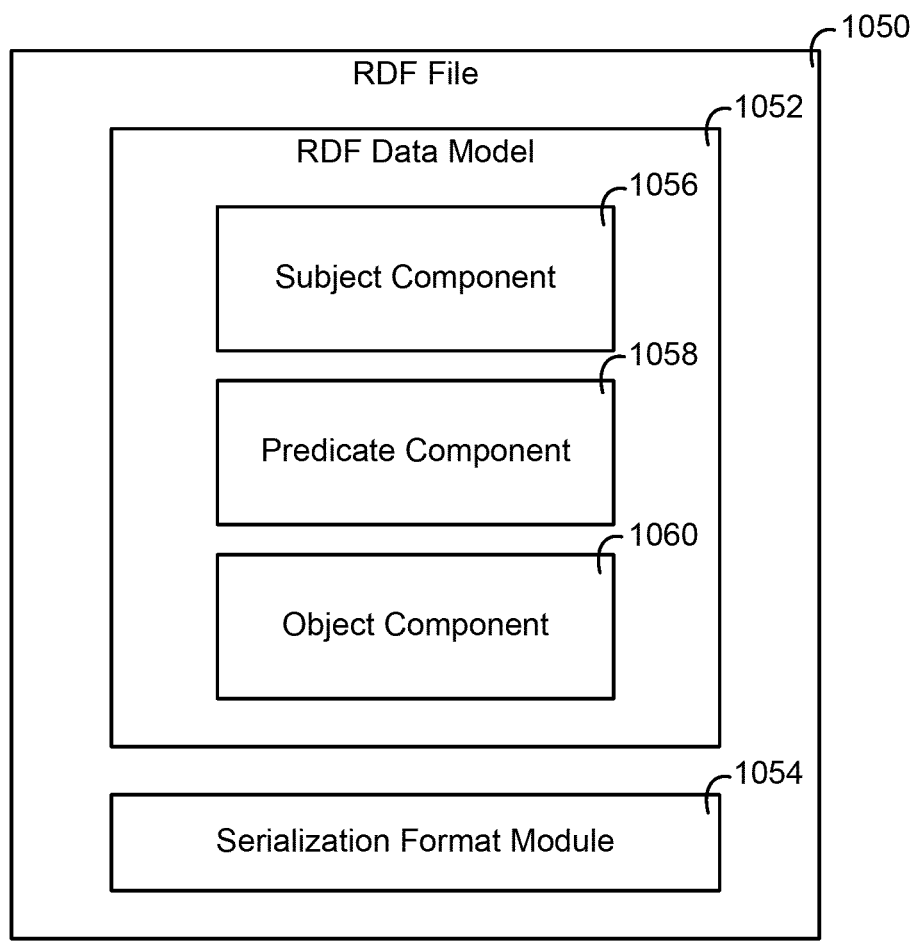
FIG. 10B is a block diagram of a resource description framework (RDF) file that can be used to model the VRF system of FIG. 6, according to an exemplary embodiment.

Referring now to FIG. 10B, an RDF file 1050 is shown, according to exemplary embodiments. In some embodiments, RDF file 1050 is configured to provide modeling data of a VRF system (e.g., VRF system 600, VRF system 800, etc.) to cloud computing system 902. RDF file 1050 is shown to include RDF data model 1052 and serialization format module 1054.

RDF data model 1052 may be configured to provide statements about resources (e.g., web resources) in expressions of the form "subject-predicate-object," described herein as triples. RDF data model 1052 is shown to include subject component 1056, predicate component 1058, and object component 1060. In some embodiments, subject component 1056 denotes the resource, predicate component 1058 denotes the traits or aspects of the resource, and object component 1060 denotes the item in which subject component 1056 has a relationship with. For example, RDF file 1050 may provide modeling information about the color of the sky. RDF data model 1052 includes a triplet with the subject denoting "the sky," the predicate denoting "has the color," and an object denoting "blue."

Serialization format module 1054 may be configured to translate data into a format that can be stored (e.g., in a file, in a memory buffer, etc.) or transmitted and reconstructed later (e.g., on another processing device, etc.). In some embodiments, this process of abstract modeling (e.g., triples) allows for various encoding methods (e.g., various formatting) that can receive RDF files as long as the RDF files maintain triplet-based modeling.

In some embodiments, RDF file 1050 can include various relationships between equipment 910, as well as define various properties of equipment 910. For example, RDF file 1050 can define inter-relationships between equipment 910 such as:

ODU$_5$ serves IDU$_4$ which indicates that a particular outdoor unit (ODU, e.g., the fifth outdoor unit) serves a particular indoor unit (IDU, e.g., the fourth indoor unit). In some embodiments, RDF file 1050 includes various relationships between different subplants, sources, sinks, etc. More generally, the inter-relationships between equipment 910 can be defined as:

Equipment$_x$ serves Equipment$_y$ which indicates that a particular one of equipment 910 (e.g., equipment x) serves another particular one of equipment 910 (e.g., equipment y). In some embodiments, RDF file 1050 includes inter-relationships that indicate the particular resources (e.g., cooled air) that are provided between equipment 910.

RDF file 1050 can also include a second type of data, namely, what parameters or variables correspond to each equipment 910. For example, the RDF file 1050 received by read/write manager 922 from system controller 906 can include definitions of what types of variables correspond to a particular device or a particular one of equipment 910. For example, RDF file 1050 can include:

IDU$_4$ has T$_{zone}$ which specifies that a particular IDU (e.g., the fourth IDU) has an associated zone temperature. More generally, the parameter definitions of each equipment 910 can be defined as:

Equipment$_x$ has [x$_1$ x$_2$ . . . x$_n$]

where x$_1$ . . . x$_n$ indicate different variables (e.g., supply air temperature, enable status, zone temperature, etc.) or operational parameters of the equipment x. In some embodiments, the variables indicate various parameters that can be sensed, read, obtained, received, etc., from equipment 910 and/or from sensors 911 of site system 904 for each equipment 910. In some embodiments, the variables are used by cloud computing system 902 in various optimization algorithms.

Read/write manager 922 can also be configured to retrieve values of the various variables of equipment 910 from site system 904. For example, system controller 906 can receive values of the variables (e.g., sensor values of the supply air temperature, sensor values of the return air temperature, efficiency, etc.) from sensors 911 and/or from equipment controllers 908. In this way, RDF file 1050 can indicate a listing of variables that should be retrieved for each of equipment$_5$ 910, and an actual value of each of the variables can be retrieved from system controller 906 (e.g., as received from sensors 911, equipment controllers 908, etc.).

In some embodiments, RDF file 1050 can also include data in the form of triples. For example, the RDF file 1050 received by read/write manager 922 from system controller 906 can include the subject, predicate, and object elements of semantic data received. This data may be received by querying a database (e.g., located in site system 904, located externally, etc.) using RDF specifications, where the data is read/written in the form of triples. Various examples of querying, reading, and/or writing data under RDF specifications is described in greater detail below with reference to FIG. 11.

Referring now to FIG. 10C, an exemplary embodiment of code 1070 for RDF file 1050 is shown, according to exemplary embodiments. Code 1070 is separated into three sections of code per line, such that the sections of code correspond to an expression of a subject-predicate-object triplet. For example, on the first line of code 1070, the first section (left) (:00000000-0000-0000-0000-000000000001) represents the subject, the second section (middle) (jc: contains) represents the predicate, and the third section (right) (:00000000-0000-0000-0000-000000000002;) represents the object. In various embodiments, the subjects and objects may refer to various units (e.g., IDU's, ODU's,), subplants, or other HVAC devices described herein. Further exemplary embodiments of RDF code are described in greater detail below with reference to FIGS. 14-15.

Referring back to FIG. 10A, automatic commissioner 924 can receive RDF file 1050 that indicates the inter-relationships between equipment (e.g., between various assets of site system 904 or between equipment 910 of site system 904) as well as the parameter/variable definitions of each equipment 910 and generate site model 918 based on the inter-relationships and the parameter definitions. In some embodiments, automatic commissioner 924 constructs site model 918 and uses received values of the variables (e.g., the various parameters of site system 904) to instantiate, populate, etc., site model 918. In this way, site model 918 can include the inter-relationships between equipment 910 as well as actual values of the various parameters of site system 904 (e.g., supply air temperature, return air temperature, indoor air temperature, fan speed, etc.).

In some embodiments, automatic commissioner 924 is configured to update the values of the various parameters/variables of site model 918 in response to receiving new or updated data from read/write manager 922. For example, after read/write manager 922 retrieves the values of the variables, automatic commissioner 924 can update site model 918 with the newly retrieved values of the variables.

In some embodiments, executors 926 are configured to perform various optimization, cost analysis, system identification, power consumption prediction, etc., problems using site model 918. For example, an executor 926 may be configured to perform a system identification process to identify various thermodynamic properties or system parameters of site system 904. The thermodynamic properties can include various heat capacitances of site system 904 (e.g., of various zones, spaces, areas, etc., of site system 904, or of building 10 that equipment 910 serves), thermal resistances, etc. In some embodiments, the system identification process performed by executors 926 outputs a system identification model that expresses various zone temperatures as a function of heat input (e.g., heating) or heat removal (e.g., cooling) as provided by equipment 910. The system identification process can provide any of the parameters, system identification model, and/or the determined values of the parameters to site model 918. The model, parameters of the model, and values of the parameters of the model can be used in site model 918 to relate how building 10 reacts to heat input/heat output (e.g., to predict temperature of various zones of building 10 given particular heating/cooling loads).

For example, the system identification process may represent the various spaces, zones, areas, etc., of building 10 as a thermal circuit including various capacitors, resistors, etc., in series and/or parallel. In some embodiments, the system identification process performed by the corresponding one of executors 926 is the same as or similar to the system identification processes described in any of U.S. patent application Ser. No. 13/802,233, filed Mar. 13, 2013, now U.S. Pat. No. 9,235,657, U.S. patent application Ser. No. 14/970,187, filed Dec. 15, 2015, now U.S. Pat. No. 10,088,814, U.S. patent application Ser. No. 15/953,324, filed Apr. 13, 2018, U.S. patent application Ser. No. 15/900, 459, filed Feb. 20, 2018, U.S. patent application Ser. No.

16/040,698, filed Jul. 20, 2018, U.S. patent application Ser. No. 16/144,192, filed Sep. 27, 2018, U.S. patent application Ser. No. 16/240,028, filed Jan. 4, 2019, or U.S. patent application Ser. No. 16/447,724, filed Jun. 20, 2019, and/or U.S. patent application Ser. No. 16/513,054, filed Jul. 16, 2019, the entire disclosures of which are incorporated by reference herein.

Executors 926 can also be configured to perform various prediction and/or optimization processes to predict operational costs of site system 904 and/or to determine cost-effective control of equipment 910. In some embodiments, the output models and/or output data of executors 926 are provided to read/write manager 922, automatic commissioner 924, and/or site model 918. Read/write manager 922 can receive the output models and/or the output data of executors 926 and provide the output data and/or the output models to system controller 906. For example, read/write manager 922 can provide the control decisions as determined by executors 926 to system controller 906 so that equipment 910 can use the control decisions to operate. In some embodiments, automatic commissioner 924 uses the output data and/or the output models from executors 926 to update site model 918.

Figure 11:
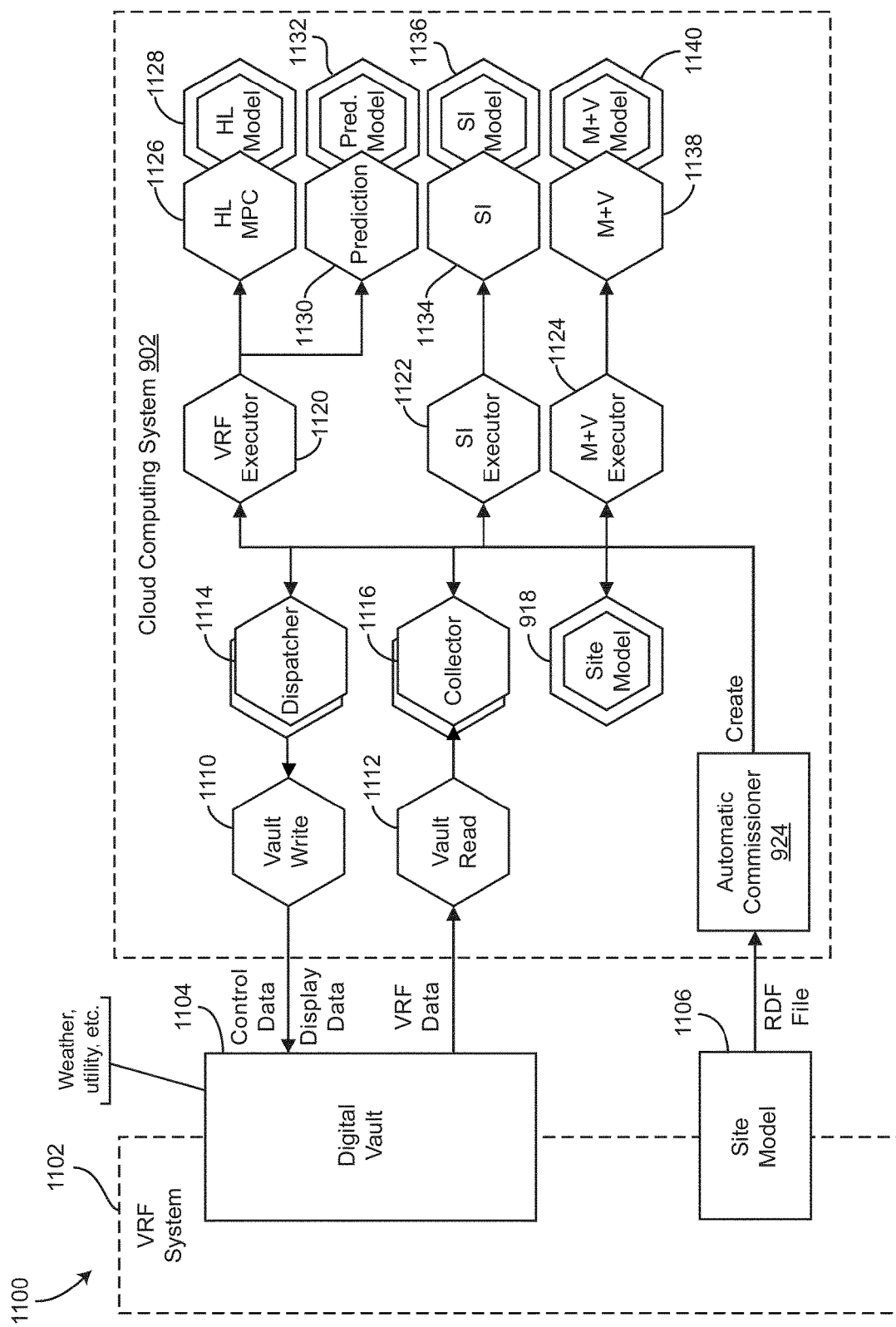
FIG. 11 is a block diagram of a cloud computing system for determining control decision for a variable refrigerant flow system, according to some embodiments.

Referring now to FIG. 11, a system 1100 shows how cloud computing system 902 can be configured to determine control decisions for a VRF system 1102, according to some embodiments. In some embodiments, VRF system 1102 is the same as or similar to any of VRF system 600, VRF system 800, or any other VRF system described herein. Automatic commissioner 924 is configured to read a site model 1106 from VRF system 1102, according to some embodiments. Site model 1106 may be located in memory in cloud computing system 902 as shown in FIG. 10A. Specifically, automatic commissioner 924 may be configured to receive one or more RDF files 1050 (e.g., some or all of site model 1106, etc.) from a system controller of VRF system 1102 (e.g., from system manager 502, control circuits 814 and 822, etc.), or from BMS controller 366. In other embodiments, processing circuitry within cloud computing system 902 generates site model 1106 and stores site model 1106 in memory 916 within cloud computing system 902 and is read (e.g., queried) via automatic commissioner 924.

As described in greater detail above with reference to FIG. 10A, site model 1106 may be received from VRF system 1102 and RDF file 1050 including information relating to site model 1106 can include various inter-relationships between various equipment of VRF system 1102 (e.g., between outdoor units 802 and indoor units 804) as well as parameter definitions of each equipment (e.g., specifying that each indoor unit has a supply air temperature, etc.). In some embodiments, automatic commissioner 924 is configured to receive site model 1106 and fully define site model 918 using site model 1106 (e.g., RDF file 1050) as well as the data received from digital vault 1104 as retrieved by collector 1116. Site model 918 may differ from site model 1106 in that it has been configured to be read and implemented by cloud computing system 902 to model and optimize the energy loads of building 10. Site model 918 may include the inter-relationships of the equipment of VRF system 1102, what types of parameters or variables are associated with each equipment of VRF system 1102, values of the parameters or the variables associated with each equipment of VRF system 1102, as well as additional data. The additional data can be any data (e.g., display data, optimization data, system identification parameters, etc.) that is not used by VRF system 1102 for control. For example, site model 918 can include additional data that is used by executors 1120-1124 (e.g., executors 926) to perform their respective functions that is not directly required by VRF system 1102 for operation (e.g., system identification parameters). Likewise, site model 918 can include data that may be displayed to an operator or user of VRF system 1102 (e.g., a building occupant) such as estimated cost, cost savings, power consumption, etc.

Automatic commissioner 924 is configured to receive one or more RDF files (e.g., RDF file 1050) from VRF system 1102 and generate or create site model 918 using the one or more RDF files, according to some embodiments. In some embodiments, site model 918 includes the inter-relationships and parameter definitions of VRF system 1102 (e.g., how the equipment of VRF system 1102 is inter-related as well as associated variables for each equipment) in addition to values of the various variables of VRF system 1102 (e.g., an actual value of the supply air temperature for a particular unit as measured by a corresponding sensor) to fully define site model 918. In some embodiments, site model 918 includes additional data that is displayed by a user interface at building 10 but not directly used for controlling VRF system 1102. In some embodiments, side model 918 includes additional data that is required by executors 926 to perform their respective functions, but is not necessarily provided on a user interface or used by VRF system 1102 during operation.

In some embodiments, the RDF file (e.g., RDF file 1050) includes keys associated with each data point of VRF system 1102 (e.g., a key or label associated with each of variables $x_1 \ldots x_n$). The RDF file can also include a point name (e.g., "supply air temp") and an indication of the equipment of VRF system 1102 to which the data point corresponds. The keys can be provided to automatic commissioner 924 and may be used by automatic commissioner 924 for retrieving or reading data from VRF system 1102. In some embodiments, automatic commissioner 924 provides the keys to site model 918 to establish a relationship or connection between a particular variable of site model 918 and a data point of digital vault 1104 such that values of the particular variable can be retrieved from digital vault 1104. In some embodiments, the RDF file includes a list of point types, keys, point names, etc., for each piece of equipment of VRF system 1102. The RDF file can include various equipment definitions (e.g., equipment objects) as described in greater detail in U.S. patent application Ser. No. 15/592,031, filed May 10, 2017, the entire description of which is incorporated by reference herein. In some embodiments, the RDF file includes standardized equipment models or equipment definitions that indicate relationships between the equipment, as well as corresponding variables and keys associated with the variables that can be used to retrieve values of the variables from digital vault 1104 or from VRF system 1102.

In this way, automatic commissioner 924 can use the RDF file (e.g., RDF file 1050) to identify a list of data points required for site model 918. Site model 918 and/or automatic commissioner 924 can generate a mapping between the list of data points required for site model 918 and specific data points in digital vault 1104. Site model 918 and/or automatic commissioner 924 can assign a particular key to a particular data point such that appropriate point data can be read from digital vault 1104 and so that values of specific parameters/variables of site model 918 can be retrieved by collector 1116 from digital vault 1104.

In order to fully define site model 918, cloud computing system 902 may read values of the various data points from digital vault 1104, or directly from VRF system 1102. In some embodiments, digital vault 1104 is another cloud computing system that is configured to wired and/or wirelessly communicate with VRF system 1102 to retrieve all available data points. Cloud computing system 902 can include a collector 1116 and a dispatcher 1114 configured to facilitate communications between cloud computing system 902 and digital vault 1104. In some embodiments, collector 1116 is configured to perform a vault read operation 1112 to retrieve point data from digital vault 1104 so that site model 918 can be fully defined. In some embodiments, dispatcher 1114 is configured to perform a vault write operation 1110 to provide various outputs of executors 1120-1124 (e.g., executors 926) to digital vault 1104 (e.g., to provide control data, display data, etc.).

Still referring to FIG. 11, cloud computing system 902 can include a VRF executor 1120, a system identification (SI) executor 1122, and an M+V executor 1124. VRF executor 1120, SI executor 1122, and M+V executor 1124 can use site model 918 in their respective optimization or calculations to generate their respective outputs. In some embodiments, VRF executor 1120 is configured to perform MPC and/or to generate control decisions (e.g., to generate setpoints for the various equipment of VRF system 1102). VRF executor 1120 is configured to use site model 918 (including data retrieved by collector 1116 as well as additional data stored in site model 918 that is required by VRF executor 1120) to perform its respective optimization and output (or generate) high-level MPC control decisions 1126 (e.g., various setpoint values for equipment of VRF system 1102), as well as an HL model 1128 used to generate MPC control decisions 1126. In some embodiments, VRF executor 1120 is configured to perform any of the functionality of central plant controller 600 and/or asset allocator 1850 of U.S. patent application Ser. No. 15/473,496, filed Mar. 29, 2017, the entire disclosure of which is incorporated by reference herein. VRF executor 1120 can also predict various energy (e.g., thermal energy loads) of a building (e.g., building 10) that VRF system 1102 serves. In some embodiments, VRF executor 1120 outputs energy load prediction 1130 and a predictive model 1132 used to determine the energy load prediction 1130.

In some embodiments, SI executor 1122 is configured to perform an SI process using site model 918 to generate or output SI parameters 1134 and an SI model 1136. SI parameters 1134 can be values of various variables and/or parameters that are used in SI model 1136 to model, predict, or otherwise characterize a thermal response of the building or various zones of the building that VRF system 1102 serves. For example, SI parameters 1134 can be various values of thermal resistance, thermal capacitance, etc., of a thermal circuit that models a temperature of a zone or space of the building that VRF system 1102 serves as a function of heating and/or cooling (e.g., heat provided by or heat removed by VRF system 1102). In some embodiments, SI executor 1122 is configured to perform an SI process that is the same as or similar to the SI processes described in any of U.S. patent application Ser. No. 13/802,233, filed Mar. 13, 2013, now U.S. Pat. No. 9,235,657, U.S. patent application Ser. No. 14/970,187, filed Dec. 15, 2015, now U.S. Pat. No. 10,088,814, U.S. patent application Ser. No. 15/953,324, filed Apr. 13, 2018, U.S. patent application Ser. No. 15/900,459, filed Feb. 20, 2018, U.S. patent application Ser. No. 16/040,698, filed Jul. 20, 2018, U.S. patent application Ser. No. 16/144,192, filed Sep. 27, 2018, U.S. patent application Ser. No. 16/240,028, filed Jan. 4, 2019, or U.S. patent application Ser. No. 16/447,724, filed Jun. 20, 2019, and/or U.S. patent application Ser. No. 16/513,054, filed Jul. 16, 2019, the entire disclosures of which are incorporated by reference herein.

Figure 12:
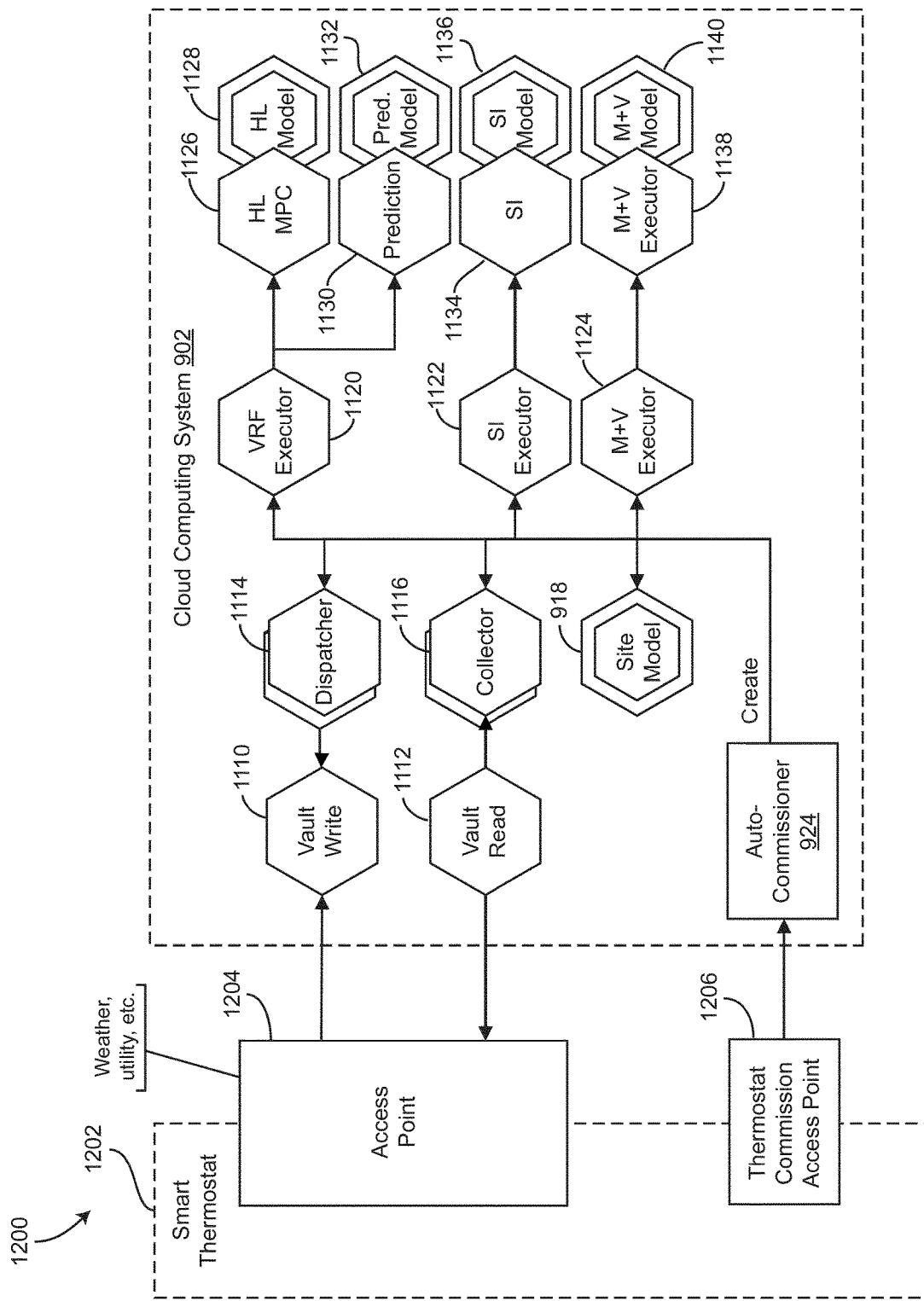
FIG. 12 is a block diagram of a cloud computing system for determining control decisions for a smart thermostat, according to some embodiments.

Referring now to FIG. 12, cloud computing system 902 may also be configured for use with a smart thermostat 1202 as shown in smart thermostat system 1200. Smart thermostat 1202 may be positioned locally at a location of a building (e.g., building 10) and can be configured to communicate (e.g., wirelessly) with cloud computing system 902 via an access point 1204 (e.g., a cellular dongle, a wireless transceiver, etc.). In some embodiments, access point 1204 is configured to communicate with the vault write operation 1110 and the vault read operation 1112 of cloud computing system 902. Likewise, automatic commissioner 924 may be configured to communicate with a thermostat commission access point 1206 of smart thermostat 1202. In this way, smart thermostat 1202 may provide cloud computing system 902 with various information, and cloud computing system 902 may perform its respective functions (e.g., executors 1120-1124). Smart thermostat 1202 may be similar to smart thermostats described in U.S. patent application Ser. No. 15/953,162 filed Apr. 13, 2018, the entire disclosure of which is incorporated by reference herein. Various examples of cloud computing system 902 configuring smart thermostat 1202 with cloud computing system 902 are described in greater detail below with reference to FIG. 17.

A3S Platform Overview

Figure 13:
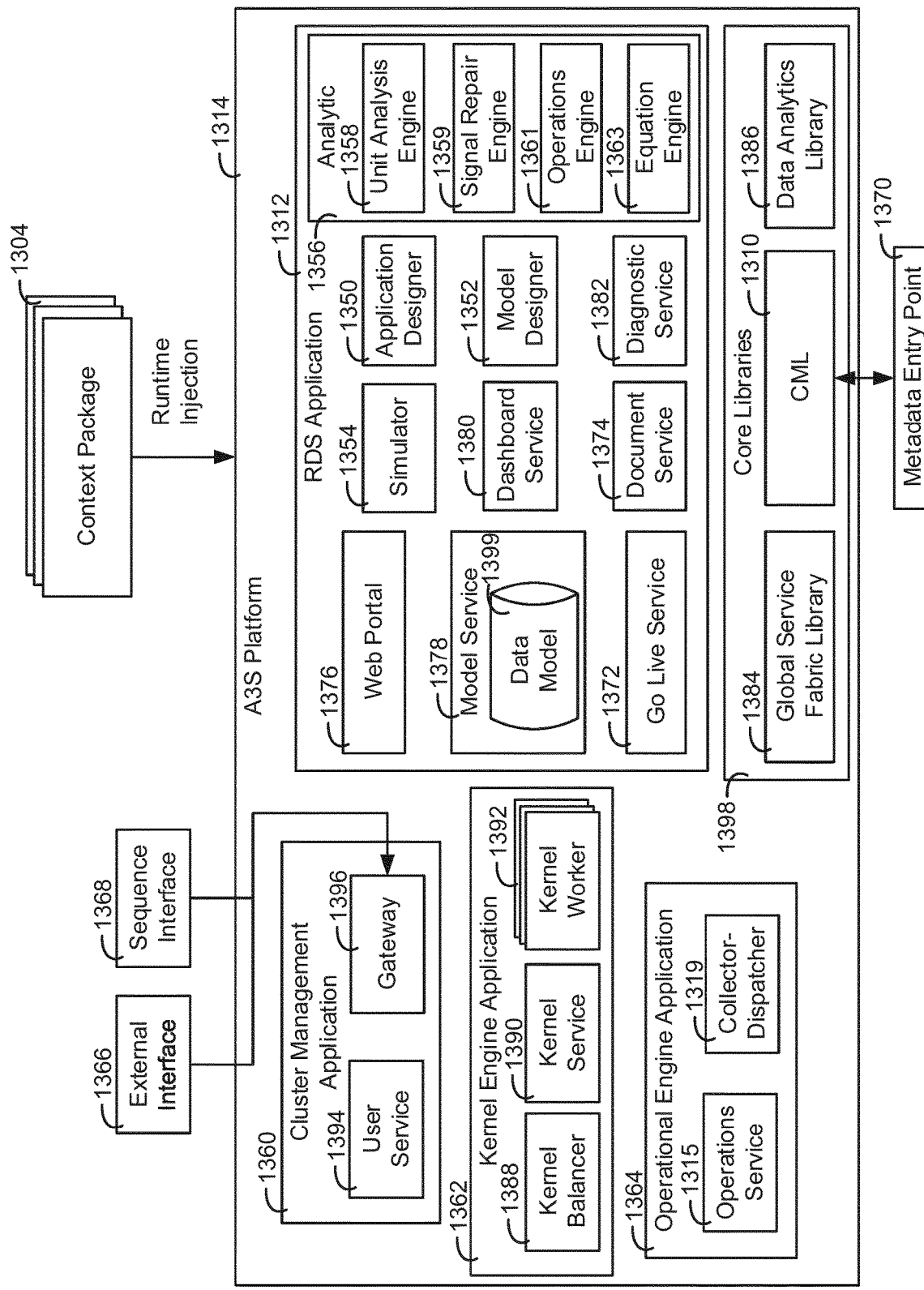
FIG. 13 is a block diagram of a cloud computing system, according to some embodiments.

Referring now to FIG. 13, cloud computing system 902 may be performed by an A3S (e.g., algorithms as a service) platform 1314 and include a rapid deployment suite (RDS) application 1312 which are shown in greater detail, according to an exemplary embodiment. A3S platform 1314 may be a dynamically updatable platform that can receive metadata based updates from packages that it receives, the packages including the context 1304. A3S platform 1314 and the various components of A3S platform 1314 shown in FIG. 13 and described herein can be implemented as microservices on various computing devices (e.g., cloud servers, desktop computers, data centers, etc.). A3S platform 1314 can be implemented with MICROSOFT® Service Fabric. MICROSOFT® Service Fabric is described with further reference to FIG. 15 and elsewhere herein. A3S platform 1314 can be implemented on one or more processing circuits (e.g., a processor and memory device) such as processing circuit 404 of BMS controller 366. However, A3S platform 1314 can be implemented in any cloud computing system, a data center, one or more desktop computers, a building server, a private cloud, a public cloud, etc.

A3S platform 1314 is shown to include a cluster management application 1360, RDS application 1312, kernel engine application 1362, operational engine application 1364, and core libraries 1398. Cluster management application 1360 can be configured to provide external interactivity for an A3S cluster including user accounts and gateway services. A cluster may be a specific implementation of A3S platform 1314 and/or particular services of A3S platform 1314. Multiple A3S platforms 1314 and/or services of A3S platforms 1314 can be deployed as clusters in a private cloud, a desktop computer, a public cloud, etc., all of which can work together to provide controls for a building (e.g., building 10) and/or facility.

Cluster management application 1360 is shown to include a user service 1394 and a gateway 1396. User service 1394 can be a microservice configured to provide the ability for A3S platform 1314 to identify a user whether identified through gateway 1396 or a built in user interface (UI). User service 1394 can be configured to provide users with login tokens, verify passwords, and/or otherwise manage user accounts and allow a user to access A3S platform 1314. Gateway 1396 can be configured to route data between A3S platform 1314 to an external user device. Gateway 1396 can provide an API (e.g., external interface 1366) for external systems to connect into. A developer can use external interface 1366 to connect to A3S platform 1314 through gateway 1396.

Kernel engine application 1362 can be configured to manage distributed execution of the algorithms deployed into A3S platform 1314 across various available clusters. Kernel engine application 1362 can be configured to distribute computing jobs among various clusters to optimize execution of the algorithms and can be further configured to recover computing algorithms in response to a computing cluster crash. These techniques, hybrid cluster optimization and hybrid disaster recovery, are described with further reference to FIGS. 20-23. Hybrid cluster optimization can optimize the use of externally available resources to reduce the cost of deployment and execution of the algorithms.

The kernel balancer 1388 can be configured to balance kernel execution for A3S platform 1314. Kernel balancer 1388 can be configured to upload jobs into reliable storage, queue jobs, and balance jobs among various kernel services 1390 running in various A3S platform 1314 clusters. Kernel service 1390 can be configured to execute a kernel and can be a microservice deployed in the cloud, in a data center, on one or more desktops, etc. In some embodiments, kernel balancer 1388 can be configured to manage kernel execution using a cost function.

Kernel service 1390 can be configured to manage kernel execution processes (e.g., the kernel workers 1392). In response to receiving a job from kernel balancer 1388, kernel service 1390 can be configured to scan kernel workers 1392 it has alive for any that are free and pass the job into kernel worker 1392 using named data pipes. If active jobs exist on all active kernels workers 1392, kernel service 1390 can be configured to create a new process (i.e., create a new kernel worker 1392). During the execution of the job on kernel worker 1392, kernel worker 1392 can be configured to return progress updates and errors back through the named data pipe. Once received, kernel service 1390 can be configured to forward a notification back to kernel balancer 1388.

Operational engine application 1364 can be configured to provide the A3S implementation of a sequence engine, a system that provides caching and algorithm execution of closed loop control. Operational engine application 1364 can maintain snapshots of raw data flowing on the target platform to ensure algorithms performance requirements are achieved. Operational engine application 1364 is shown to include operations service 1315 and collector-dispatcher 1319. Operations service 1315 can be configured to collect data from kernel worker 1392 and provide the collected data to collector-dispatcher 1319 to execute control of building equipment. Similarly, the data that collector-dispatcher 1319 collects from the building equipment can be provided to kernel worker 1392 via operations service 1315.

RDS application 1312 can be configured to provide the user experience for the users of A3S's various target uses: deployment configuration, commissioning, creating generic live dashboards, editing deployed context model, maintaining and diagnosing live executions, simulating, monitoring, etc. RDS application 1312 is shown to include a web portal 1376, a model service 1378, a simulator 1354, an analytic 1356, an application designer 1350, a dashboard service 1380, a diagnostic service 1382, a go live service 1372, a document service 1374, and a model designer 1352.

Web portal 1376 can be configured to provide one or more web interfaces to a user for accessing A3S platform 1314. Web portal 1376 can be configured to allow a user to enter data into A3S platform 1314 (e.g., add context package 1304, etc.), view system information, and other interface based features for RDS application 1312.

Model service 1378 can be configured to receive context package 1304 and generate the data model 1399. In some embodiments, data model 1399 is the implementation of the metadata of context package 1304. Specifically, data model 1399 may be a data model of a building (e.g., building 10) and/or equipment for the building that is implemented based on the CML 1310. Specifically, context package 1304 may reference the various classes and the class structure of CML 1310. Therefore, model service 1378 can be configured to implement data model 1399 with context package 1304 and the prototype, entity, and attribute class structure of CML 1310. This class structure is described with reference to FIG. 13 and elsewhere herein.

Simulator 1354 can be configured to run an active data model (e.g., data model 1399) to provide experimental comparisons for testing algorithms against data model 1399. In some cases, a developer builds a model, edits the model's data, solves the model against some settings, analyzes results, and continues to edit the model, solve the model, and analyze the results until satisfied with the model. However, simulator 1354 enables a developer to test their algorithms against the current data model 1399 of A3S platform 1314. Simulator 1354 is described with greater detail to FIG. 13 and elsewhere herein.

Analytic 1356 can be an engine that implements a scripting language that combines equations with actions implemented by a caller. Analytic 1356 can include various engines that it uses to operate. These engines may be the unit analysis engine 1358, the signal repair engine 1359, the operations engine 1361, and the equation engine 1363.

Unit analysis engine 1358 can be configured to provide a user with mathematical unit verification. In some embodiments, unit analysis engine 1358 can track units in a script or otherwise in the code of A3S platform 1314 by mapping a user defined unit into a standard unit and verifying that a unit result for an operation matches an expected unit. Signal repair engine 1359 can be configured to perform signal repair on various data sequences (e.g., time series data). Signal repair engine 1359 can be configured to perform interpolation and/or generate infinite resolution signals based on data sequences.

Operations engine 1361 may include various operations for execution for analytic 1356. The operations executed by operations engine 1361 can be timeseries executions, discrete data point execution, etc. These operations may be conventional operations or can be custom defined operations. The operations may be operations such as the operations found in FIGS. 9A and 9B of U.S. patent application Ser. No. 15/409,489 filed Jan. 18, 2017, the entirety of which is incorporated by reference herein. Equation engine 1363 can be configured to perform various operations based on the operations of a user defined script. Equation engine 1363 can be configured to break a sequence of script operations down into individual operations and generate an appropriate order for the execution of the operations.

Application designer 1350 can be configured to generate interfaces for displaying information of data model 1399 to a user. Application designer 1350 can be configured to receive user-uploaded scalable vector graphics (SVGs) that a user can generate via an illustration platform (e.g., ADOBE ILLUSTRATOR®, Inkscape®, Gimp, etc.). An SVG may be an XML-based vector image format for two-dimensional graphics that supports user interaction and animation. Based on the user uploaded SVGs, a user can bind the SVGs to widgets, include data points in the widgets, and display the widgets in various interface pages. The widgets may update their data points based on a link generated by a user between data model 1399 and the widget. FIGS. 14A and FIG. 14B provide an example of creating a widget and a widget displayed on a page that application designer 1350 can be configured to generate.

Dashboard service 1380 can be configured to provide a user with a dashboard of their building (e.g., building 10) or facility. For example, a dashboard that can be hosted by dashboard service 1380 is the interface 1400B. The interfaces that dashboard service 1380 can be configured to host can be interfaces that include widgets generated by application designer 1350.

Diagnostic service 1382 can be configured to enable administrators of A3S platform 1314 to have full views of their models for editing and overrides. This view essentially is the show all version of model designer 1352 without the ability to edit the configuration of connections or hierarchy. Via diagnostic service 1382, the administrator may commission data to the system not otherwise available from a custom app. It shows the current data, whenever requested, of data model 1399 within the real-time system.

Go live service 1372, also referred to as the configuration tool herein, enables a user to bring the model they've created to a live system. Go live service 1372 reduces the required user efforts necessary to go live by reducing the number of steps to cause a system to "go live," i.e., begin operating. Causing a system to go live may include defining input definitions, input analytics, output definitions, output analytics, sequence settings, and system settings.

The first four steps surround input and output definitions. The user, when taking a design live, must specify the intersection between the points within the site and points within the data model for the algorithm they choose to run. If points do not exist or map one to one, the user can use analytic 1356 to bridge the gap. In some embodiments, Johnson Controls (JCI) Logic Connector Tool (LCT) based logic covers this use case on sites. In RDS application 1312, analytic 1356 may not use a graphical approach and instead use a scripting language to cover this use case. In analytic 1356, the user can map filtered points or averages to single points within data model 1399.

Moreover, on output they may infer points in the site using many points within data model 1399. Once inputs and outputs exist, the user then simply must specify network settings, and custom options for the sequences provided by CML 1310. Once done, the system links into A3S platform 1314 and starts execution.

Document service 1374 can be configured to generate documentation for data model 1399. The document generated by document service 1374 can illustrate various data points, descriptions of the data points, units for the data points, and/or any other information for data model 1399. A user can view the documents generated by document service 1374 as a reference for updating and/or generating a new context package 1304.

Model designer 1352 can be configured to provide a user with interfaces for generating and/or updating context package 1304. Model designer 1352 can be configured to allow a user to select between various models (e.g., data model 1399) and edit the model to change or add various pieces of equipment in the building (e.g., building 10) or other information pertaining to the building. Model designer 1352 is described with further reference to FIG. 13.

Context package 1304, as described with further reference to FIG. 13, can be a data package containing the implemented classes reliant on CML 1310 that can be rendered by A3S platform 1314. Context package 1304 can be metadata that can be used with CML 1310 to implement a data model (e.g., data model 1399). Data model 1399 can then be used to control various facilities (e.g., building equipment). CML 1310 and the class structure of CML 1310 that can be used to implement context package 1304 as a data model is described with further reference to FIG. 13.

A3S platform 1314 may include various client integration points. These integration points may include the external interface 1366, the sequence interface 1368, and the metadata entry point 1370. External interface 1366 can be configured to provide a REST/WCF style communication that services external to A3S platform 1314. This includes any written "ports" that are used by target platforms to interact with A3S platform 1314.

Sequence interface 1368 can be configured to implement gateway 1396 into A3S platform 1314 that a sequencer can use to drive close loop control calculations. Metadata entry point 1370 may be a developer backdoor. Metadata entry point 1370 can be found from CML library 1310 in classes, providing the user with the ability to extract the metadata from the supplied context and reformat it into the user's choice architecture.

Core libraries 1398 can be various code libraries configured to enable the execution of A3S platform 1314. Core libraries 1398 are shown to include a global service fabric library 1384, a CML 1310, and a data analytics library 1386. Global service fabric library 1384 may be a library allowing A3S platform 1314 to implement A3S platform 1314 and/or the various components and services of A3S platform 1314 as microservices. Implementing A3S platform 1314 and its various components and services as microservices may include deploying A3S platform 1314 via MICROSOFT® Service Fabric, which global service fabric library 1384 may enable. Global service fabric library 1384 may include one or more libraries enabling A3S platform 1314 to be implemented as a microservice (e.g., MICROSOFT® Service Fabric).

Auto-Commission Processes

Figure 14:
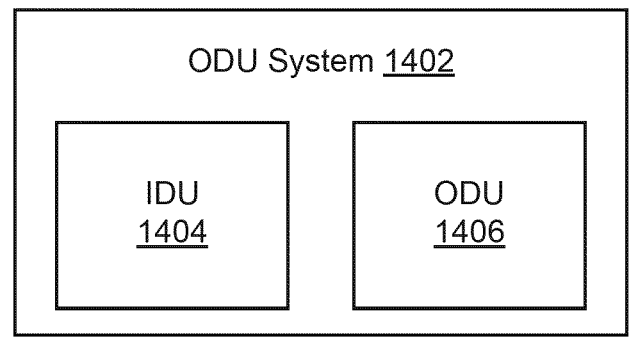
FIG. 14 is a block diagram of an outdoor unit model, which can be used in the system of FIG. 13, according to some embodiments.
Figure 15:
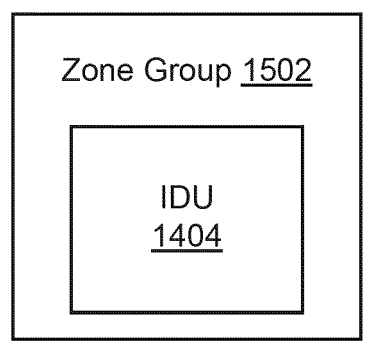
FIG. 15 is a block diagram zone group model, which can be used in the system of FIG. 13, according to some embodiments.
Figure 16:
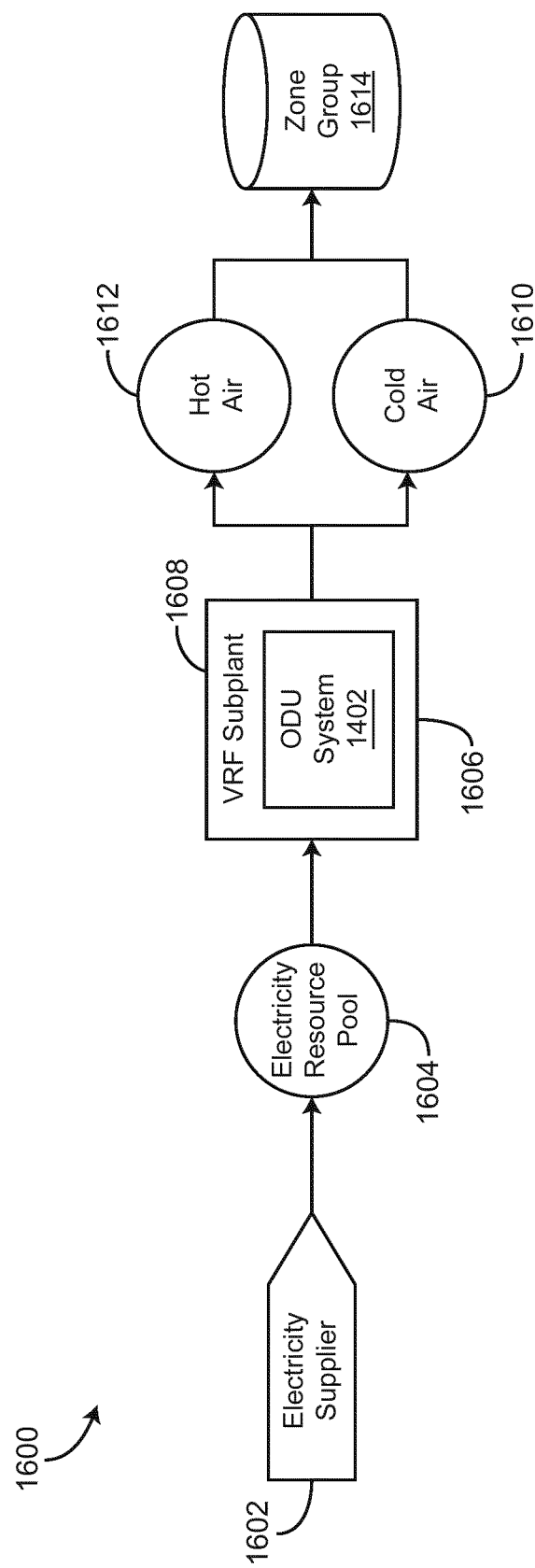
FIG. 16 is a block diagram of a site model, which can be used in the system of FIG. 13, according to some embodiments.

Referring now to FIGS. 14-16, exemplary embodiments of auto-commissioning a VRF system with a cloud computing system is shown, according to exemplary embodiments. In some embodiments, the systems and methods disclosed in FIGS. 14-16 may be used in the system 1100 as shown above with reference to FIG. 11. Referring particularly to FIG. 14, FIG. 14 shows outdoor unit (ODU) system 1402. ODU system 1402 as described herein, may refer to one or more ODUs and one or more indoor units (IDUs) served by those ODUs. In some embodiments, the ODUs may be located outside the building (e.g., building 10) and the IDUs served by those ODUs may be located within the building (e.g., distributed throughout the building). ODU system 1402 is shown to include indoor unit (IDU) 1404 and ODU 1406. FIG. 14 shows a block diagram of ODU system 1402 that may be queried from VRF system 1102.

For example, site model 1106 can be generated based on several queries made to one or more servers. The servers may be located on premise (e.g., at the location of building 10) or within cloud computing system 902. Site model 1106 may be generated by processing circuitry located in cloud computing system 902 (e.g., automatic commissioner 924).

In the above example, a first query is made to a VRF system (e.g., VRF system 600, etc.) to acquire information on the various ODU systems that include one or more ODUs and the corresponding IDUs served by those ODUs. In a more specific example, automatic commissioner 924 queries a server with site information on VRF system 600 to determine the various units (e.g., ODU's, IDU's etc.) located within VRF system 600. Automatic commissioner 924 determines that VRF system 600 includes an ODU system 1402. Automatic commissioner 924 further determines that IDU 1404 and ODU 1406 are located within ODU system 1402. An example of this querying process written in SPARQL Protocol and RDF Query Language (SPARQL) is shown below:

```
PREFIX rdf: <http://www.w3.org/1999/02/22-rdf-syntax-ns#>
PREFIX rdfs: <http://www.w3.org/2000/01/rdf-schema#>
PREFIX jc: <http://ontologies.jci.com/core#>
PREFIX vrf: <http://ontologies.jci.com/vrf#>
SELECT ?OduSystemId ?OduId ?IduId
WHERE
{
  ?IduId rdf:type vrf:VRF_Indoor_Unit .
  ?IduId jc:equipmentIsFedBy ?OduSystemId .
  ?OduSystemId jc:contains ?OduId .
  ?OduSystemId rdf:type vrf:VRF_ODU_SYSTEM .
  ?OduId rdf:type vrf:VRF_Outdoor_Unit .
}
```

In some embodiments, the prefixes include definitions for keywords seen in the query, such as "rdf:type." In some embodiments, variables such as "?OduSystemId ?OduId ?IduId" are selected from the query.

Automatic commissioner 924 may then perform an additional query to find various zone groups located within VRF system 600. For example, automatic commissioner 924 may query and determine that the top-left IDU 604 as shown in FIG. 6 and ODU 602 are located within zone A. Another exemplary embodiment is shown in FIG. 15, wherein zone group 1502 includes IDU 1404. An example of this querying process written in SPARQL is shown below:

```
PREFIX rdf: <http://www.w3.org/1999/02/22-rdf-syntax-ns#>
PREFIX rdfs: <http://www.w3.org/2000/01/rdf-schema#>
PREFIX jc: <http://ontologies.jci.com/core#>
PREFIX vrf: <http://ontologies.jci.com/vrf#>
SELECT ?ZGName ?ZGId ?EquipName
WHERE
{
  ?ZGId rdf:type vrf:Zone_Group .
  ?ZGId rdfs:label ?ZGName .
  ?ZGId jc:contains ?Zones .
  ?Zones rdf:type jc:space .
  ?Zones jc:spaceIsFedBy ?EquipId .
  ?EquipId rdfs:label ?EquipName .
}
```

In some embodiments, the information obtained from the one or more queries, combined with information related to the operating parameters of the equipment (e.g., power output of IDU's, etc.) may allow site model 1106 to be generated. Various subplants (e.g., heater subplant, heat recovery chiller subplant, chiller subplant, cooling tower subplant, etc.) within building 10 may serve one or more zone groups. This may be based on the overlap of the IDU's. For example, IDU 1404 is located within zone group 1502 as shown in FIG. 15, and IDU 1404 is located in ODU system 1402 as shown in FIG. 14. This information allows a site model generator (e.g., auto-commissioner 924, etc.) to determine a process for serving zone groups based on IDU, ODU, zone group, and subplant information. An exemplary embodiment of this process is shown below with reference to FIG. 16.

In some embodiments, the site model (e.g., site model 918, etc.) can be generated by any processing circuity capable of generating a model, such as circuitry within executors 926 and/or digital vault 1104, and is not limited to automatic commissioner 924. In some embodiments, the various ODUs and IDUs disclosed herein may be substantially similar to other ODU's and IDU's disclosed herein, respectively.

In some embodiments, the querying process may be performed under resource description framework (RDF) specifications, as described above. For example, a site model generator (e.g., auto commissioner 924, etc.) may provide SPARQL-formatted instructions to query VRF information in triples, such as the subject, predicate, and object of data objects. Various querying languages may be used and the process for querying information to generate a site model is not limited to SPARQL. Additionally, data-interchange formats (e.g., JSON, XML, etc.) may be used instead to receive site information, as shown in a below example with reference to FIG. 17.

In some embodiments, the site information can be non-physical (e.g., a virtual point). For example, site information is queried that includes user settings and/or algorithms associated with the queried site.

Referring now to FIG. 16, model 1600 of a site model generated by auto commissioner 924 is shown, according to exemplary embodiments. Model 1600 is shown to include electricity supplier 1602, electricity resource pool 1604, VRF subplant 1608, hot air 1612, cold air 1610, and zone group 1614. Model 1600 may be an example of site model 918 configured by auto commissioner 924.

Electricity supplier 1602 may act as any type of utility provider capable of providing electricity to building 10. Electricity resource pool 1604 may be configured to store electrical power (e.g., in one or more batteries, etc.). In some embodiments, electricity resource pool 1604 may simply act as a facilitator for providing power to VRF subplant 1608 from an electrical supplier. For example, electricity resource pool 1604 may be a power line or one or more transmission lines. Various other resource pools described herein (e.g., natural gas resource pool 1706, electricity resource pool 1708, etc.) may similarly act as facilitators for supplying various subplants with the appropriate resource from the utility providers. VRF subplant 1608 may be identical or substantially similar to VRF system 600 and is shown to include ODU system 1402. The configuration of VRF subplant 1608 and ODU system 1402 may act as another embodiment of the modeling process disclosed with reference to FIGS. 14-15. Cold air 1610 and hot air 1612 may be resource pools for providing cold air and hot air to a building zone, respectively. Zone group 1614 may act as one of the several zone groups determined via a site model generator, as described above.

In a general embodiment, model 1600 is used to implement auto-configuration of a building site. During auto-configuration, a site model may be used that is based on the relationship information between various site entities (e.g., model 1600). Zone groups are found (e.g., queried) and populated with the IDU's they contain. Subplants are created around the ODU systems based on which zone groups they may serve. For example, if ODU system A and ODU system B were both serving equipment that supplies resources to zone group A, the a subplant will be created around ODU systems A and B. By generating a model that models the subplant level, zone group level, and unit level, that model can contain all of the necessary relations for implementation of optimization processes (e.g., model predictive control (MPC), cost estimation, etc.).

In some embodiments, auto commissioner 924 queries for points of the various entities (e.g., unites, subplants, etc.). Points, as described herein, may refer to attributes related to the entities (e.g., equipment type, operational parameters, etc.). Various points of equipment and zone groups may be read and, based on their type, may be automatically saved. Reading and saving points allow auto commissioner 924 to model the correct operating parameters with model 1600. For example, a point indicating the power output of IDU 1404 located within zone group 1502 may be read and presented in model 1600.

In some embodiments, executors within cloud computing system 902 (e.g., SI executor 1122, M+V executor 1124, etc.) are pre-configured to have a running period, but auto commissioner 924 is configured to manage the cluster load balance based on how may sites that auto commissioner 924 has configured. This may be accomplished by offsetting the runtime of the executors. Auto commissioner 924 may then enable the one or more executors.

In some embodiments, auto commissioner 924 will generate site model 918 by querying information on site system 904 in RDF format, to configure VRF system 1102. An exemplary embodiment of an RDF file for executing this process is shown below, such as code 1070 as shown in FIG. 10C and described above. In some embodiments code 1070 auto configures a VRF system using RDF specifications. The code may be separated into three distinct portions (e.g., "triples") which include a subject (left), predicate (middle), and object (right). In some embodiments, the querying process as shown above is implemented using RDF formatting. The model and/or RDF data (e.g., RDF files, etc.) may be used to integrate the "left side" of FIGS. 11-12 (e.g., VRF system 1102, smart thermostat 1202) which act as uncommissioned external systems or devices, with cloud computing system 902 such that cloud computing system 902 may utilize the site information for use in determining thermal energy usage for serving building 10. This may be performed via an asset allocator as described in greater detail below with reference to FIG. 18.

In some embodiments, auto commissioner 924 queries to find each ODU system (e.g., ODU system 1402) that contain IDU's and ODU's inside of it (e.g., IDU 1404 and ODU 1406), resulting in the creation of a single system. An exemplary embodiment of an RDF file for executing this process is shown below:

```
VRF SPARQL Queries
PREFIX rdf: <http://www.w3.org/1999/02/22-rdf-syntax-ns#>
PREFIX rdfs: <http://www.w3.org/2000/01/rdf-schema#>
PREFIX jc: <http://ontologies.jci.com/core#>
PREFIX vrf: <http://ontologies.jci.com/vrf#>
SELECT ?OduSystemId ?OduId ?IduId
WHERE
{
  ?IduId rdf:type vrf:VRF_Indoor_Unit .
  ?IduId jc:equipmentIsFedBy ?OduSystemId .
  ?OduSystemId jc:contains ?OduId .
  ?OduSystemId rdf:type vrf:VRF_ODU_SYSTEM .
  ?OduId rdf:type vrf:VRF_Outdoor_Unit .
}
```

In some embodiments, auto commissioner 924 may further query to find each zone group and which equipment is serving it. In the above example, only IDU 1404 is serving zone group 1502 by default, as IDU 1404 is the only IDU within ODU system 1402. In other embodiments, multiple pieces of equipment could serve one or more zone groups. An exemplary embodiment of an RDF file for executing a query to find each zone group and determine which equipment is serving it is shown below:

```
PREFIX rdf: <http://www.w3.org/1999/02/22-rdf-syntax-ns#>
PREFIX rdfs: <http://www.w3.org/2000/01/rdf-schema#>
PREFIX jc: <http://ontologies.jci.com/core#>
PREFIX vrf: <http://ontologies.jci.com/vrf#>
SELECT ?ZGName ?ZGId ?EquipName
WHERE
{
  ?ZGId rdf:type vrf:Zone_Group .
  ?ZGId rdfs:label ?ZGName .
  ?ZGId jc:contains ?Zones .
  ?Zones rdf:type jc:space .
  ?Zones jc:spaceIsFedBy ?EquipId .
  ?EquipId rdfs:label ?EquipName .
}
```

Regarding the above example, these two queries, and a priori information related to operational parameters of the equipment (e.g., ODU 1406, etc.) and resources utilized by the equipment, site model 918 may be produced. In some embodiments, which subplant is serving which zone group is based on the overlap of the IDU's (e.g., IDU 1404, etc.). In this example, IDU 1404 is in zone group 1502 and ODU system 1402, therefor IDU 1404 connects zone group 1502 to ODU system 1402. In another example, a second zone group (e.g., zone group B) contained another IDU (e.g., IDU B). Additionally, IDU B was part of ODU system 1402. Then, VRF subplant 1608 would be serving both zone group 1502 and zone group B.

Figure 17:
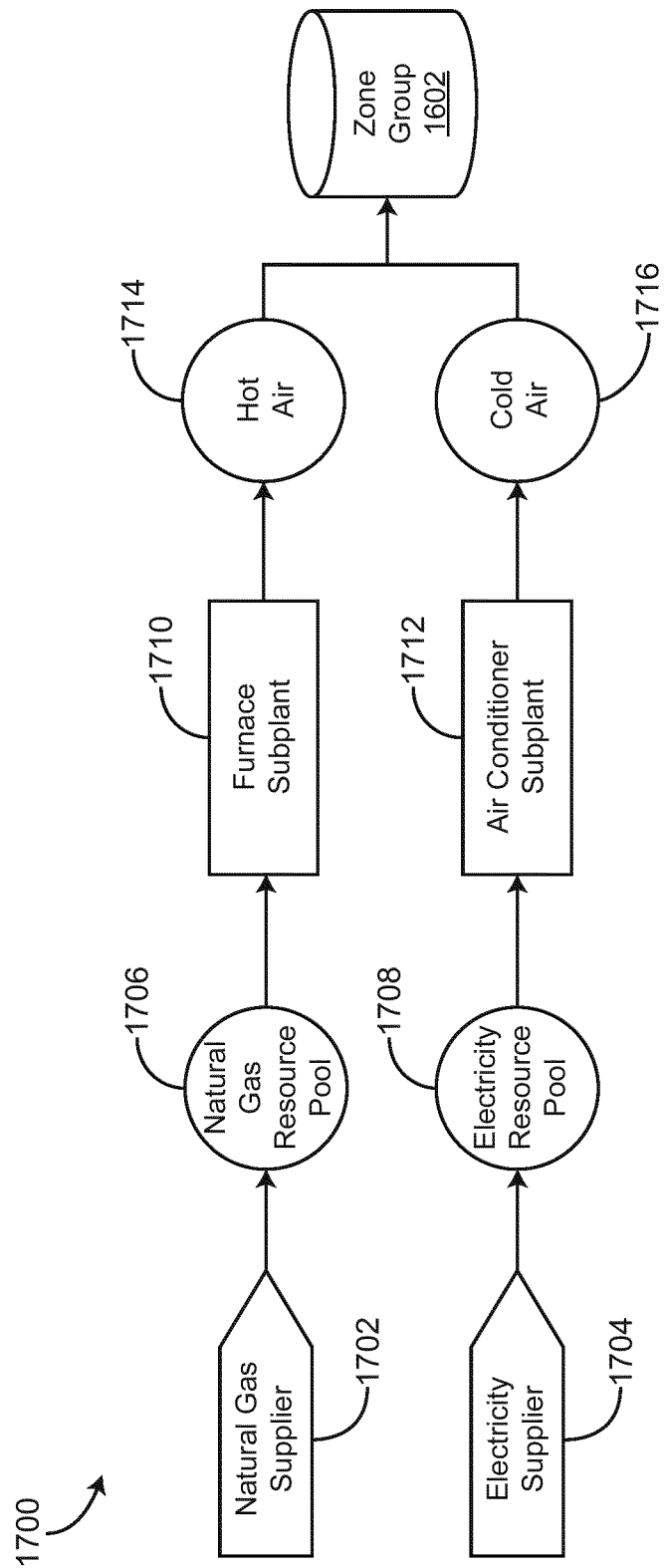
FIG. 17 is a block diagram of a site model, which can be used in the system of FIG. 13, according to some embodiments.

Referring now to FIG. 17, model 1700 of a site model generated by auto commissioner 924 is shown, according to exemplary embodiments. In some embodiments, model 1600 is used for auto-commissioning smart thermostat (e.g., smart thermostat 1202) with a cloud computing system (e.g., cloud computing system 902). Model 1700 is shown to include a natural gas supplier 1702, natural gas resource pool 1706, furnace subplant 1710, hot air 1714, electricity supplier 1704, electricity resource pool 1708, air conditioner subplant 1712, cold air 1716, and zone group 1602. Model 1700 may be generated by auto commissioner 924 as shown in FIG. 12.

In some embodiments, auto commissioner 924 is configured to configure a single entity rather than an entire system (e.g., VRF system 1200). An embodiment of this is shown in FIG. 12, where auto commissioner 924 receives smart thermostat information via thermostat commission access point 1206. With this functionality, the processing of auto commissioner 924 may be more straightforward, as it is only configured to commission a single thermostat or other piece of equipment. In some embodiments, auto commissioner 924 may configure several thermostats at once and provide details about which equipment is feeding which thermostats. An example process for auto-commissioning smart thermostat 1202 is shown below:

```
{
  "UserId": "00000000-0000-0000-0000-000000000001",
  "DeviceId": "GLASV1",
  "IsMpcEnabled": true,
  "CreatedDateTime": "0001-01-01T00:00:00",
```

-continued

```
    "ModifiedDateTime": "0001-01-01T00:00:00",
    "HeatingEquipmentType": {
        "Values": [ {
            "EquipmentFuelType": 1,
            "NumberOfStages": 1
        } ] },
    "CoolingEquipmentType": {
        "Values": [ {
            "EquipmentFuelType": 0,
            "NumberOfStages": 2
        } ] },
    "ZipCode": "12345"
}
```

In some embodiments, the "ID" information configures where data is to be read from and written to. In some embodiments, "EquipmentFuelType" configure what resource (e.g., electricity, natural gas, etc.) is used to provide heating or cooling. In some embodiments, "NumberofStages" configures how many equipment commands are to be read. In some embodiments, "ZipCode" configures time zone, weather information, or both for the auto configuration process. The above file may be formatted in a different data exchange medium than RDF, such as JSON, XML, YAML, Javascript, or others.

Asset Allocator Unifying System

Figure 18:
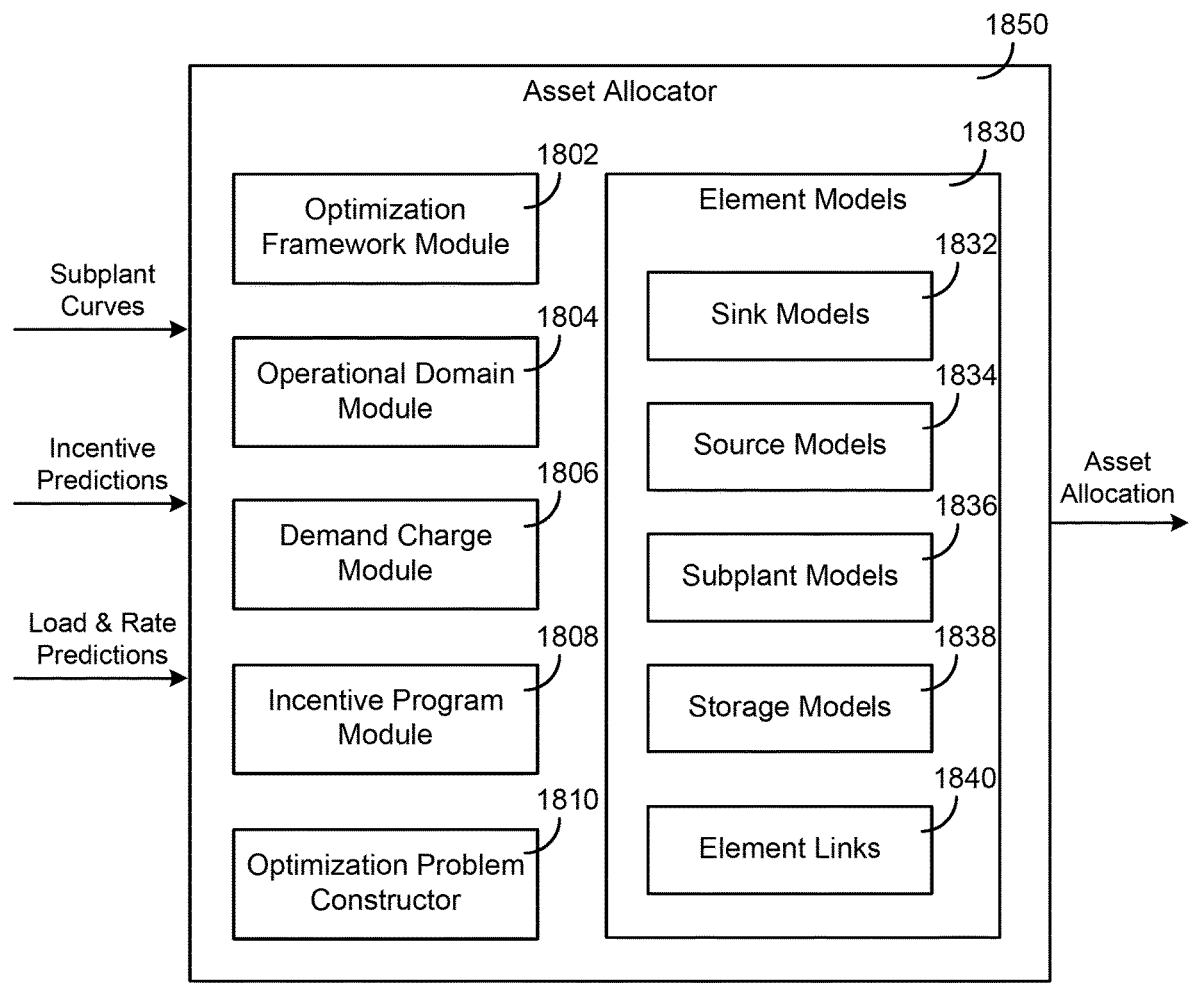
FIG. 18 is a block diagram of an asset allocator, which can be used in the BMS of FIG. 4, according to some embodiments.

Referring now to FIG. 18, a block diagram illustrating asset allocator 1850 in greater detail is shown, according to an exemplary embodiment. Asset allocator 1850 may be configured to control the distribution, production, storage, and usage of resources in a central plant. Asset allocator 1850 can be configured to minimize the economic cost (or maximize the economic value) of operating a central plant over the duration of the optimization period. The economic cost may be defined by a cost function J(x) that expresses economic cost as a function of the control decisions made by asset allocator 1850. The cost function J(x) may account for the cost of resources purchased from the sources, as well as the revenue generated by selling resources or participating in incentive programs. Asset allocator 1850 may be similar to the embodiments of asset allocators disclosed in U.S. patent application Ser. No. 16/523,913 filed Jul. 26, 2019, the entire disclosure of which is incorporated by reference herein.

In some embodiments, asset allocator 1850 performs an optimization process to determine an optimal set of control decisions for each time step within an optimization period. The control decisions may include, for example, an optimal amount of each resource to purchase from the sources, an optimal amount of each resource to produce or convert using the subplants, an optimal amount of each resource to store or remove from storage, an optimal amount of each resource to sell, and/or an optimal amount of each resource to provide to other sinks. In some embodiments, asset allocator 1850 is configured to optimally dispatch all campus energy assets in order to meet the requested heating, cooling, and electrical loads of the campus for each time step within the optimization period.

Throughout this disclosure, asset allocator 1850 is described as actively identifying or defining various items (e.g., the sources, the subplants, storage, sinks, operational domains, etc.). However, it should be understood that asset allocator 1850 can also, or alternatively, receive such items as inputs. For example, the existence of such items can be defined by a user (e.g., via a user interface) or any other data source (e.g., another algorithm, an external system or process, etc.). Asset allocator 1850 can be configured to identify which of these items have been defined or identified and can generate an appropriate cost function and optimization constraints based on the existence of these items. It should be understood that the acts of identifying or defining these items can include asset allocator 1850 identifying, detecting, receiving, or otherwise obtaining a predefined item as an input.

Asset Allocator Elements

Asset allocator 1850 is shown to include an optimization framework module 1802. Optimization framework module 1802 can be configured to define an optimization framework for the optimization problem solved by asset allocator 1850. In some embodiments, optimization framework module 1802 defines the optimization problem as a mixed integer linear program (MILP). The MILP framework provides several advantages over the linear programming framework used in previous systems. For example, the MILP framework can account for minimum turndowns on equipment, can ensure that the high level optimization problem computes a point on the subplant curve for heat recovery chillers, and can impose logical constraints on the optimization problem to compensate for poor mechanical design and/or design inefficiencies.

In some embodiments, the MILP created by optimization framework module 1802 has the following form:

$$\min_{x,z} c_x^T x + c_z^T z$$

subject to the following constraints:

$$A_x x + A_z z \leq b$$

$$H_x x + H_z z = g$$

$$z = \text{integer}$$

where $x \in \mathbb{R}^{n_x}$ is a vector of the continuous decision variables, $z \in \mathbb{Z}^{n_z}$ is a vector of the integer decision variables, $c_x$ and $c_z$ are the respective cost vectors for the continuous decision variables and integer decision variables, $A_x$, $A_z$, and b are the matrices and vector that describe the inequality constraints, and $H_x$, $H_z$, and g are the matrices and vector that describe the equality constraints.

Still referring to FIG. 18, asset allocator 1850 is shown to include an optimization problem constructor 1810. Optimization problem constructor 1810 can be configured to construct the high level (i.e., asset allocation) optimization problem solved by asset allocator 1850. In some embodiments, the high level optimization problem includes airside units, which can be considered a type of energy storage in the mass of the building (e.g., building 10). The optimization problem may include site-specific constraints that can be added to compensate for mechanical design deficiencies.

In some embodiments, the optimization problem generated by optimization problem constructor 1810 includes an objective function. The objective function can include the sum of predicted utility usage costs over the horizon (i.e., the optimization period), the predicted demand charges, the total predicted incentive revenue over the prediction horizon, the sum of the predicted distribution costs, the sum of penalties on unmet and overmet loads over the prediction horizon, and/or the sum of the rate of change penalties over the prediction horizon (i.e., delta load penalties). All of these terms may add to the total cost, with the exception of the total predicted incentive revenue. The predicted incentive revenue may subtract from the total cost. For example, the objective function generated by optimization problem constructor 1810 may have the following form:

$$J(x) = \sum_{k=1}^{h}(\text{Source Usage Cost})_k + (\text{Total Demand Charges}) -$$

$$(\text{Total Incentives}) + \sum_{k=1}^{h}(\text{Distribution Cost})_k +$$

$$\sum_{k=1}^{h}(\text{Unmet/Overmet Load Penalties})_k + \sum_{k=1}^{h}(\text{Rate of Change Penalties})_k$$

where the index k denotes a time step in the optimization period and h is the total number of time steps in the optimization period.

In some embodiments, the optimization problem generated by optimization problem constructor 1810 includes a set of constraints. The set of constraints can include resource balance constraints (e.g., hot water balance, chilled water balance, electricity balance, etc.), operational domain constraints and storage capacity constraints, decision variable constraints (e.g., subplant capacity constraints, charge and discharge of storage constraints, and storage capacity constraints), demand/peak usage constraints, auxiliary constraints, and any site specific or commissioned constraints. In some embodiments, the operational domain constraints are generalized versions of the subplant curves. The operational domain constraints can be generated by operational domain module 1804 (described in greater detail below). The decision variable constraints may be box constraints of the form $x_{lb} \leq x \leq x_{ub}$, where x is a decision variable and $x_{lb}$ and $x_{ub}$ are the lower and upper bound for the decision variable x.

The optimization problem generated by optimization problem constructor 1810 can be considered a finite-horizon optimal control problem. The optimization problem may take the form:

minimize J(x)

subject to resource balances, operational domains for (e.g., subplant curves), constraints to predict the SOC, storage capacity constraints, subplant/storage box constraints (e.g., capacity constraints and discharge/charge rate constraints), demand/peak usage constraints, auxiliary constraints for rate of change variables, auxiliary constraints for demand charges, and site specific constraints.

In some embodiments, optimization problem constructor 1810 applies an inventory balance constraint to each resource. One side of the inventory balance constraint for a given resource may include the total amount of the resource purchased from all the sources, the total amount of the resource produced by subplants, the total amount of the resource discharged from storage (negative values indicate charging storage), and unmet load. The other side of the inventory balance for the resource may include the total amount of the resource requested/predicted (uncontrolled load), carryover from the previous time step, the total amount of the resource consumed by all subplants and airside units, overmet load, and the total amount of the resource sold. For example, the inventory balance for a resource may have the form:

$$\sum_{i \in \{Sources\}}(\text{Purchased Resource})_i + \sum_{j \in \{Subplants\}}(\text{Produced Resource})_j +$$

-continued $$\sum_{k \in \{Storage\}}(\text{Discharged Storage})_k + \text{Unmet Load} =$$

$$\text{Requested Load} + \text{Carryover} +$$

$$\sum_{j \in \{Subplants\}}(\text{Consumed Resource})_j \sum_{l \in \{Airside\ Units\}}(\text{Consumed Resource})_l +$$

$$\text{Overmet Load} + \text{Resource Sold}$$

Optimization problem constructor 1810 may require this resource balance to be satisfied for each resource at each time step of the optimization period. Together the unmet and overmet load capture the accumulation of a resource. Negative accumulation (unmet load) are distinguished from positive accumulation (overmet load) because typically, overmet loads are not included in the resource balance. Even though unmet and overmet loads are listed separately, at most one of the two may be non-zero. The amount of carryover may be the amount of unmet/overmet load from the previous time step (described in greater detail below).

Throughout this disclosure, the high level/asset allocator optimization problem or high level/asset allocator problem refers to the general optimization problem constructed by optimization problem constructor 1810. A high level problem instance refers to a realization of the high level problem provided the input data and parameters. The high level optimization/asset allocation algorithm refers to the entire set of steps needed to solve a high level problem instance (i.e., encapsulates both the set of mathematical operations and the implementation or software design required to setup and solve a high level problem instance).

Still referring to FIG. 18, asset allocator 1850 is shown to include element models 1830. Element models 1830 may store definitions and/or models for various elements of the high level optimization problem. For example, element models 1830 are shown to include sink models 1832, source models 1834, subplant models 1836, storage models 1838, and element links 1840. In some embodiments, element models 1830 include data objects that define various attributes or properties of sinks, the sources, the subplants, and storage (e.g., using object-oriented programming).

For example, source models 1834 may define the type of resource provided by each of the sources, a cost of each resource, demand charges associated with the consumption of the resource, a maximum rate at which the resource can be purchased from each of the sources, and other attributes of the sources. Similarly, subplant models 1836 may define the input resources of each subplant, the output resources of each subplant, relationships between the input and output variables of each subplant (i.e., the operational domain of each subplant), and optimization constraints associated with each of the subplants. Each of element models 1830 are described in greater detail below.

Element models 1830 are shown to include sink models 1832. Sink models 1832 may store models for various sinks. The various sinks may include resource consumers or requested loads. Some examples are the campus thermal loads and campus electricity usage. Sink models 1832 may store the predicted consumption over the optimization period for each of the sinks. Sink models 1832 may also store any unmet/overmet load for each of the sinks, carryover from the previous time steps, and any incentives earned by supplying each of the sinks (e.g., for sinks such as an energy purchasers or an energy grid).

Carryover can be defined as the amount of unmet or overmet load for a particular resource from the previous time step. In some embodiments, asset allocator 1850 determines the carryover by adding the entire unmet load for a particular resource in one time step to the requested load for the resource at the next time step. However, calculating the carryover in this manner may not always be appropriate since the carryover may grow over time. As an example, consider an unmet chilled water load. If there are several time steps where the chilled water load is not met, the buildings supplied by the load will heat up. Due to this increase in building temperature, the amount of chilled water load required to decrease the building temperature to the set-point is not a linearly increasing function of the sum of the unmet load over the past time steps because the building temperature will begin approaching the ambient temperature.

In some embodiments, asset allocator 1850 adds a forgetting factor to the carryover. For example, asset allocator 1850 can calculate the carryover for each time step using the following equation:

$$\text{carryover}_{j+1} = \gamma_j \cdot \text{unmet/overmet}_j$$

where unmet/overmet$_j$ is the amount of unmet and/or overmet load at time step j, carryover$_{j+1}$ is the carryover added to the right-hand side of the inventory balance at the next time step j+1, and $\gamma_j \in [0,1]$ is the forgetting factor. Selecting $\gamma_j = 0$ corresponds to case where no unmet/overmet load is carried over to the next time step, whereas selecting $\gamma_j = 1$ corresponds to case where all unmet/overmet load is carried over to the next time step. An intermediate selection of $\gamma_j$ (i.e., $0 \leq \gamma_j \leq 1$) corresponds to the case where some, but not all, of the unmet/overmet load is carried over. For the case of a chilled water system, the choice of $\gamma_j$ may depend on the plant itself and can be determined using the amount of unmet load that actually stored in the water (temperature would increase above the setpoint) when an unmet load occurs.

Still referring to FIG. 18, element models 1830 are shown to include source models 1834. Source models 1834 may store models for each of the sources. Source models 1834 may store a price per unit of a resource purchased from each of the sources (e.g., $/kWh of electricity, $/liter of water, etc.). This cost can be included as a direct cost associated with resource usage in the cost function. In some embodiments, source models 1834 store costs associated with demand charges and demand constraints, incentive programs (e.g., frequency response and economic demand response) and/or sell back programs for one or more of the sources.

In some embodiments, the cost function J(x) includes a demand charge based on peak electrical usage during a demand charge period (e.g., during a month). This demand charge may be based on the maximum rate of electricity usage at any time in the demand charge period. There are several other types of demand charges besides the anytime monthly demand charge for electricity including, for example, time-of-day monthly and yearlong ratchets. Some or all of these demand charges can be added to the cost function depending on the particular types of demand charges imposed by the sources. In some embodiments, demand charges are defined as follows:

$$wc \max_{i \in T_{demand}} \{x_i\}$$

where $x_i$ represents the resource purchase at time step i of the optimization period, c>0 is the demand charge rate, w is a (potentially time-varying) weight applied to the demand charge term to address any discrepancies between the optimization period and the time window over which the demand charge is applied, and $T_{demand} \subseteq \{1, \ldots, h\}$ is the subinterval of the optimization period to which the demand charge is applied. Source models 1834 can store values for some or all of the parameters that define the demand charges and the demand charge periods.

In some embodiments, asset allocator 1850 accounts for demand charges within a linear programming framework by introducing an auxiliary continuous variable. This technique is described in greater detail with reference to demand charge module 1806. While this type of term may readily be cast into a linear programming framework, it can be difficult to determine the weighting coefficient w when the demand charge period is different from the optimization period. Nevertheless, through a judicious choice of the two adjustable parameters for demand charges (i.e., the weighting coefficient w and the initial value of the auxiliary demand variable), other types of demand charges may be included in the high level optimization problem.

In some embodiments, source models 1834 store parameters of various incentive programs offered by the sources. For example, the source definition for an electric utility may define a capability clearing price, a performance clearing price, a regulation award, or other parameters that define the benefits (e.g., potential revenue) of participating in a frequency regulation program. In some embodiments, source models 1834 define a decision variable in the optimization problem that accounts for the capacity of a battery reserved for frequency regulation. This variable effectively reduces the capacity of the battery that is available for priced-based demand response. Depending on the complexity of the decision, source models 1834 may also define a decision variable that indicates whether to participate in the incentive program. In asset allocator 1850, storage capacity may be reserved for participation in incentive programs.

In some embodiments, source models 1834 store pricing information for the resources sold by the sources. The pricing information can include time-varying pricing information, progressive or regressive resource prices (e.g., prices that depend on the amount of the resource purchased), or other types of pricing structures. Progressive and regressive resource prices may readily be incorporated into the optimization problem by leveraging the set of computational operations introduced by the operational domain. In the case of either a progressive rate that is a discontinuous function of the usage or for any regressive rate, additional binary variables can be introduced into the optimization problem to properly describe both of these rates. For progressive rates that are continuous functions of the usage, no binary variables are needed because one may apply a similar technique as that used for imposing demand charges.

Element models 1830 are shown to include subplant models 1836. Subplant models 1836 may store models for each of the subplants. As discussed above, the subplants are the main assets of a central plant. The subplants can be configured to convert resource types, making it possible to balance requested loads from the building or campus using resources purchased from the sources. This general definition allows for a diverse set of central plant configurations and equipment types as well as varying degrees of subplant modeling fidelity and resolution.

In some embodiments, subplant models 1836 identify each of the subplants as well as the optimization variables associated with each subplant. The optimization variables of a subplant can include the resources consumed, the resources produced, intrinsic variables, and extrinsic variables. Intrinsic variables may be internal to the optimization formulation and can include any auxiliary variables used to formulate the optimization problem. Extrinsic variables may be variables that are shared among subplants (e.g., condenser water temperature).

In some embodiments, subplant models 1836 describe the relationships between the optimization variables of each subplant. For example, subplant models 1836 can include subplant curves that define the output resource production of a subplant as a function of one or more input resources provided to the subplant. In some embodiments, operational domains are used to describe the relationship between the subplant variables. Mathematically, an operational domain is a union of a collection of polytopes in an n-dimensional (real) space that describe the admissible set of variables of a high level element. Operational domains are described in greater detail below.

In some embodiments, subplant models 1836 store subplant constraints for each of the subplants. Subplant constraints may be written in the following general form:

$$A_{x,j}x_j + A_{z,j}z_j \leq b_j$$

$$H_{x,j}x_j + H_{z,j}z_j = g_j$$

$$x_{lb,j} \leq x_j \leq x_{ub,j}$$

$$z_{lb,j} \leq z_j \leq z_{ub,j}$$

$$z_j = \text{integer}$$

for all j where j is an index representing the jth subplant, $x_j$ denotes the continuous variables associated with the jth subplant (e.g., resource variables and auxiliary optimization variables), and $z_j$ denotes the integer variables associated with the jth subplant (e.g., auxiliary binary optimization variables). The vectors $x_{lb,j}$, $x_{ub,j}$, $z_{lb,j}$, and $z_{ub,j}$ represent the box (bound) constraints on the decision variables. The matrices $A_{x,j}$, $A_{z,j}$, $H_{x,j}$, and $H_{z,j}$ and the vectors $b_j$ and $g_j$ are associated with the inequality constraints and the equality constraints for the jth subplant.

Element models 1830 are shown to include storage models 1838. Storage models 1838 may store models for each of storage. Storage models 1838 can define the types of resources stored by each of storage, as well as storage constraints that limit the state-of-charge (e.g., maximum charge level) and/or the rates at which each storage can be charged or discharged. In some embodiments, the current level or capacity of storage is quantified by the state-of-charge (SOC), which can be denoted by φ where φ=0 corresponds to empty and φ=1 corresponds to full. To describe the SOC as a function of the charge rate or discharge rate, a dynamic model can be stored as part of storage models 1838. The dynamic model may have the form:

$$\phi(k+1) = A\phi(k) + Bu(k)$$

where φ(k) is the predicted state of charge at time step k of the optimization period, u(k) is the charge/discharge rate at time step k, and A and B are coefficients that account for dissipation of energy from storage. In some embodiments, A and B are time-varying coefficients. Accordingly, the dynamic model may have the form:

$$\phi(k+1) = A(k)\phi(k) + B(k)u(k)$$

where A(k) and B(k) are coefficients that vary as a function of the time step k.

Asset allocator 1850 can be configured to add constraints based on the operational domain of storage. In some embodiments, the constraints link decision variables adjacent in time as defined by the dynamic model. For example, the constraints may link the decision variables φ(k+1) at time step k+1 to the decision variables φ(k) and u(k) at time step k. In some embodiments, the constraints link the SOC of storage to the charge/discharge rate. Some or all of these constraints may be defined by the dynamic model and may depend on the operational domain of storage.

In some embodiments, storage models 1838 store optimization constraints for each of storage. Storage constraints may be written in the following general form:

$$A_{x,k}x_k + A_{z,k}z_k \leq b_k$$

$$H_{x,k}x_k + H_{z,k}z_k = g_k$$

$$x_{lb,k} \leq x_k \leq x_{ub,k}$$

$$z_{lb,k} \leq z_k \leq z_{ub,k}$$

$$z_k = \text{integer}$$

for all k where k is an index representing the kth storage device, $x_k$ denotes the continuous variables associated with the kth storage device (e.g., resource variables and auxiliary optimization variables), and $z_k$ denotes the integer variables associated with the kth storage device (e.g., auxiliary binary optimization variables). The vectors $x_{lb,k}$, $x_{ub,k}$, $z_{lb,k}$, and $z_{ub,k}$ represent the box (bound) constraints on the decision variables. The matrices $A_{x,k}$, $A_{z,k}$, $H_{x,k}$, and $H_{z,k}$ and the vectors $b_k$ and $g_k$ are associated with the inequality constraints and the equality constraints for the kth storage device.

The optimization constraints may ensure that the predicted SOC for each of storage is maintained between a minimum SOC $Q_{min}$ and a maximum SOC $Q_{max}$. The optimization constraints may also ensure that the charge/discharge rate is maintained between a minimum charge rate $\dot{Q}_{min}$ and maximum charge rate $\dot{Q}_{max}$. In some embodiments, the optimization constraints include terminal constraints imposed on the SOC at the end of the optimization period. For example, the optimization constraints can ensure that one or more of storage are full at the end of the optimization period (i.e., "tank forced full" constraints).

In some embodiments, storage models 1838 include models that treat the air within the building (e.g., building 10) and/or the building mass as a form of energy storage. However, one of the key differentiators between an airside mass and storage is that additional care must be taken to ensure feasibility of the optimization problem (e.g., soft constraining of the state constraints). Nevertheless, airside optimization units share many common features and mathematical operations as storage. In some embodiments, a state-space representation of airside dynamics can be used to describe the predicted evolution of airside optimization units (e.g., building mass). Such a model may have the form:

$$x(k+1) = Ax(k) + Bu(k)$$

where x(k) is the airside optimization unit state vector, u(k) is the airside optimization unit input vector, and A and B are the system matrices. In general, an airside optimization unit or the control volume that the dynamic model describes may represent a region (e.g., multiple HVAC zones served by the same air handling unit) or an aggregate of several regions (e.g., an entire building).

Still referring to FIG. 18, element models 1830 are shown to include element links 1840. In some embodiments, element links 1840 define the connections between the sources, the subplants, storage, and sinks. For example, element links 1840 may define which of the sources provide resources to each of the subplants, which the subplants are connected to which storage, and which the subplants and/or storage provide resources to each of the sinks. Element links 1840 may contain the data and methods needed to create and solve an instance of the high level optimization problem.

In some embodiments, element links 1840 link the sources, the subplants, storage, and sinks (i.e., the high level problem elements) using a netlist of connections between high level problem elements. The information provided by element links 1840 may allow multiple the subplants, storage, sinks, and sources of the same type to be defined. Rather than assuming that all elements contribute to and draw from a common pool of each resource, element links 1840 can be used to specify the particular connections between elements. Accordingly, multiple resources of the same type can be defined such that a first subset of the subplants produce a first resource of a given type, whereas a second subset of the subplants produce a second resource of the same type. Advantageously, element links 1840 can be used to build constraints that reflect the actual physical connections between equipment in a central plant.

In some embodiments, element links 1840 are used to account for the distribution costs of resources between elements of an asset allocation system (e.g., from the sources to the subplants, from the subplants to sinks, etc.) and/or the distribution efficiency of each connection. In some cases it may be necessary to include costs for delivering the resource along a connection, or an efficiency of the transportation (amount or percentage of resources received on the other side of the connection). Accounting for distribution costs and/or distribution efficiency may affect the result of the optimization in some situations.

The resource balance constraint can be modified to account for distribution efficiency as follows:

$$\sum_{sources} \alpha_{source,resource} purchase_{resource,time} +$$

$$\sum_{subplants} \alpha_{subplant,resource} \text{produces}(x_{internal,time}, x_{external,time}, v_{uncontrolled,time}) -$$

$$\sum_{subplants} \frac{1}{\alpha_{source,resource}} \text{consumes}(x_{internal,time}, x_{external,time}, v_{uncontrolled,time}) +$$

$$\sum_{storages} discharges_{resources}(x_{internal,time}, x_{external,time}) -$$

$$\frac{1}{\alpha_{sink,resouce}} \sum_{sinks} requests_{resource} = 0 \ \forall \text{ resources}, \forall \text{ time} \in \text{horizon}$$

where the $\alpha$ terms are loss factors with values between zero and one.

The cost function can be modified to account for transportation costs as follows:

$$J(x) = \sum_{sources} \sum_{horizon} \text{cost}(purchase_{resource,time}, \text{time}) +$$

$$\ldots + \sum_{connection} \lambda_{connection} resource_{connection}$$

where $\lambda_{connection}$ is the cost per unit resource transported along a particular connection and $resource_{connection}$ is the amount of the resource transported along the connection. Accordingly, the final term of the cost function accounts for transportation costs along each of the connections or links between elements in an asset allocation system.

Still referring to FIG. 18, asset allocator 1850 is shown to include a demand charge module 1806. Demand charge module 1806 can be configured to modify the cost function J(x) and the optimization constraints to account for one or more demand charges. As previously described, demand charges are costs imposed by the sources based on the peak consumption of a resource from the sources during various demand charge periods (i.e., the peak amount of the resource purchased from the utility during any time step of the applicable demand charge period). For example, an electric utility may define one or more demand charge periods and may impose a separate demand charge based on the peak electric consumption during each demand charge period. Electric energy storage can help reduce peak consumption by storing electricity in a battery when energy consumption is low and discharging the stored electricity from the battery when energy consumption is high, thereby reducing peak electricity purchased from the utility during any time step of the demand charge period.

In some instances, one or more of the resources are subject to a demand charge or multiple demand charges. There are many types of potential demand charges as there are different types of energy rate structures. The most common energy rate structures are constant pricing, time of use (TOU), and real time pricing (RTP). Each demand charge may be associated with a demand charge period during which the demand charge is active. Demand charge periods can overlap partially or completely with each other and/or with the optimization period. Demand charge periods can include relatively long periods (e.g., monthly, seasonal, annual, etc.) or relatively short periods (e.g., days, hours, etc.). Each of these periods can be divided into several sub-periods including off-peak, partial-peak, and/or on-peak. Some demand charge periods are continuous (e.g., beginning Jan. 1, 2017 and ending Jan. 31, 2017), whereas other demand charge periods are non-continuous (e.g., from 11:00 AM-1:00 PM each day of the month).

Over a given optimization period, some demand charges may be active during some time steps that occur within the optimization period and inactive during other time steps that occur during the optimization period. Some demand charges may be active over all the time steps that occur within the optimization period. Some demand charges may apply to some time steps that occur during the optimization period and other time steps that occur outside the optimization period (e.g., before or after the optimization period). In some embodiments, the durations of the demand charge periods are significantly different from the duration of the optimization period.

Advantageously, demand charge module 1806 may be configured to account for demand charges in the high level optimization process performed by asset allocator 1850. In some embodiments, demand charge module 1806 incorporates demand charges into the optimization problem and the cost function J(x) using demand charge masks and demand charge rate weighting factors. Each demand charge mask may correspond to a particular demand charge and may indicate the time steps during which the corresponding demand charge is active and/or the time steps during which the demand charge is inactive. Each rate weighting factor may also correspond to a particular demand charge and may scale the corresponding demand charge rate to the time scale of the optimization period.

The demand charge term of the cost function J(x) can be expressed as:

$$J(x) = \ldots \sum_{s \in sources} \sum_{q \in demands_s} w_{demand,s,q} r_{demand,s,q} \max_{i \in demands_{s,q}} (purchase_{s,i}) \ldots$$

where the max( ) function selects the maximum amount of the resource purchased from source s during any time step i that occurs during the optimization period. However, the demand charge period associated with demand charge q may not cover all of the time steps that occur during the optimization period. In order to apply the demand charge q to only the time steps during which the demand charge q is active, demand charge module 1806 can add a demand charge mask to the demand charge term as shown in the following equation:

$$J(x) = \ldots \sum_{s \in sources} \sum_{q \in demands_s} w_{demand,s,q} r_{demand,s,q} \max_{i \in demands_{s,q}} (g_{s,q,i} purchase_{s,i}) \ldots$$

where $g_{s,q,i}$ is an element of the demand charge mask.

The demand charge mask may be a logical vector including an element $g_{s,q,i}$ for each time step i that occurs during the optimization period. Each element $g_{s,q,i}$ of the demand charge mask may include a binary value (e.g., a one or zero) that indicate whether the demand charge q for source s is active during the corresponding time step i of the optimization period. For example, the element $g_{s,q,i}$ may have a value of one (i.e., $g_{s,q,i}=1$) if demand charge q is active during time step i and a value of zero (i.e., $g_{s,q,i}=0$) if demand charge q is inactive during time step i. An example of a demand charge mask is shown in the following equation:

$$g_{s,q}=[0,0,0,1,1,1,1,0,0,0,1,1]^T$$

where $g_{s,q,1}$, $g_{s,q,2}$, and $g_{s,q,3}$, $g_{s,q,8}$, $g_{s,q,9}$, and $g_{s,q,10}$ have values of zero, whereas $g_{s,q,4}$, $g_{s,q,5}$, $g_{s,q,6}$, $g_{s,q,7}$, $g_{s,q,11}$, and $g_{s,q,12}$ have values of one. This indicates that the demand charge q is inactive during time steps i=1, 2, 3, 8, 9, 10 (i.e., $g_{s,q,i}=0$ $\forall i=1, 2, 3, 8, 9, 10$) and active during time steps i=4, 5, 6, 7, 11, 12 (i.e., $g_{s,q,i}=1$ $\forall i=4, 5, 6, 7, 11, 12$). Accordingly, the term $g_{s,q,i} purchase_{s,i}$ within the max( ) function may have a value of zero for all time steps during which the demand charge q is inactive. This causes the max( ) function to select the maximum purchase from source s that occurs during only the time steps for which the demand charge q is active.

In some embodiments, demand charge module 1806 calculates the weighting factor $w_{demand,s,q}$ for each demand charge q in the cost function J(x). The weighting factor $w_{demand,s,q}$ may be a ratio of the number of time steps the corresponding demand charge q is active during the optimization period to the number of time steps the corresponding demand charge q is active in the remaining demand charge period (if any) after the end of the optimization period. For example, demand charge module 1806 can calculate the weighting factor $w_{demand,s,q}$ using the following equation:

$$w_{demand,s,q} = \frac{\sum_{i=k}^{k+h-1} g_{s,q,i}}{\sum_{i=k+h}^{period\_end} g_{s,q,i}}$$

where the numerator is the summation of the number of time steps the demand charge q is active in the optimization period (i.e., from time step k to time step k+h−1) and the denominator is the number of time steps the demand charge q is active in the portion of the demand charge period that occurs after the optimization period (i.e., from time step k+h to the end of the demand charge period).

The following example illustrates how demand charge module 1806 can incorporate multiple demand charges into the cost function J(x). In this example, a single source of electricity (e.g., an electric grid) is considered with multiple demand charges applicable to the electricity source (i.e., q=1 . . . N, where N is the total number of demand charges). The system includes a battery asset which can be allocated over the optimization period by charging or discharging the battery during various time steps. Charging the battery increases the amount of electricity purchased from the electric grid, whereas discharging the battery decreases the amount of electricity purchased from the electric grid.

Demand charge module 1806 can modify the cost function J(x) to account for the N demand charges as shown in the following equation:

$$J(x) = \ldots + w_{d_1} r_{d_1} \max_i (g_{1_i}(-P_{bat_i} + eLoad_i)) + \ldots +$$
$$w_{d_q} r_{d_q} \max_i (g_{q_i}(-P_{bat_i} + eLoad_i)) + \ldots + w_{d_N} r_{d_N} \max_i (g_{N_i}(-P_{bat_i} + eLoad_i))$$

where the term $-P_{bat_i}+eLoad_i$ represents the total amount of electricity purchased from the electric grid during time step i (i.e., the total electric load $eLoad_i$ minus the power discharged from the battery $P_{bat_i}$). Each demand charge q=1 . . . N can be accounted for separately in the cost function J(x) by including a separate max( ) function for each of the N demand charges. The parameter $r_{d_q}$ indicates the demand charge rate associated with the qth demand charge (e.g., $/kW) and the weighting factor $w_{d_q}$ indicates the weight applied to the qth demand charge.

Demand charge module 1806 can augment each max( ) function with an element $g_{q_i}$ of the demand charge mask for the corresponding demand charge. Each demand charge mask may be a logical vector of binary values which indicates whether the corresponding demand charge is active or inactive at each time step i of the optimization period. Accordingly, each max( ) function may select the maximum electricity purchase during only the time steps the corresponding demand charge is active. Each max( ) function can be multiplied by the corresponding demand charge rate $r_{d_q}$ and the corresponding demand charge weighting factor $w_{d_q}$ to determine the total demand charge resulting from the battery allocation $P_{bat}$ over the duration of the optimization period.

In some embodiments, demand charge module 1806 linearizes the demand charge terms of the cost function J(x) by introducing an auxiliary variable $d_q$ for each demand charge q. In the case of the previous example, this will result in N auxiliary variables $d_1$ . . . $d_N$ being introduced as decision variables in the cost function 1(x). Demand charge module

1806 can modify the cost function $1(x)$ to include the linearized demand charge terms as shown in the following equation:

$$J(x) = \ldots + w_{d_1} r_{d_1} d_1 + \ldots + w_{d_q} r_{d_q} d_q + \ldots + w_{d_N} r_{d_N} d_N$$

Demand charge module 1806 can impose the following constraints on the auxiliary demand charge variables $d_1 \ldots d_N$ to ensure that each auxiliary demand charge variable represents the maximum amount of electricity purchased from the electric utility during the applicable demand charge period:

$$d_1 \geq g_{1_i}(-P_{bat_i} + eLoad_i) \quad \forall i = k \ldots k+h-1, g_{1_i} \neq 0$$

$$d_1 \geq 0 \quad \vdots$$

$$d_q \geq g_{q_i}(-P_{bat_i} + eLoad_i) \quad \forall i = k \ldots k+h-1, g_{q_i} \neq 0$$

$$d_q \geq 0 \quad \vdots$$

$$d_N \geq g_{N_i}(-P_{bat_i} + eLoad_i) \quad \forall i = k \ldots k+h-1, g_{N_i} \neq 0$$

$$d_N \geq 0$$

In some embodiments, the number of constraints corresponding to each demand charge q is dependent on how many time steps the demand charge q is active during the optimization period. For example, the number of constraints for the demand charge q may be equal to the number of non-zero elements of the demand charge mask $g_q$. Furthermore, the value of the auxiliary demand charge variable $d_q$ at each iteration of the optimization may act as the lower bound of the value of the auxiliary demand charge variable $d_q$ at the following iteration.

Consider the following example of a multiple demand charge structure. In this example, an electric utility imposes three monthly demand charges. The first demand charge is an all-time monthly demand charge of 15.86 $/kWh which applies to all hours within the entire month. The second demand charge is an on-peak monthly demand charge of 1.56 $/kWh which applies each day from 12:00-18:00. The third demand charge is a partial-peak monthly demand charge of 0.53 $/kWh which applies each day from 9:00-12:00 and from 18:00-22:00.

For an optimization period of one day and a time step of one hour (i.e., i=1 ... 24), demand charge module 1806 may introduce three auxiliary demand charge variables. The first auxiliary demand charge variable $d_1$ corresponds to the all-time monthly demand charge; the second auxiliary demand charge variable $d_2$ corresponds to the on-peak monthly demand charge; and the third auxiliary demand charge variable $d_3$ corresponds to the partial-peak monthly demand charge. Demand charge module 1806 can constrain each auxiliary demand charge variable to be greater than or equal to the maximum electricity purchase during the hours the corresponding demand charge is active, using the inequality constraints described above.

Demand charge module 1806 can generate a demand charge mask $g_q$ for each of the three demand charges (i.e., q=1 ... 3), where $g_q$ includes an element for each time step of the optimization period (i.e., $g_q = [g_{q_1} \ldots g_{q_{24}}]$). The three demand charge masks can be defined as follows:

$$g_{q_i} = 1 \; \forall i = 1 \ldots 24$$

$$g_{2_i} = 1 \; \forall i = 12 \ldots 18$$

$$g_{3_i} = 1 \; \forall i = 9 \ldots 12, 18 \ldots 22$$

with all other elements of the demand charge masks equal to zero. In this example, it is evident that more than one demand charge constraint will be active during the hours which overlap with multiple demand charge periods. Also, the weight of each demand charge over the optimization period can vary based on the number of hours the demand charge is active, as previously described.

In some embodiments, demand charge module 1806 considers several different demand charge structures when incorporating multiple demand charges into the cost function $J(x)$ and optimization constraints. Demand charge structures can vary from one utility to another, or the utility may offer several demand charge options. In order to incorporate the multiple demand charges within the optimization framework, a generally-applicable framework can be defined as previously described. Demand charge module 1806 can translate any demand charge structure into this framework. For example, demand charge module 1806 can characterize each demand charge by rates, demand charge period start, demand charge period end, and active hours. Advantageously, this allows demand charge module 1806 to incorporate multiple demand charges in a generally-applicable format.

The following is another example of how demand charge module 1806 can incorporate multiple demand charges into the cost function $J(x)$. Consider, for example, monthly demand charges with all-time, on-peak, partial-peak, and off-peak. In this case, there are four demand charge structures, where each demand charge is characterized by twelve monthly rates, twelve demand charge period start (e.g., beginning of each month), twelve demand charge period end (e.g., end of each month), and hoursActive. The hoursActive is a logical vector where the hours over a year where the demand charge is active are set to one. When running the optimization over a given horizon, demand charge module 1806 can implement the applicable demand charges using the hoursActive mask, the relevant period, and the corresponding rate.

In the case of an annual demand charge, demand charge module 1806 can set the demand charge period start and period end to the beginning and end of a year. For the annual demand charge, demand charge module 1806 can apply a single annual rate. The hoursActive demand charge mask can represent the hours during which the demand charge is active. For an annual demand charge, if there is an all-time, on-peak, partial-peak, and/or off-peak, this translates into at most four annual demand charges with the same period start and end, but different hoursActive and different rates.

In the case of a seasonal demand charge (e.g., a demand charge for which the maximum peak is determined over the indicated season period), demand charge module 1806 can represent the demand charge as an annual demand charge. Demand charge module 1806 can set the demand charge period start and end to the beginning and end of a year. Demand charge module 1806 can set the hoursActive to one during the hours which belong to the season and to zero otherwise. For a seasonal demand charge, if there is an All-time, on-peak, partial, and/or off-peak, this translates into at most four seasonal demand charges with the same period start and end, but different hoursActive and different rates.

In the case of the average of the maximum of current month and the average of the maxima of the eleven previous months, demand charge module 1806 can translate the demand charge structure into a monthly demand charge and an annual demand charge. The rate of the monthly demand charge may be half of the given monthly rate and the annual rate may be the sum of given monthly rates divided by two. These and other features of demand charge module 1806 are described in greater detail in U.S. patent application Ser. No. 15/405,236 filed Jan. 12, 2017, the entire disclosure of which is incorporated by reference herein.

Referring again to FIG. 18, asset allocator 1850 is shown to include an incentive program module 1808. Incentive program module 1808 may modify the optimization problem to account for revenue from participating in an incentive-based demand response (IBDR) program. IBDR programs may include any type of incentive-based program that provides revenue in exchange for resources (e.g., electric power) or a reduction in a demand for such resources. For example, an asset allocation system may provide electric power to an energy grid or an independent service operator as part of a frequency response program (e.g., PJM frequency response) or a synchronized reserve market. In a frequency response program, a participant contracts with an electrical supplier to maintain reserve power capacity that can be supplied or removed from an energy grid by tracking a supplied signal. The participant is paid by the amount of power capacity required to maintain in reserve. In other types of IBDR programs, an asset allocation system may reduce its demand for resources from a utility as part of a load shedding program. It is contemplated that an asset allocation system may participate in any number and/or type of IBDR programs.

In some embodiments, incentive program module 1808 modifies the cost function J(x) to include revenue generated from participating in an economic load demand response (ELDR) program. ELDR is a type of IBDR program and similar to frequency regulation. In ELDR, the objective is to maximize the revenue generated by the program, while using the battery to participate in other programs and to perform demand management and energy cost reduction. To account for ELDR program participation, incentive program module 1808 can modify the cost function J(x) to include the following term:

$$\min_{b_i, P_{bat_i}} \left( -\sum_{i=k}^{k+h-1} b_i r_{ELDR_i} \left( adjCBL_i - (eLoad_i - P_{bat_i}) \right) \right)$$

where $b_i$ is a binary decision variable indicating whether to participate in the ELDR program during time step i, $r_{ELDR_i}$ is the ELDR incentive rate at which participation is compensated, and $adjCBL_i$ is the symmetric additive adjustment (SAA) on the baseline load. The previous expression can be rewritten as:

$$\min_{b_i, P_{bat_i}} \left( -\sum_{i=k}^{k+h-1} b_i \right.$$
$$\left. r_{ELDR_i} \left( \sum_{l=1}^{4} \frac{e_{li}}{4} + \sum_{p=m-4}^{m-2} \frac{1}{3} \left( eLoad_p - P_{bat_p} - \sum_{l=1}^{4} \frac{e_{lp}}{4} \right) - (eLoad_i - P_{bat_i}) \right) \right)$$

where $e_{li}$ and $e_{lp}$ are the electric loads at the lth hour of the operating day.

In some embodiments, incentive program module 1808 handles the integration of ELDR into the optimization problem as a bilinear problem with two multiplicative decision variables. In order to linearize the cost function J(x) and customize the ELDR problem to the optimization framework, several assumptions may be made. For example, incentive program module 1808 can assume that ELDR participation is only in the real-time market, balancing operating reserve charges and make whole payments are ignored, day-ahead prices are used over the horizon, real-time prices are used in calculating the total revenue from ELDR after the decisions are made by the optimization algorithm, and the decision to participate in ELDR is made in advance and passed to the optimization algorithm based on which the battery asset is allocated.

In some embodiments, incentive program module 1808 calculates the participation vector $b_i$ as follows:

$$b_i = \begin{cases} 1 & \forall i / r_{DA_i} \geq NBT_i \text{ and } i \in S \\ 0 & \text{otherwise} \end{cases}$$

where $r_{DA_i}$ is the hourly day-ahead price at the ith hour, $NBT_i$ is the net benefits test value corresponding to the month to which the corresponding hour belongs, and S is the set of nonevent days. Nonevent days can be determined for the year by choosing to participate every x number of days with the highest day-ahead prices out of y number of days for a given day type. This approach may ensure that there are nonevent days in the 45 days prior to a given event day when calculating the CBL for the event day.

Given these assumptions and the approach taken by incentive program module 1808 to determine when to participate in ELDR, incentive program module 1808 can adjust the cost function J(x) as follows:

$$J(x) = -\sum_{i=k}^{k+h-1} r_{e_i} P_{bat_i} - \sum_{i=k}^{k+h-1} r_{FR_i} P_{FR_i} +$$
$$\sum_{i=k}^{k+h-1} r_{s_i} s_i + w_d r_d d - \sum_{i=k}^{k+h-1} b_i r_{DA_i} \left( \sum_{p=m-4}^{m-2} -\frac{1}{3} P_{bat_p} + P_{bat_i} \right)$$

where $b_i$ and m are known over a given horizon. The resulting term corresponding to ELDR shows that the rates at the ith participation hour are doubled and those corresponding to the SAA are lowered. This means it is expected that a high level optimizer will tend to charge the battery during the SAA hours and discharge the battery during the participation hours. Notably, even though a given hour is set to be an ELDR participation hour, a high level optimizer may not decide to allocate any of the battery asset during that hour. This is due to the fact that it may be more beneficial at that instant to participate in another incentive program or to perform demand management.

To build the high level optimization problem, optimization problem constructor 1810 may query the number of decision variables and constraints that each subplant, source, storage, and site specific constraint adds to the problem. In some embodiments, optimization problem constructor 1810 creates optimization variable objects for each variable of the high level problem to help manage the flow of data. After the variable objects are created, optimization problem constructor 1810 may pre-allocate the optimization matrices and vectors for the problem. Element links 1840 can then be used to fill in the optimization matrices and vectors by querying each component. The constraints associated with each subplant can be filled into the larger problem-wide optimization matrix and vector. Storage constraints can be added, along with demand constraints, demand charges, load balance constraints, and site-specific constraints.

In some embodiments, asset allocator 1850 is configured to optimize the use of extrinsic variables. Extrinsic variables can include controlled or uncontrolled variables that affect multiple the subplants (e.g., condenser water temperature, external conditions such as outside air temperature, etc.). In some embodiments, extrinsic variables affect the operational domain of multiple the subplants. There are many methods that can be used to optimize the use of extrinsic variables. For example, consider a chiller subplant connected to a cooling tower subplant. The cooling tower subplant provides cooling for condenser water provided as an input to the chiller. Several scenarios outlining the use of extrinsic variables in this example are described below.

In a first scenario, both the chiller subplant and the tower subplant have operational domains that are not dependent on the condenser water temperatures. In this scenario, the condenser water temperature can be ignored (e.g., excluded from the set of optimization variables) since the neither of the operational domains are a function of the condenser water temperature.

In a second scenario, the chiller subplant has an operational domain that varies with the entering condenser water temperature. However, the cooling tower subplant has an operational domain that is not a function of the condenser water temperature. For example, the cooling tower subplant may have an operational domain that defines a relationship between fan power and water usage, independent from its leaving condenser water temperature or ambient air wet bulb temperature. In this case, the operational domain of the chiller subplant can be sliced (e.g., a cross section of the operational domain can be taken) at the condenser water temperature indicated at each point in the optimization period.

In a third scenario, the cooling tower subplant has an operational domain that depends on its leaving condenser water temperature. Both the entering condenser water temperature of the chiller subplant and the leaving condenser water temperature of the cooling tower subplant can be specified so the operational domain will be sliced at those particular values. In both the second scenario and the third scenario, asset allocator 1850 may produce variables for the condenser water temperature. In the third scenario, asset allocator 1850 may produce the variables for both the tower subplant and the chiller subplant. However, these variables will not become decision variables because they are simply specified directly.

In a fourth scenario, the condenser water temperature affects the operational domains of both the cooling tower subplant and the chiller subplant. Because the condenser water temperature is not specified, it may become an optimization variable that can be optimized by asset allocator 1850. In this scenario, the optimization variable is produced when the first subplant (i.e., either the chiller subplant or the cooling tower subplant) reports its optimization size. When the second subplant is queried, no additional variable is produced. Instead, asset allocator 1850 may recognize the shared optimization variable as the same variable from the connection netlist.

When asset allocator 1850 asks for constraints from the individual the subplants, the subplants may send those constraints using local indexing. Asset allocator 1850 may then disperse these constraints by making new rows in the optimization matrix, but also distributing the column to the correct columns based on its own indexing for the entire optimization problem. In this way, extrinsic variables such as condenser water temperature can be incorporated into the optimization problem in an efficient and optimal manner.

Some constraints may arise due to mechanical problems after the energy facility has been built. These constraints are site specific and may not be incorporated into the main code for any of the subplants or the high level problem itself. Instead, constraints may be added without software update on site during the commissioning phase of the project. Furthermore, if these additional constraints are known prior to the plant build they could be added to the design tool run. Commissioned constraints can be held by asset allocator 1850 and can be added constraints to any of the ports or connections of the subplants. Constraints can be added for the consumption, production, or extrinsic variables of a subplant.

As an example implementation, two new complex type internals can be added to the problem. These internals can store an array of constraint objects that include a dictionary to describe inequality and equality constraints, times during which the constraints are active, and the elements of the horizon the constraints affect. In some embodiments, the dictionaries have keys containing strings such as (subplantUserName).(portInternalName) and values that represent the linear portion of the constraint for that element of the constraint matrix. A special "port name" could exist to reference whether the subplant is running. A special key can be used to specify the constant part of the constraint or the right hand side. A single dictionary can describe a single linear constraint. More detail regarding asset allocator 1850 and related systems and methods are described in U.S. patent application Ser. No. 15/473,493 filed Mar. 29, 2017 and U.S. patent application Ser. No. 16/370,632 filed Mar. 29, 2019, the disclosures of which are incorporated by reference in their entireties.

Planning Tool and Planning Tool UI

Figure 19:
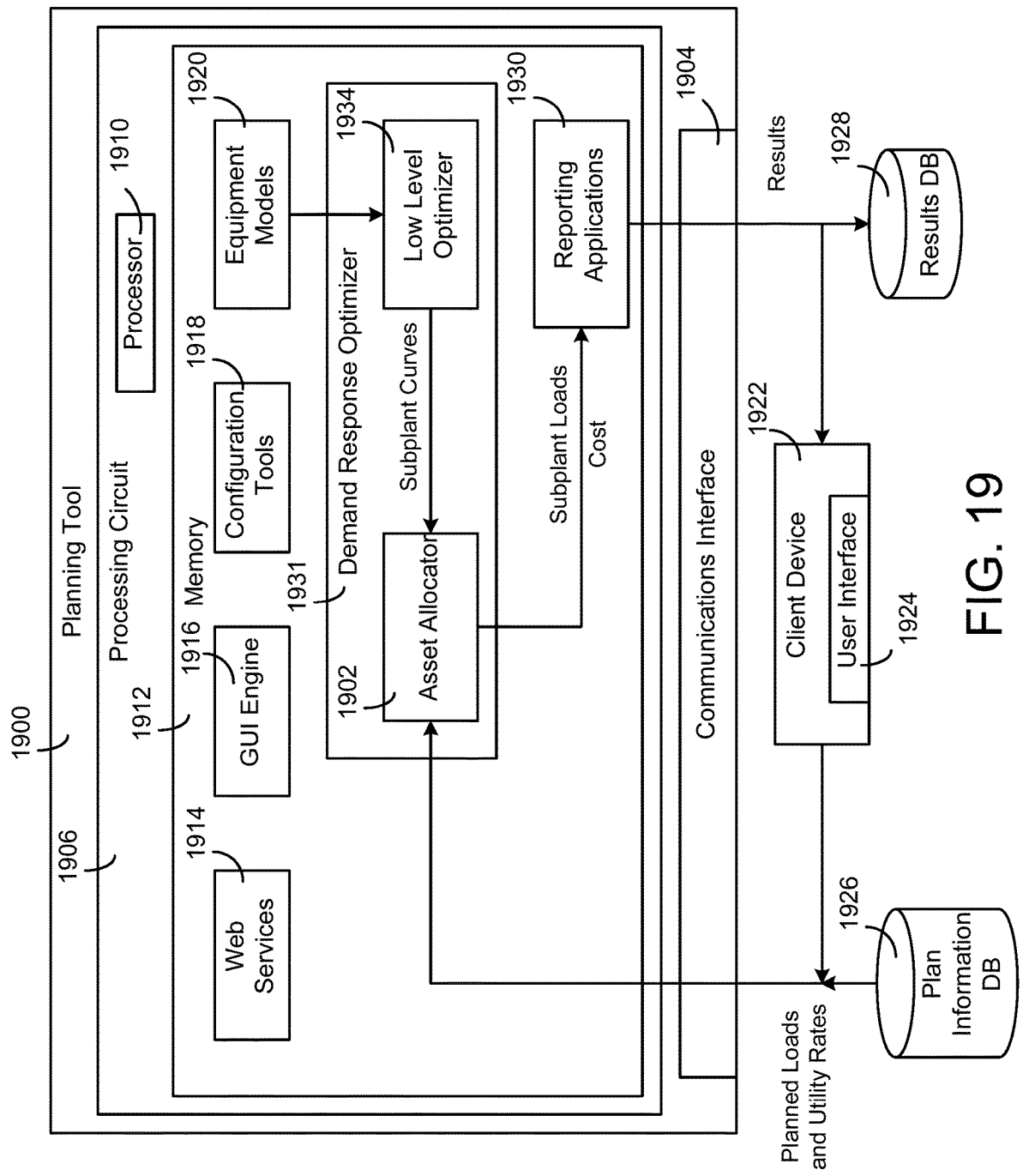
FIG. 19 is a block diagram of planning tool, which can be used in the system of FIG. 13, according to some embodiments.

Referring now to FIG. 19, a block diagram of a planning tool 1900 is shown, according to an exemplary embodiment. Planning tool 1900 may be configured to use demand response optimizer 1930 to simulate the operation of a central plant over a predetermined time period (e.g., a day, a month, a week, a year, etc.) for planning, budgeting, and/or design considerations. When implemented in planning tool 1900, demand response optimizer 1930 may operate in a similar manner as described with reference to FIG. 19. For example, demand response optimizer 1930 may use building loads and utility rates to determine an optimal resource allocation to minimize cost over a simulation period. However, planning tool 1900 may not be responsible for real-time control of a building management system or central plant.

Planning tool 1900 can be configured to determine the benefits of investing in a battery asset and the financial metrics associated with the investment. Such financial metrics can include, for example, the internal rate of return (IRR), net present value (NPV), and/or simple payback period (SPP). Planning tool 1900 can also assist a user in determining the size of the battery which yields optimal financial metrics such as maximum NPV or a minimum SPP. In some embodiments, planning tool 1900 allows a user to specify a battery size and automatically determines the benefits of the battery asset from participating in selected IBDR programs while performing PBDR. In some embodiments, planning tool 1900 is configured to determine the battery size that minimizes SPP given the IBDR programs selected and the requirement of performing PBDR. In some embodiments, planning tool 1900 is configured to determine the battery size that maximizes NPV given the IBDR programs selected and the requirement of performing PBDR.

In planning tool 1900, asset allocator 1850 may receive planned loads and utility rates for the entire simulation period. Asset allocator 1902 and asset allocator 1850 may be identical or substantially similar. The planned loads and utility rates may be defined by input received from a user via a client device (e.g., user-defined, user selected, etc.) and/or retrieved from a plan information database. Asset allocator 1850 uses the planned loads and utility rates in conjunction with subplant curves from low level optimizer 1934 to determine an optimal resource allocation (i.e., an optimal dispatch schedule) for a portion of the simulation period.

The portion of the simulation period over which asset allocator 1850 optimizes the resource allocation may be defined by a prediction window ending at a time horizon. With each iteration of the optimization, the prediction window is shifted forward and the portion of the dispatch schedule no longer in the prediction window is accepted (e.g., stored or output as results of the simulation). Load and rate predictions may be predefined for the entire simulation and may not be subject to adjustments in each iteration. However, shifting the prediction window forward in time may introduce additional plan information (e.g., planned loads and/or utility rates) for the newly added time slice at the end of the prediction window. The new plan information may not have a significant effect on the optimal dispatch schedule since only a small portion of the prediction window changes with each iteration.

In some embodiments, asset allocator 1850 requests all of the subplant curves used in the simulation from low level optimizer 1934 at the beginning of the simulation. Since the planned loads and environmental conditions are known for the entire simulation period, asset allocator 1850 may retrieve all of the relevant subplant curves at the beginning of the simulation. In some embodiments, low level optimizer 1934 generates functions that map subplant production to equipment level production and resource use when the subplant curves are provided to asset allocator 1850. These subplant to equipment functions may be used to calculate the individual equipment production and resource use (e.g., in a post-processing module) based on the results of the simulation.

Still referring to FIG. 19, planning tool 1900 is shown to include a communications interface 1904 and a processing circuit 1906. Communications interface 1904 may include wired or wireless interfaces (e.g., jacks, antennas, transmitters, receivers, transceivers, wire terminals, etc.) for conducting data communications with various systems, devices, or networks. For example, communications interface 1904 may include an Ethernet card and port for sending and receiving data via an Ethernet-based communications network and/or a Wi-Fi transceiver for communicating via a wireless communications network. Communications interface 1904 may be configured to communicate via local area networks or wide area networks (e.g., the Internet, a building WAN, etc.) and may use a variety of communications protocols (e.g., BACnet, IP, LON, etc.).

Communications interface 1904 may be a network interface configured to facilitate electronic data communications between planning tool 1900 and various external systems or devices (e.g., client device 1922, results database 1928, plan information database 1926, etc.). For example, planning tool 1900 may receive planned loads and utility rates from client device 1922 and/or plan information database 1926 via communications interface 1904. Planning tool 1900 may use communications interface 1904 to output results of the simulation to client device 1922 and/or to store the results in results database 1928.

Still referring to FIG. 19, processing circuit 1906 is shown to include a processor 1910 and memory 1912. Processor 1910 may be a general purpose or specific purpose processor, an application-specific integrated circuit (ASIC), one or more field-programmable gate arrays (FPGAs), a group of processing components, or other suitable processing components. Processor 1910 may be configured to execute computer code or instructions stored in memory 1912 or received from other computer readable media (e.g., CDROM, network storage, a remote server, etc.).

Memory 1912 may include one or more devices (e.g., memory units, memory devices, storage devices, etc.) for storing data and/or computer code for completing and/or facilitating the various processes described in the present disclosure. Memory 1912 may include random access memory (RAM), read-only memory (ROM), hard drive storage, temporary storage, non-volatile memory, flash memory, optical memory, or any other suitable memory for storing software objects and/or computer instructions. Memory 1912 may include database components, object code components, script components, or any other type of information structure for supporting the various activities and information structures described in the present disclosure. Memory 1912 may be communicably connected to processor 1910 via processing circuit 1906 and may include computer code for executing (e.g., by processor 1910) one or more processes described herein.

Referring to FIG. 19, memory 1912 is shown to include a GUI engine 1916, web services 1914, and configuration tools 1918. In an exemplary embodiment, GUI engine 1916 includes a graphical user interface component configured to provide graphical user interfaces to a user for selecting or defining plan information for the simulation (e.g., planned loads, utility rates, environmental conditions, etc.). Web services 1914 may allow a user to interact with planning tool 1900 via a web portal and/or from a remote system or device (e.g., an enterprise control application).

Configuration tools 1918 can allow a user to define (e.g., via graphical user interfaces, via prompt-driven "wizards," etc.) various parameters of the simulation such as the number and type of subplants, the devices within each subplant, the subplant curves, device-specific efficiency curves, the duration of the simulation, the duration of the prediction window, the duration of each time step, and/or various other types of plan information related to the simulation. Configuration tools 1918 can present user interfaces for building the simulation. The user interfaces may allow users to define simulation parameters graphically. In some embodiments, the user interfaces allow a user to select a pre-stored or pre-constructed simulated plant and/or plan information (e.g., from plan information database 1926) and adapt it or enable it for use in the simulation.

Still referring to FIG. 19, memory 1912 is shown to include demand response optimizer 1930. Demand response optimizer 1931 may use the planned loads and utility rates to determine an optimal resource allocation over a prediction window. With each iteration of the optimization process, demand response optimizer 1931 may shift the prediction window forward and apply the optimal resource allocation for the portion of the simulation period no longer in the prediction window. Demand response optimizer 1931 may use the new plan information at the end of the prediction window to perform the next iteration of the optimization process. Demand response optimizer 1931 may output the applied resource allocation to reporting applications 1930 for presentation to a client device 1922 (e.g., via user interface 1924) or storage in results database 1928.

Still referring to FIG. 19, memory 1912 is shown to include reporting applications 1930. Reporting applications 1930 may receive the optimized resource allocations from demand response optimizer 1931 and, in some embodiments, costs associated with the optimized resource allocations. Reporting applications 1930 may include a web-based reporting application with several graphical user interface (GUI) elements (e.g., widgets, dashboard controls, windows, etc.) for displaying key performance indicators (KPI) or other information to users of a GUI. In addition, the GUI elements may summarize relative energy use and intensity across various plants, subplants, or the like. Other GUI elements or reports may be generated and shown based on available data that allow users to assess the results of the simulation. The user interface or report (or underlying data engine) may be configured to aggregate and categorize resource allocation and the costs associated therewith and provide the results to a user via a GUI. The GUI elements may include charts or histograms that allow the user to visually analyze the results of the simulation.

Figure 20:
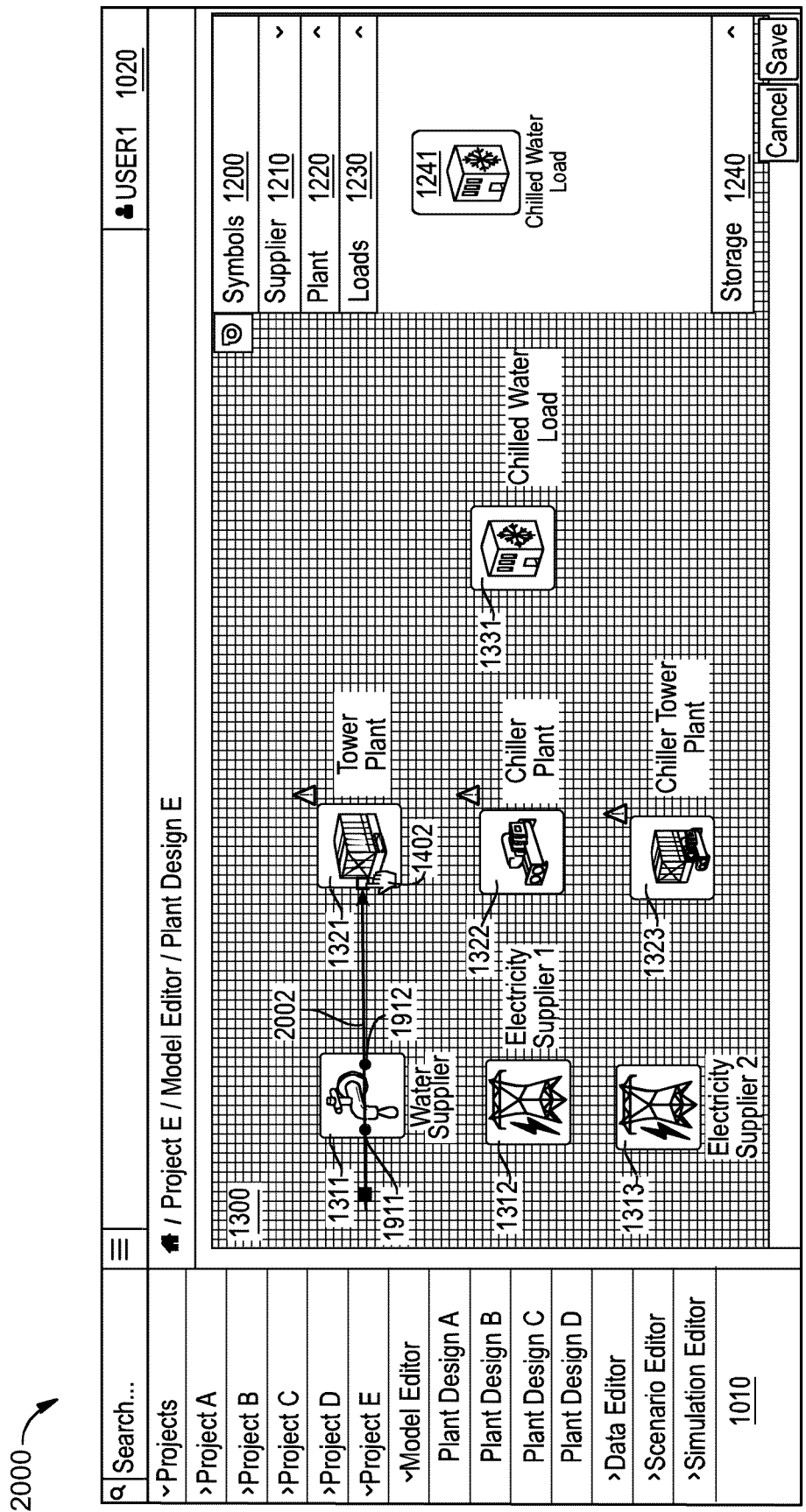
FIG. 20 is a diagram of a user interface, which can be used in the system of FIG. 13, according to some embodiments.

Referring now to FIG. 20, an example of a user interface 2000 is shown, according to some embodiments. User interface 2000 may be generated by planning tool 1900 and displayed to a user via client device 1922. Client device 1922 may be a personal computer, laptop, smartphone, tablet, workstation, or any other type of suitable computing device. In some embodiments, planning tool 1900 is implemented as a cloud-based SaaS (i.e., software as a service) application and can be accessed via an electronic network (e.g., via web services 1914). Planning tool 1900 may be used by personnel such as application engineers, commissioning engineers, and technicians to facilitate the design of a central plant.

In some embodiments, some or all components of asset allocator 1850 can be implemented as an integrated simulation engine service A3S (e.g., application as a service) external to planning tool 1900. In such embodiments, asset allocator 1850 receives simulation data (e.g., equipment models, weather forecasts, planned loads and utility rates, etc.) from planning tool 1900 and applies an algorithm in order to generate simulation results. The simulation results may then be returned and planning tool 1900 can perform further calculations (e.g., derive cost, determine best fit model) to be presented via user interface 1924.

Users of planning tool 1900 can create a central plant model through user interface 1924. Such a central plant model may include sources, subplants, storage, and sinks (e.g., element models 1830), for example. Proper configuration of the central plant model within planning tool 1900 can result in more accurate simulations and therefore a more efficient design of the central plant. Users of planning tool 1900 may struggle to properly configure the central plant model if user interface 1924 does not help guide them in an effective manner. The user interfaces described herein are examples of an improved user interface 1924 that is effective in assisting users to properly configure a central plant customized for their application. Advantageously, user interface 1924 may prevent users from making invalid or improper connections between i sources, subplants, storage, and sinks as users are designing the central plant model. For example, a user may try to connect a hot water output of a subplant to a cold water sink. In this example, planning tool 1900 may recognize this input as invalid by comparing to a set of rules that define valid relationships between sources, subplants, storage, and sinks as described in more detail below. As such, user interface 1924 may prevent the user from making such a connection.

Asset Allocator Unifying Language

Figure 21A:
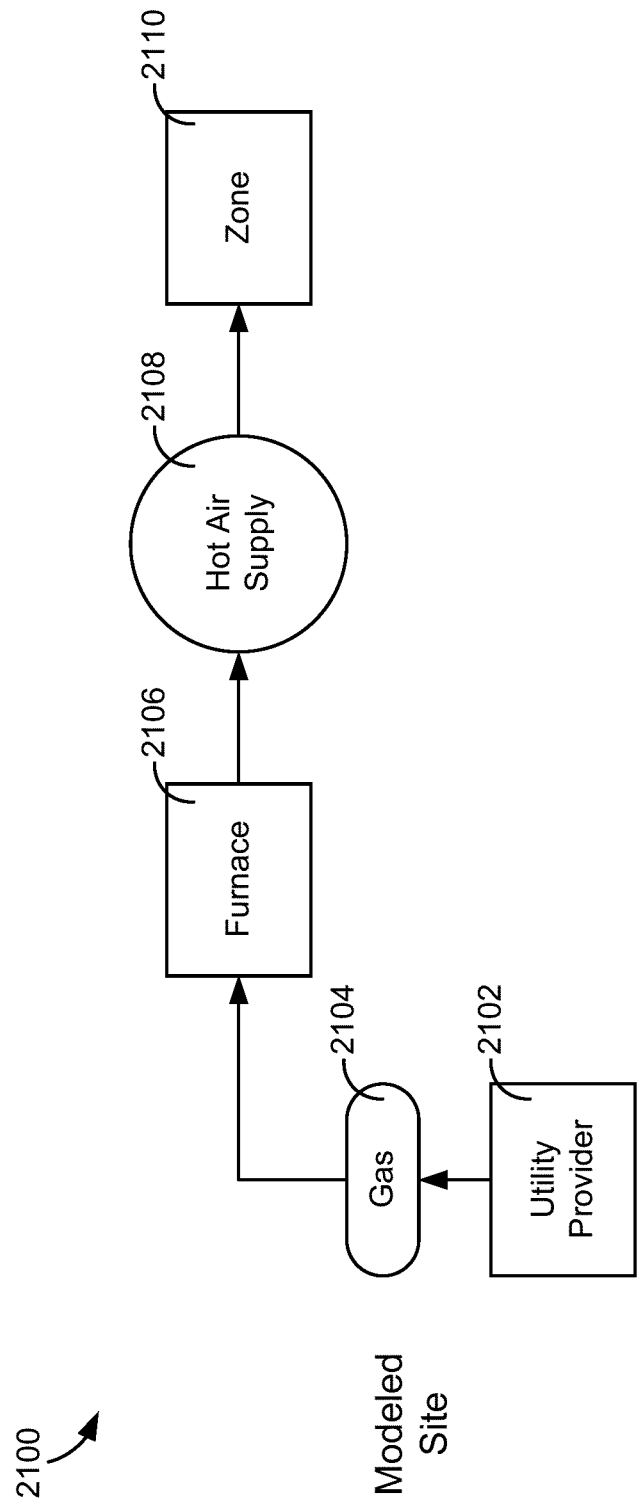
FIG. 21A is a block diagram of a physical site, which can be used in the system of FIG. 13, according to some embodiments.
Figure 21B:
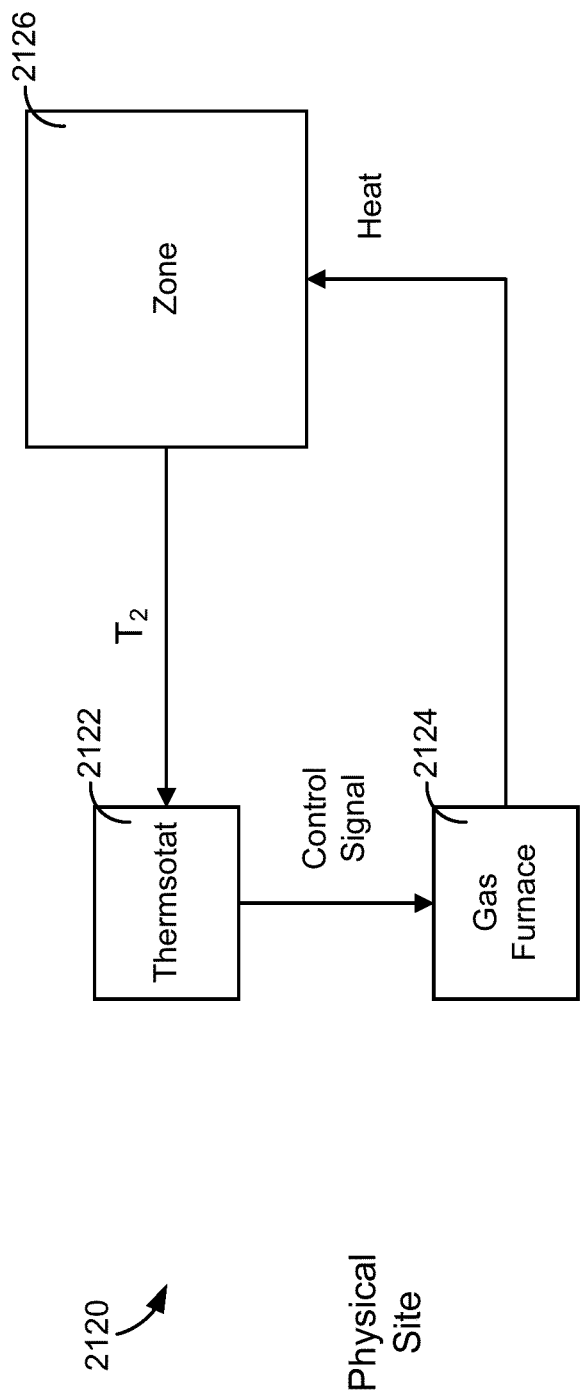
FIG. 21B is a block diagram of a modeled site, which can be used in the system of FIG. 13, according to some embodiments.

Referring now to FIGS. 21A-B, a block diagram of systems 2100 and 2120 for modeling asset allocator 1850 based on a developers interaction with the root components. In some embodiments, the basic model of asset allocator 1850 is based on several root components: converters, consumers, suppliers, and storages. An asset allocator model, such as the model described in U.S. patent application Ser. No. 16/601,377 filed Oct. 14, 2019, the entire disclosure of which is incorporated by reference herein, is configured to determine various outputs of a system model, including power usage and cost function optimization. Advantageously, the asset allocator unifying language disclosed herein (e.g., and represented in FIG. 18) allows the expression of tangible components (e.g., batteries, thermostats, etc.) that are not included in the model to be developed, generated, and included within the asset allocator model. System 2100 is shown to be a modeled site including utility provider 2102, gas 2104, furnace 2106, hot air supply 2108, and zone 2110. System 2120 is shown to be a physical site including thermostat 2122, gas furnace 2124, and zone 2126.

In a general embodiment, systems 2100 of FIG. 21A and 2120 of FIG. 21B may allow an end user (e.g., model developer, etc.) to develop and generate root components (e.g., chillers, batteries, furnaces, etc.) and/or resource components that can be integrated within the asset allocator modeling. As disclosed herein, asset allocator modeling may include the simulation or optimization processes that are implemented to model the HVAC system of building 10. This may be performed by various components of cloud computing system 902. For example, a model developer may require a new type of chiller required at the physical site (e.g., physical site 2120). As such, the model developer can develop a new modeling component that represents the new type of chiller via an application provided on a client device (e.g., application provided on user interface 1924, etc.). Once generated, this new component can interact with the asset allocator model and be implemented within the asset allocator model to interact with a real world system from the modeled site as shown from system 2100. In particular, cloud computing system 902 may receive the information from the user-generated selectable component. Cloud computing system 902 may then map the various information received from the user-generated selectable component (e.g., required operating power, capacity, power output, resource, etc.) and map the information such that it is compatible with the other selectable components. This is described in greater detail above with reference to FIG. 20.

System 2100 is shown to model utility provider 2102 providing gas 2104 to furnace 2106, generating hot air supply 2108 for zone 2110. In some embodiments, the model of furnace 2106 as shown in system 2100 may represent gas furnace 2124 as shown in system 2120. For example, the model developer may wish to include gas furnace 2124 that was not originally included in the modeled site. The model developer may add in the gas furnace 2124 as a "furnace" model as shown as furnace 2106. Once included the model may now know how the site cost, energy transmission, power transfer, etc. are affected based on the inclusion of a new component.

In some embodiments, the components that can be generated for the model include suppliers (e.g., new natural gas supplier, new electricity supplier, etc.), converters (e.g., furnaces, chillers, boilers, etc.), consumers, and storage components. While FIG. 21B shows gas furnace 2124 being modeled as furnace 2106, various exemplary embodiments may show any supplier, converter, consumer, and/or storage component being modeled and incorporated into the modeled site of system 2100.

In some embodiments, a user (e.g., model developer) may generate a new model via a user interface configured to provide the necessary information that allows the newly modeled component to facilitate itself into the asset allocator model. For example, the model developer may develop a new modeled component for a new chiller. The new chiller may follow a pattern of the other chillers modeled in the asset allocator model, but the model developer may include the operational parameters specific to that chiller, such as input/out power, operating voltage, pump capacity, amperage, etc.

Asset Allocator Unifying Language Processes

Figure 22:
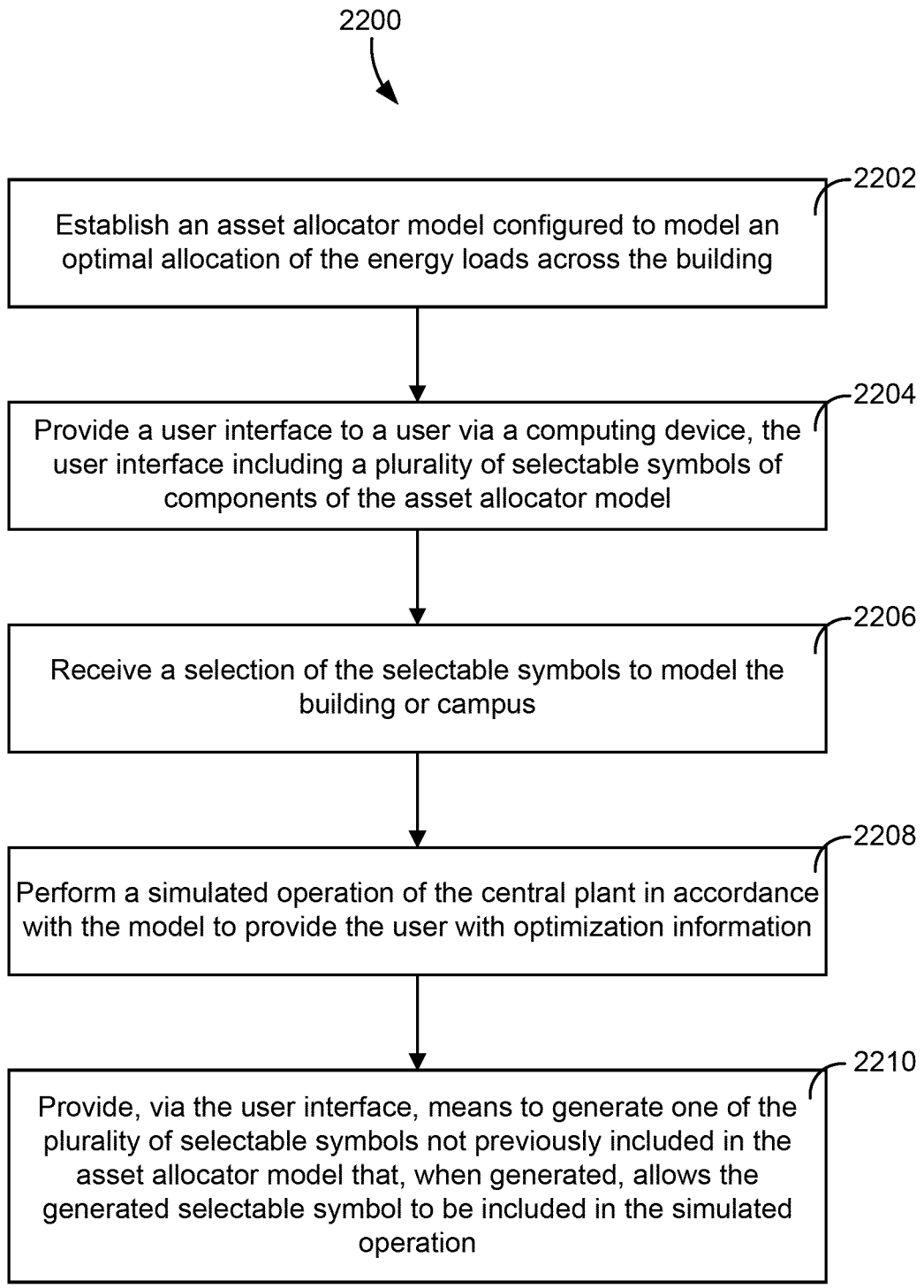
FIG. 22 is a flow diagram of a process for implementing a new component in an asset allocator model, which can be implemented by the platform of FIG. 13, according to some embodiments.

Referring now to FIG. 22, a process 2200 for modeling asset allocator 1850 based on a developers interaction with the root components is shown, according to exemplary embodiments. Process 2200 may be performed by cloud computing system 902, A3S platform 1314, BMS controller 407, or any combination thereof. In other embodiments, process 2200 is performed by various other processing circuitry disclosed herein.

Process 2200 is shown to include establishing an asset allocator model configured to model an optimal allocation of the energy loads across the building (step 2202). In some embodiments, a user (e.g., model developer, etc.) may update a previously established asset allocator model as described above with reference to FIG. 18. Modeling techniques for asset allocator may be similar to those disclosed in U.S. patent application Ser. No. 16/523,913 filed Jul. 26, 2019, the entire disclosure of which is incorporated by reference herein. A user may take a previously established model asset allocation 1850 that determines the various energy loads required for serving building 10.

In some embodiments, the asset allocator model is a simulation of the thermal energy loads required to serve building 10 (e.g., asset allocator 1850) and may be performed by cloud computing system 902. In a general embodiment, FIG. 22 provides a process for adding a new modeling component to a previously established modeling application for an asset allocator model. As such, process 2200 includes first establishing the modeling application.

Process 2200 is shown to include providing a user interface to a user via a computing device, the user interface including a plurality of selectable symbols of components of the asset allocator model (step 2204). In some embodiments, a user interface (e.g., user interface 1924) may be provided to a user for configuring the model of the energy loads required for serving building 10 by selecting and placing blocks. In some embodiments, the blocks may include several types of components of asset allocator 1850, including resource converters, resource suppliers, resource consumers, and resource storages.

Process 2200 is shown to include receiving a selection of the selectable symbols to model the building or campus (step 2206). Once the user placed the selectable components within a modeling region, the user can connect the various components in an appropriate configuration to develop a model. In some embodiments, the application allows appropriate configurations and does not allow incorrect configurations. For example, if the user attempts to connect the output of a chiller to the input of an electricity supplier, the application may provide a notification to the user that the configuration is incorrect. These and various other embodiments are described above in greater detail with reference to FIG. 20.

Process 2200 is shown to include performing a simulated operation of the central plant in accordance with the model to provide the user with optimization information (step 2208) and providing, via the user interface, means to generate one of the plurality of selectable symbols not previously included in the asset allocator model that, when generated, allows the generated selectable symbol to be included in the simulated operation (step 2210). Cloud computing system 902 may perform the simulated operation either before or after incorporating the user-generated selectable component within the modeling application. In some embodiments, the simulated operation will not run if the user generated component is incorrectly generated. For example, if the user attempts to generate a chiller that has a 900 MW capacity with a pump capacity of 1 GPM, the user may receive a notification from the application indicating that the component has been generated incorrectly. In a general embodiment, the selectable components are based on physical equipment located on a site (e.g., within system 2120) that has previously not been included within the application of planning tool 1900. As such, a user, via user interface 1924, may develop a virtual model of the physical equipment such that it may be utilized within cloud computing system 902, asset allocator 1850, low level optimizer 1934, or any combination thereof.

Figure 23A:
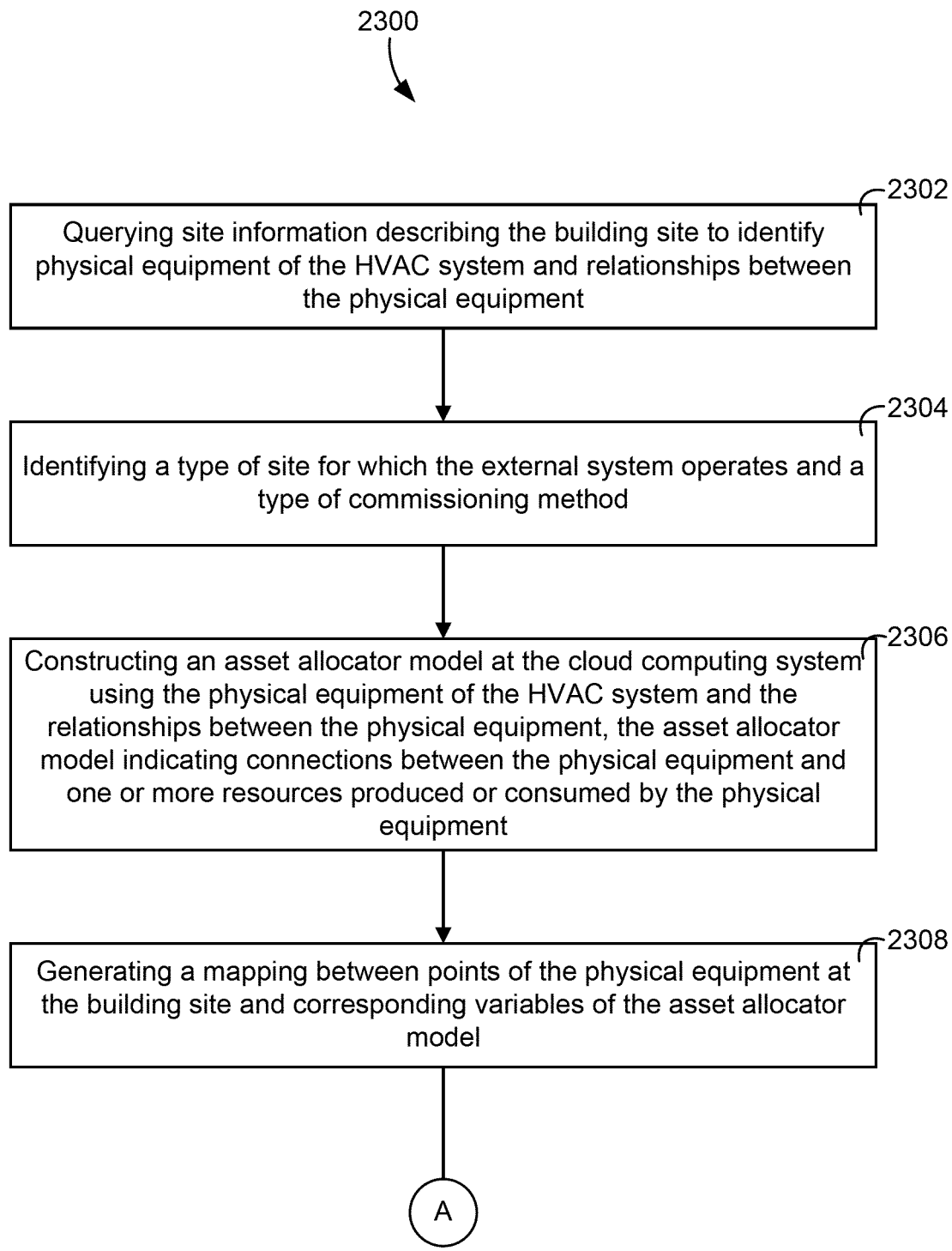
FIG. 23A is a flow diagram of a process for automatically commissioning and operating an HVAC system using a cloud computing system, which can be implemented by the platform of FIG. 13, according to some embodiments.
Figure 23B:
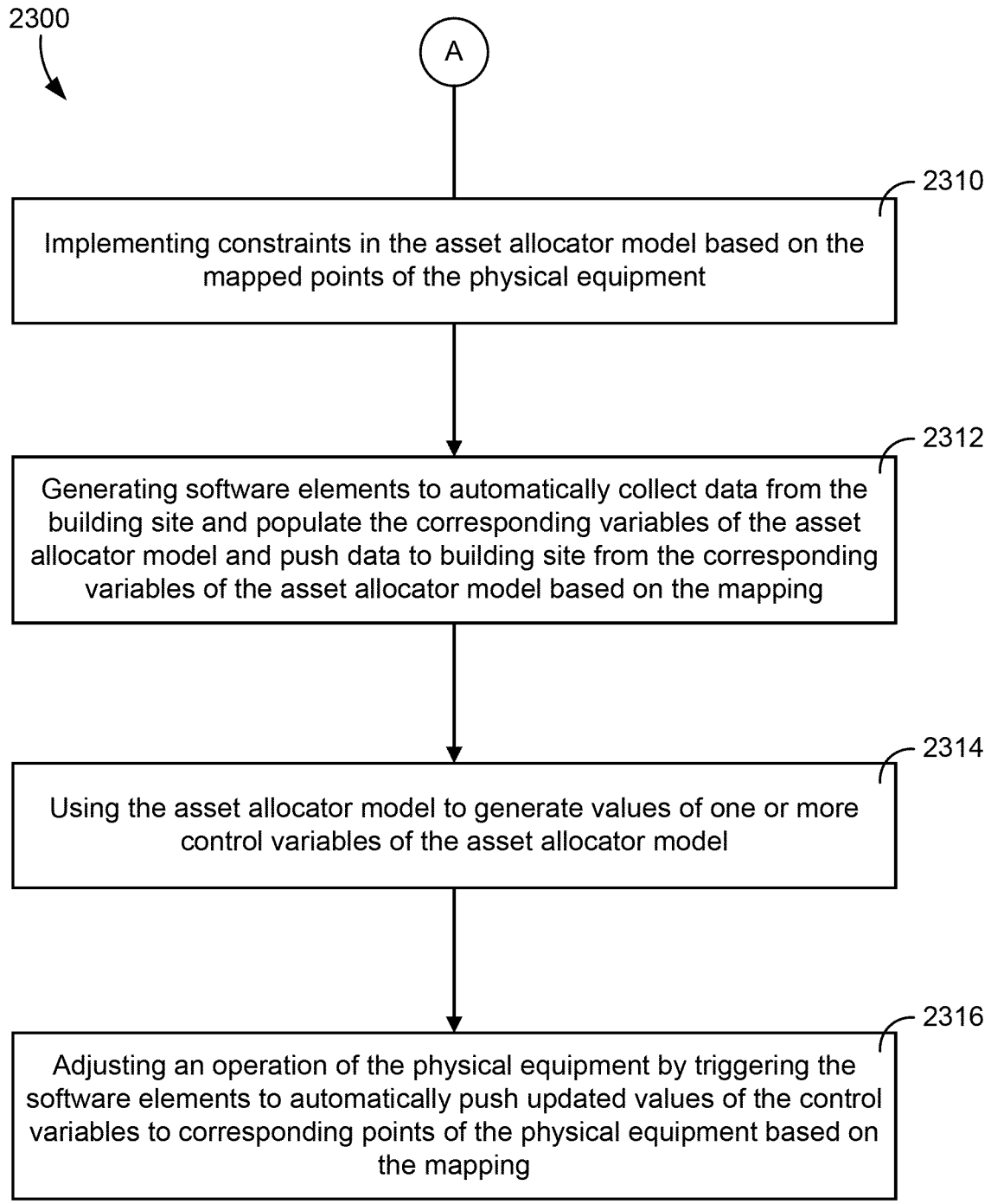
FIG. 23B is a flow diagram of a process for automatically commissioning and operating an HVAC system using a cloud computing system, which can be implemented by the platform of FIG. 13, according to some embodiments.

Referring now to FIGS. 23A-23B, a process 2300 for automatically commissioning and operating an HVAC system using a cloud computing system to serve energy loads of a building site is shown, according to exemplary embodiments. In some embodiments, process 2300 can be performed by cloud computing system 902 as described above.

Process 2300 is shown to include querying site information describing the building site to identify physical equipment of the HVAC system and relationships between the physical equipment (step 2302). In some embodiments, site model 1106 is generated in an RDF file (e.g., RDF file 1050) and provided to automatic commissioner 924. Site model 1106 may be generated by querying one or more databases for device information of various subplants within building 10. For example, automatic commissioner 924 queries the various ODU's and IDU's within VRF system 600 and receives an RDF file that includes information based on the relationship of the devices within VRF system 600 and their respective resource usages. In some embodiments, various relationships between the physical equipment include relationships between two pieces of equipment, between equipment and points, between equipment and spaces, between the equipment and resources produced/consumed, or any other type of relationship described herein.

Process 2300 is shown to include identifying a type of site for which the external system operates and a type of commissioning method (step 2304). In some embodiments, automatic commissioner 924 may determine a type of site based on the information received in the RDF file (e.g., RDF file 1050). For example, RDF file 1050 provides one or more subjects of IDU's and ODU's and other equipment within VRF system 1102. Based on the predicate of the objects within RDF file 1050, automatic commissioner 924 can determine that site model 1106 has collected data and generated a model based on VRF system 1102. In other embodiments, the site model determines a type of site based on the collected information from the physical. For example, site model 1106 receives various information (e.g., physical points, equipment point data, equipment relationship data, etc.) from a physical site such that site model 1106 is able to determine/infer that the type of physical site is a VRF system (i.e., VRF system 1102).

In some embodiments automatic commissioner 924 may determine that an automatic configuration needs to be implemented for VRF system 1102, based on the subject, object, and/or, predicate information received in the RDF file. For example, automatic commissioner 924 determines that site model 1106 is a model of VRF system 1102, based on a received RDF file (i.e., RDF file 1050) from site model 1106. Based on the subject, predicate, and object information, automatic commissioner 924 implements a commissioning method particular to VRF system 1102. In some embodiments, automatic commissioner 924 is configured to perform/engage various commissioning methods that are individually optimized for a particular physical site. For example, upon determining the type of physical site being modeled by site model 1106, a first commissioning method may be used upon determining that the physical site is VRF system 1102, but a second commissioning method may be used upon determining that the physical site is a chilled water system.

In some embodiments, the commissioning methods may differ based on the type of site. For example, upon determining that the physical site modeled by site model 1106 is VRF system 1102, automatic commissioner 924 may map the subjects, predicates, and/or object information from RDF file 1050 to the corresponding variables of asset allocator 1850 to reduce operating costs (e.g., deactivate chillers, lower pump speeds, etc.), as VRF systems are typically more expensive than traditional chilled water systems. In another example, automatic commissioner 924 determines that the physical site modeled by site model 1106 is a chilled water system. Automatic commissioner 924 may then map the subjects, predicates, and/or object information from RDF file 1050 to the corresponding variables of asset allocator 1850 to improve efficiency (e.g., reduce temperature control in vacant building zones, etc.). In some embodiments, processing prior to providing the RDF file to cloud computing system 902 (e.g., site model 1106) determines the type of site and provides that information to cloud computing system 902 prior to automatic configuration.

Process 2300 is shown to include constructing an asset allocator model at cloud computing system 902 using the physical equipment of the HVAC system and the relationships between the physical equipment, the asset allocator model indicating connections between the physical equipment and one or more resources produced or consumed by the physical equipment (step 2306). In some embodiments, automatic commissioner 924 or another component within cloud computing system 902 generates a model of VRF system 1102 based on the received RDF files (e.g., RDF file 1050) of VRF system 1102. The model may be generated such that it can be implemented by asset allocator 1850.

Process 2300 is shown to include generating a mapping between points of the physical equipment at the building site and corresponding variables of the asset allocator model (step 2308). In some embodiments, automatic commissioner 924 can generate a mapping relationship between the points (e.g., data objects, etc.) of the physical equipment (e.g., IDU 1404, ODU 1406, etc.) at a building site and the variables of the asset allocator model. This can allow asset allocator 1850 to implement control schemas based on the received equipment information and their respective resource usage. Process 2300 continues from FIG. 23A to FIG. 23B (via point A).

In some embodiments, asset allocator 1850 can be pre-loaded, such that the data relating to VRF system 1102 is associated with cloud computing system 902 at a period of time (e.g., 1 hour, 1 day, 1 week, etc.) prior to the time of commissioning. In some embodiments, the mapping generated in step 2308 is similarly performed prior to the period of commissioning. In various embodiments, the mapping between the points of the physical equipment at the building site and corresponding variables of the asset allocator model are known relationships that are known a priori prior to commissioning such that the mapping is automatically implemented at the time of commissioning.

Process 2300 is shown to include implementing constraints in the asset allocator model based on the mapped points of the physical equipment (step 2310). In some embodiments, various constraints (e.g., operation times, power usage, etc.) may be implemented based on the mapped points of the physical equipment. Process 2300 is shown to include generating software elements to automatically collect data from the building site and populate the corresponding variables of the asset allocator model and push data to building site from the corresponding variables of the asset allocator model based on the mapping (step 2312).

Process 2300 is shown to include using the asset allocator model to generate values of one or more control variables of the asset allocator model (step 2314). In some embodiments, the control variables from the asset allocator model are populated with values based on the constraints received. Process 2300 is shown to include adjusting an operation of the physical equipment by triggering the software elements to automatically push updated values of the control variables to corresponding points of the physical equipment based on the mapping (step 2316).

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

As used herein, the term "circuit" may include hardware structured to execute the functions described herein. In some embodiments, each respective "circuit" may include machine-readable media for configuring the hardware to execute the functions described herein. The circuit may be embodied as one or more circuitry components including, but not limited to, processing circuitry, network interfaces, peripheral devices, input devices, output devices, sensors, etc. In some embodiments, a circuit may take the form of one or more analog circuits, electronic circuits (e.g., integrated circuits (IC), discrete circuits, system on a chip (SOCs) circuits, etc.), telecommunication circuits, hybrid circuits, and any other type of "circuit." In this regard, the "circuit" may include any type of component for accomplishing or facilitating achievement of the operations described herein. For example, a circuit as described herein may include one or more transistors, logic gates (e.g., NAND, AND, NOR, OR, XOR, NOT, XNOR, etc.), resistors, multiplexers, registers, capacitors, inductors, diodes, wiring, and so on).

The "circuit" may also include one or more processors communicably coupled to one or more memory or memory devices. In this regard, the one or more processors may execute instructions stored in the memory or may execute instructions otherwise accessible to the one or more processors. In some embodiments, the one or more processors may be embodied in various ways. The one or more processors may be constructed in a manner sufficient to perform at least the operations described herein. In some embodiments, the one or more processors may be shared by multiple circuits (e.g., circuit A and circuit B may comprise or otherwise share the same processor which, in some example embodiments, may execute instructions stored, or otherwise accessed, via different areas of memory). Alternatively or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. Each processor may be implemented as one or more general-purpose processors, application specific integrated circuits (ASICs), field programmable gate arrays (FPGAs), digital signal processors (DSPs), or other suitable electronic data processing components structured to execute instructions provided by memory. The one or more processors may take the form of a single core processor, multi-core processor (e.g., a dual core processor, triple core processor, quad core processor, etc.), microprocessor, etc. In some embodiments, the one or more processors may be external to the apparatus, for example the one or more processors may be a remote processor (e.g., a cloud based processor). Alternatively or additionally, the one or more processors may be internal and/or local to the apparatus. In this regard, a given circuit or components thereof may be disposed locally (e.g., as part of a local server, a local computing system, etc.) or remotely (e.g., as part of a remote server such as a cloud based server). To that end, a "circuit" as described herein may include components that are distributed across one or more locations.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

What is claimed is:

1. A method for automatically commissioning and operating physical equipment to serve energy loads of a site, the method comprising:
   querying site information describing the site to identify the physical equipment and relationships between the physical equipment, wherein the physical equipment are installed at the site;
   constructing a model using the physical equipment and the relationships between the physical equipment, the model indicating connections between the physical equipment and one or more resources produced or consumed by the physical equipment to serve the energy loads of the site;
   generating a mapping between points of the physical equipment and corresponding variables of the model;
   using the model to generate values of one or more control variables of the model; and
   operating the physical equipment by providing the values of the control variables to corresponding points of the physical equipment based on the mapping.

2. The method of claim 1, wherein querying the site information comprises:
   identifying a type of the site based the site information; and
   receiving instructions to commission the physical equipment;
   wherein the constructing, generating, using, and operating steps are specific to the type of the site.

3. The method of claim 1, wherein querying the site information comprises querying resource description framework (RDF) specifications of the physical equipment, the RDF specifications defining the relationships between the physical equipment using a subject, a predicate, and an object.

4. The method of claim 1, wherein querying the site information comprises:
   identifying two or more devices of the physical equipment that serve a same zone of the site, wherein the physical equipment comprise at least one of heating, ventilation, or air conditioning (HVAC) equipment or refrigeration equipment; and
   in response to identifying the two or more devices of the physical equipment that serve the same zone of the site, generating a connection between the two or more devices of the physical equipment in the model.

5. The method of claim 1, wherein constructing the model comprises generating one or more software elements to automatically collect data from the site, populate the corresponding variables of the model, and push data to the site from the corresponding variables of the model based on the generated mapping.

6. The method of claim 1, wherein constructing the model comprises implementing constraints in the model, the constraints comprising at least one of a capacity constraint defining a capacity limit of the physical equipment or a resource balance constraint based on the connections between the physical equipment.

7. The method of claim 1, wherein generating the mapping between the points of the physical equipment and the corresponding variables of the model comprises generating the mapping prior to using the model to generate the values of the one or more control variables of the model such that the mapping is predetermined.

8. A system for automatically commissioning and operating physical equipment to serve energy loads of a site, the system comprising one or more processing circuits configured to:
- query site information describing the site to identify the physical equipment and relationships between the physical equipment, wherein the physical equipment are installed at the site;
- construct a model using the physical equipment and the relationships between the physical equipment, the model indicating connections between the physical equipment and one or more resources produced or consumed by the physical equipment to serve the energy loads of the site;
- generate a mapping between points of the physical equipment and corresponding variables of the model;
- use the model to generate values of one or more control variables of the model; and
- operate the physical equipment by providing the values of the control variables to corresponding points of the physical equipment based on the mapping.

9. The system of claim 8, wherein querying the site information comprises:
- identifying a type of the site based the site information; and
- receiving instructions to commission the physical equipment;
- wherein the construct, generate, use, and operate steps are specific to the type of the site.

10. The system of claim 8, wherein querying the site information comprises querying resource description framework (RDF) specifications of the physical equipment, the RDF specifications defining the relationships between the physical equipment using a subject, a predicate, and an object.

11. The system of claim 8, wherein querying the site information comprises:
- identifying two or more devices of the physical equipment that serve a same zone of the site, wherein the physical equipment comprise at least one of heating, ventilation, or air conditioning (HVAC) equipment or refrigeration equipment; and
- in response to identifying the two or more devices of the physical equipment that serve the same zone of the site, generating a connection between the two or more devices of the physical equipment in the model.

12. The system of claim 8, wherein constructing the model comprises generating one or more software elements to automatically collect data from the site, populate the corresponding variables of the model, and push data to the site from the corresponding variables of the model based on the generated mapping.

13. The system of claim 8, wherein constructing the model comprises implementing constraints in the model, the constraints comprising at least one of a capacity constraint defining a capacity limit of the physical equipment or a resource balance constraint based on the connections between the physical equipment.

* * * * *